United States Patent
Ohga et al.

(10) Patent No.: US 11,892,246 B2
(45) Date of Patent: Feb. 6, 2024

(54) COOLING DEVICE

(71) Applicant: FUJITSU LIMITED, Kawasaki (JP)

(72) Inventors: Kento Ohga, Yokohama (JP); Hideo Kubo, Kawasaki (JP); Kenji Sasabe, Kawasaki (JP); Masahide Kodama, Kawasaki (JP); Atsushi Endo, Kawasaki (JP); Keita Hirai, Kawasaki (JP); Nobumitsu Aoki, Kawasaki (JP); Takashi Urai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 58 days.

(21) Appl. No.: 17/567,926

(22) Filed: Jan. 4, 2022

(65) Prior Publication Data

US 2022/0299273 A1 Sep. 22, 2022

(30) Foreign Application Priority Data

Mar. 16, 2021 (JP) .................. 2021-042929

(51) Int. Cl.
  *F28F 1/02* (2006.01)
  *H01L 23/427* (2006.01)
  *H01L 23/40* (2006.01)

(52) U.S. Cl.
  CPC ............ *F28F 1/025* (2013.01); *H01L 23/427* (2013.01); *F28F 2250/00* (2013.01); *H01L 23/4006* (2013.01); *H01L 2023/4087* (2013.01)

(58) Field of Classification Search
  CPC ..... F28F 1/025; F28F 2250/00; H01L 23/427; H01L 23/4006; H01L 2023/4087; H01L 23/3672; F28D 15/0233; F28D 15/0266; F28D 15/04

USPC ...................................... 165/104.21
See application file for complete search history.

(56) References Cited

U.S. PATENT DOCUMENTS

| | | | | |
|---|---|---|---|---|
| 3,971,435 A | * | 7/1976 | Peck ...................... | F28D 15/046 361/689 |
| 6,814,134 B1 | * | 11/2004 | Pravda ................. | F28D 15/0208 165/104.21 |
| 10,082,340 B2 | * | 9/2018 | Hsieh ..................... | F28D 15/046 |
| 10,598,442 B2 | * | 3/2020 | Liu ...................... | F28D 15/0233 |
| 2006/0016580 A1 | * | 1/2006 | Lee ........................ | F28D 15/046 165/104.26 |
| 2006/0169439 A1 | * | 8/2006 | Hong ..................... | F28D 15/046 165/104.26 |

(Continued)

FOREIGN PATENT DOCUMENTS

| | | |
|---|---|---|
| JP | 2004-060911 A | 2/2004 |
| JP | 2008-522129 A | 6/2008 |

(Continued)

*Primary Examiner* — Len Tran
*Assistant Examiner* — Gustavo A Hincapie Serna
(74) *Attorney, Agent, or Firm* — Fujitsu Intellectual Property Center

(57) ABSTRACT

A cooling device includes: a container in which a refrigerant is sealed; an evaporating part that evaporates the refrigerant in a liquid phase by heat reception inside the container; a condensing part that condenses the refrigerant in a gas phase by heat dissipation inside the container; and a plate-shaped or block-shaped flow path member in which a plurality of flow paths configured to transport the refrigerant in a liquid phase from the condensing part to the evaporating part by surface tension inside the container is formed in parallel.

5 Claims, 57 Drawing Sheets

(56) References Cited

U.S. PATENT DOCUMENTS

| | | | |
|---|---|---|---|
| 2009/0020268 A1* | 1/2009 | Chang | F28D 15/046 165/104.33 |
| 2009/0020269 A1* | 1/2009 | Chang | F28D 15/046 165/104.26 |
| 2009/0032226 A1* | 2/2009 | Huang | F28D 15/046 165/104.26 |
| 2009/0159243 A1* | 6/2009 | Zhao | F28D 15/046 165/104.26 |
| 2010/0263833 A1* | 10/2010 | Lee | F28D 15/046 165/104.26 |
| 2011/0232877 A1* | 9/2011 | Meyer, IV | F28D 15/046 165/104.33 |
| 2012/0227934 A1* | 9/2012 | Huang | F28D 15/046 29/890.032 |
| 2013/0025829 A1* | 1/2013 | Huang | F28D 15/0233 165/104.26 |
| 2013/0213611 A1* | 8/2013 | Wu | F28D 15/0233 165/104.26 |
| 2016/0091259 A1* | 3/2016 | Lin | F28D 15/046 165/104.26 |
| 2016/0161193 A1* | 6/2016 | Lewis | B23P 15/26 216/13 |
| 2019/0033006 A1* | 1/2019 | Vanderwees | F28D 15/0283 |
| 2019/0323781 A1* | 10/2019 | Huang | F28D 15/0233 |
| 2019/0339020 A1* | 11/2019 | Tseng | F28D 15/043 |
| 2020/0080791 A1* | 3/2020 | Yokoyama | F28D 15/04 |
| 2020/0400382 A1* | 12/2020 | Cheng | F28D 15/0258 |
| 2021/0018272 A1* | 1/2021 | Inagaki | F28D 15/046 |
| 2021/0180877 A1* | 6/2021 | Wong | H05K 7/20336 |
| 2022/0015265 A1* | 1/2022 | Chen | F28D 15/0233 |
| 2022/0071054 A1* | 3/2022 | Lee | F28D 15/0233 |
| 2022/0120509 A1* | 4/2022 | Takeda | F28D 15/0233 |
| 2022/0141994 A1* | 5/2022 | Lin | H05K 7/20418 361/697 |

FOREIGN PATENT DOCUMENTS

| | | |
|---|---|---|
| JP | 2018-179388 A | 11/2018 |
| WO | 2006/058494 A1 | 6/2006 |
| WO | WO2006058494 A1 * | 8/2006 |

* cited by examiner

COOLING DEVICE

CROSS-REFERENCE TO RELATED APPLICATION

This application is based upon and claims the benefit of priority of the prior Japanese Patent Application No. 2021-42929, filed on Mar. 16, 2021, the entire contents of which are incorporated herein by reference.

FIELD

The technology disclosed in the present application relates to a cooling device.

BACKGROUND

As a heat pipe suitable for cooling semiconductor elements and the like, there is a structure provided with a heat absorbing part that absorbs heat from a heat generating component outside, a heat dissipating part that cools an internal space by heat dissipation, and a container sealed so that the internal space is hollow. A hydraulic fluid that repeats evaporation and condensation and vapor generated by the evaporation of the hydraulic fluid are sealed in internal space of the container.

Japanese Laid-open Patent Publication No. 2004-60911, Japanese National Publication of International Patent Application No. 2008-522129, and Japanese Laid-open Patent Publication No. 2018-179388 are disclosed as related art.

SUMMARY

According to an aspect of the embodiments, a cooling device includes: a container in which a refrigerant is sealed; an evaporating part that evaporates the refrigerant in a liquid phase by heat reception inside the container; a condensing part that condenses the refrigerant in a gas phase by heat dissipation inside the container; and a plate-shaped or block-shaped flow path member in which a plurality of flow paths configured to transport the refrigerant in a liquid phase from the condensing part to the evaporating part by surface tension inside the container is formed in parallel.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Furthermore, there is also a boiling-promoting multiwick structure that evaporates a condensable fluid in at least one chamber, collects the evaporated condensable fluid as a condensate on a surface in at least one chamber, and transfers heat from a heat source.

Moreover, there is a vapor chamber in which a hydraulic fluid is sealed in a closed space between a first metal sheet and a second metal sheet, and a first liquid flow path recess is provided in the first metal sheet through which the liquidus hydraulic fluid passes.

In a cooling device in which a refrigerant is sealed in a container and heat is transported by repeating evaporation and condensation of the refrigerant to cool an object to be cooled, for example, a tubular transport pipe is arranged and the refrigerant can be transported to an evaporating part by surface tension acting on the refrigerant in a flow path inside the transport pipe. In particular, by arranging a plurality of transport pipes, an effect of a capillary phenomenon can be maximized and liquid feeding efficiency can be improved.

However, since the transport pipe is thick, that is, the thickness between an outer peripheral surface and an inner peripheral surface is high, it is difficult to arrange the flow paths inside the transport pipes at high density in a structure in which a plurality of transport pipes is arranged side by side, and there is a limit to increasing cooling capacity.

In one aspect of the disclosed technology of the present application, an objective is to improve cooling capacity by enabling high-density arrangement of flow paths in which a refrigerant in a liquid phase moves from a condensing part to an evaporating part in a container in a cooling device that performs heat transfer by phase change between a gas phase and a liquid phase of the refrigerant in the container.

A cooling device 42 of a first embodiment will be described in detail with reference to the drawings.

Figure 1:
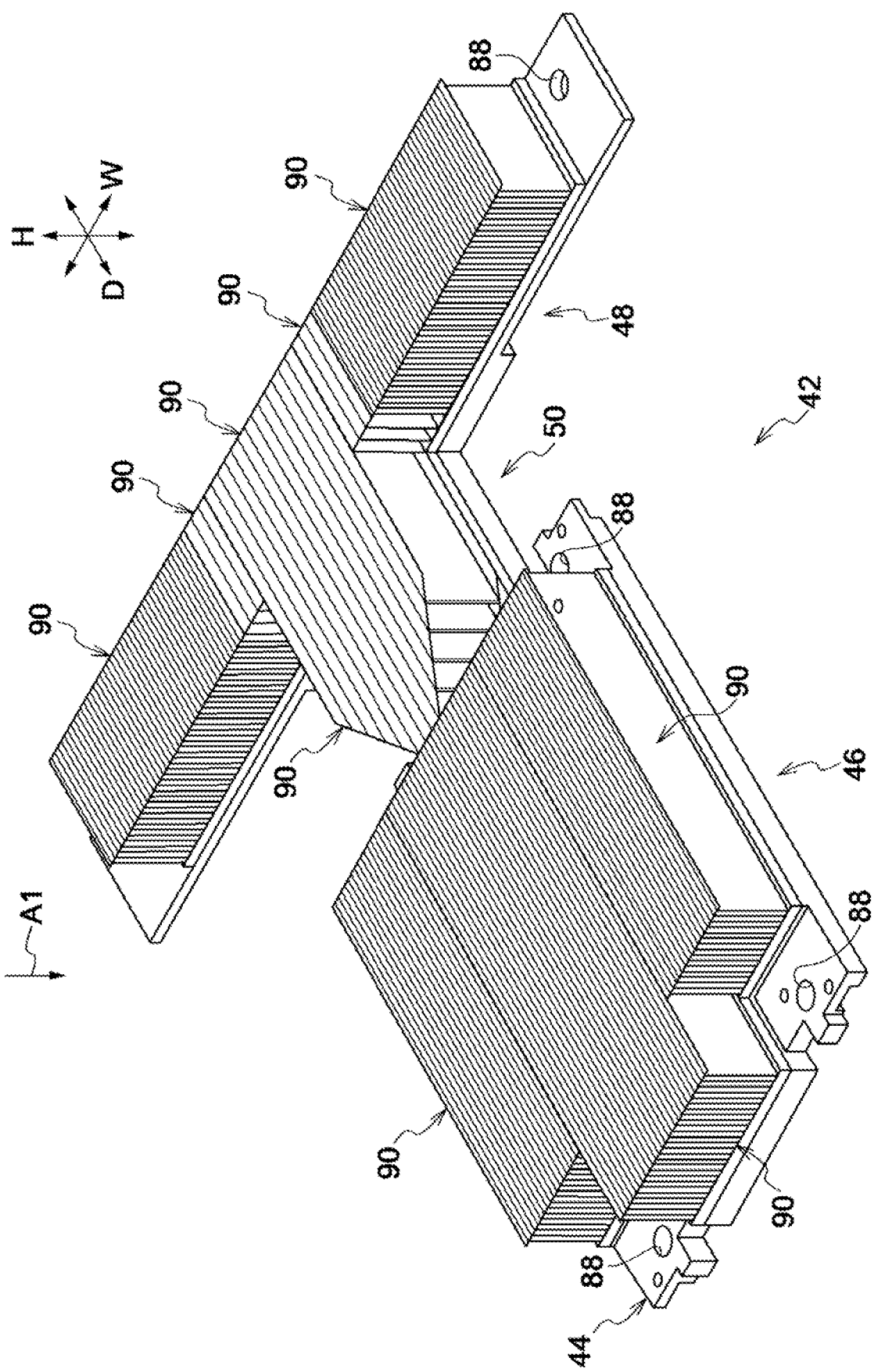
FIG. 1 is a perspective view illustrating a cooling device according to a first embodiment.
Figure 2:
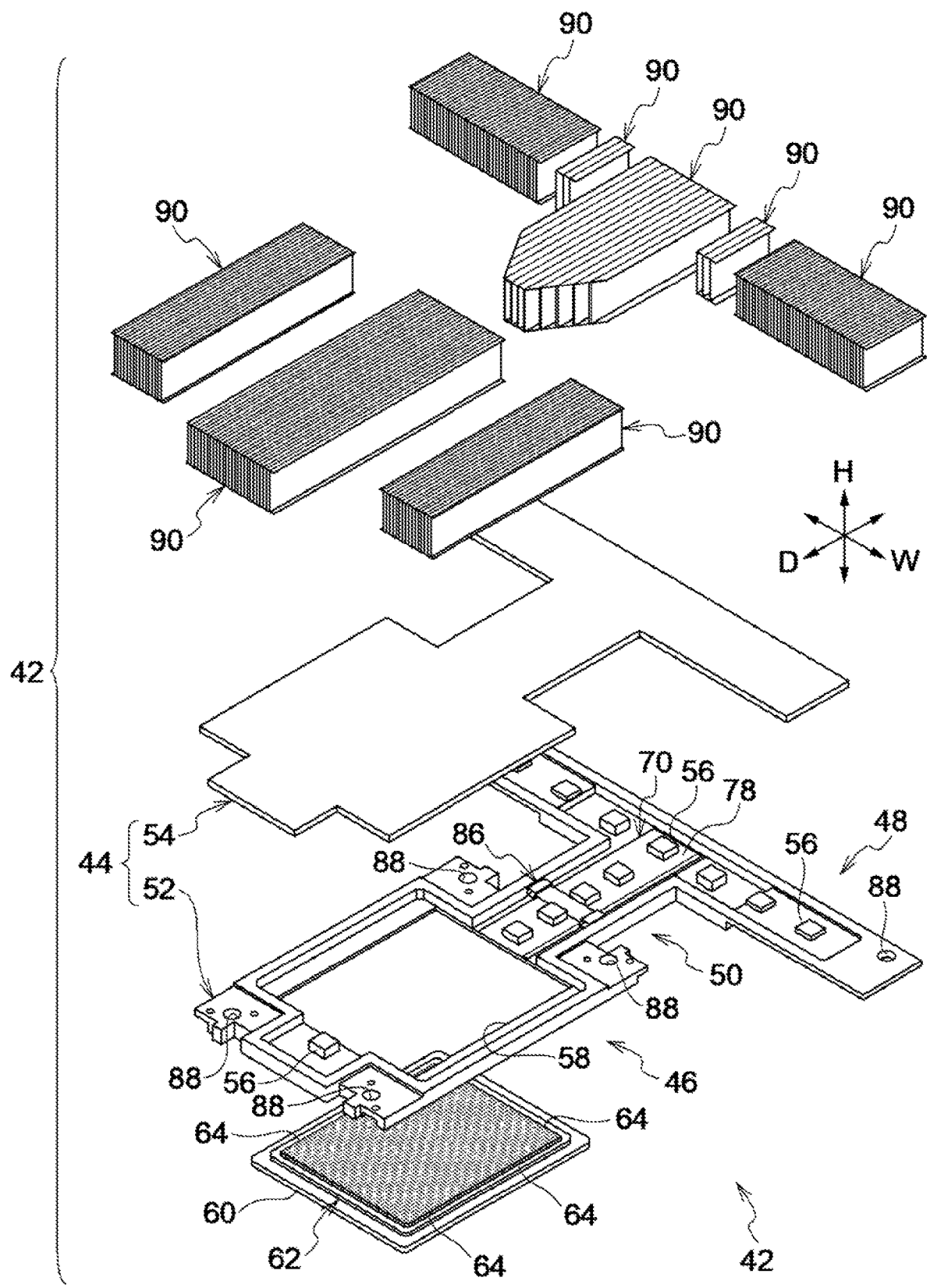
FIG. 2 is an exploded perspective view illustrating the cooling device of the first embodiment.
Figure 3:
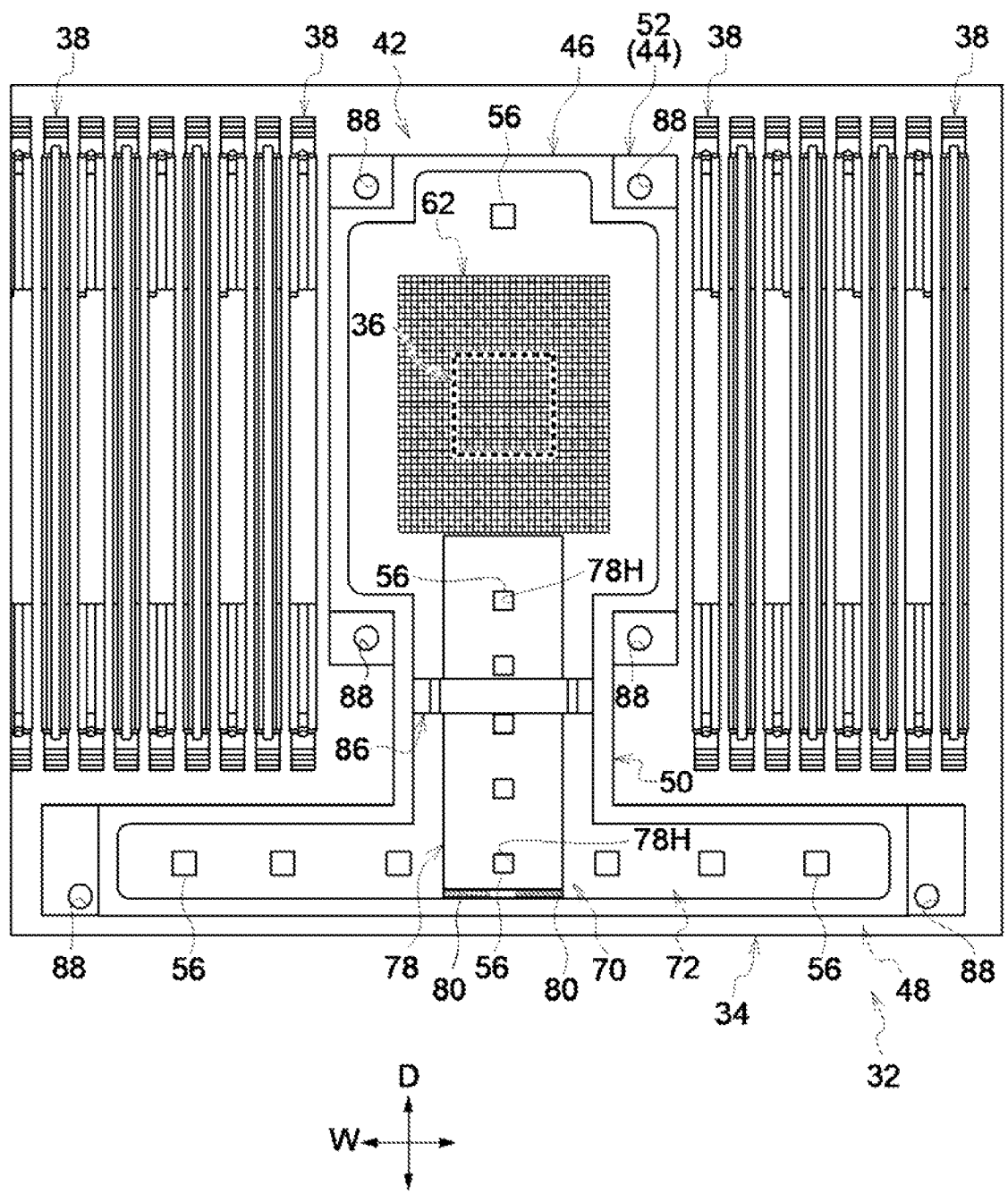
FIG. 3 is a partial plan view illustrating an electronic device provided with the cooling device of the first embodiment together with an internal structure of the cooling device.

FIGS. 1 and 2 illustrate the cooling device 42 of the first embodiment. Furthermore, FIG. 3 illustrates an electronic device 32 provided with the cooling device 42. Examples of the electronic device 32 include, but are not limited to, information communication devices such as servers.

The electronic device 32 has a substrate 34 having rigidity and insulation. A plurality of elements 36 and 38 is mounted on the substrate 34. The types of the elements 36 and 38 are not particularly limited, but in the example illustrated in FIG. 3, the element 36 is a processor chip and the element 38 is a memory module. In this case, the element 36 is an example of a heat generating element. Then, to cool the element 36, the cooling device 42 is arranged in contact with the element 36.

As illustrated in FIGS. 1 to 5, the cooling device 42 includes a container 44. A refrigerant RF (see FIG. 5) is sealed in the container 44. Then, the cooling device 42 has a heat receiving part 46, a heat dissipating part 48, and a connecting part 50.

The type of the refrigerant RF is not limited as long as the refrigerant can transfer heat by being circulated while performing a phase transition between a liquid phase and a gas phase in the container 44, and for example, water can be used. Although oil and alcohol can be used other than water, water is easily available and easy to handle, and thus water is used in the present embodiment.

As illustrated in FIG. 3, the heat receiving part 46 is a part that is arranged in contact with the element 36 and receives heat of the element 36. The heat receiving part 46 is provided with an evaporating part 62 that vaporizes the liquid-phase refrigerant RF by this heat.

The heat dissipating part 48 is a part that is arranged apart from the heat receiving part 46 and releases the heat of the refrigerant RF sealed in the container 44 to the outside. The heat dissipating part 48 is provided with a condensing part 72 that liquefies the gas-phase refrigerant RF by heat dissipation.

The connecting part 50 is a part connecting the heat receiving part 46 and the heat dissipating part 48. Then, the connecting part 50 is also a moving region 74 in which the refrigerant RF moves between the evaporating part 62 and the condensing part 72. Note that a part of the heat of the refrigerant RF in the gas phase state is also discharged to the outside at the connecting part 50, and the refrigerant RF is liquefied.

In the drawings, a width direction, a depth direction, and a height direction of the container 44 are respectively represented by arrows W, D, and H. In the present embodiment, the heat dissipating part 48 has a shape wider in the width direction and shorter in the depth direction than the heat receiving part 46. The connecting part 50 is narrower in the width direction than the heat receiving part 46, and has a depth for connecting the heat receiving part 46 and the heat dissipating part 48.

As illustrated in FIG. 2, the container 44 has a structure in which two plate materials: a bottom plate 52 and a top plate 54 are fixed in a state of being overlapped in the thickness direction (height direction).

A plurality of support columns 56 is erected from the bottom plate 52. A tip end (upper end) of the support column 56 is in contact with the top plate 54, and the top plate 54 is supported by the support column 56. The inside of the container 44 is maintained in a low pressure state, but even in the low pressure state, the support column 56 maintains an interval between the top plate 54 and the bottom plate 52 and secures an internal volume of the container 44.

Figure 4:
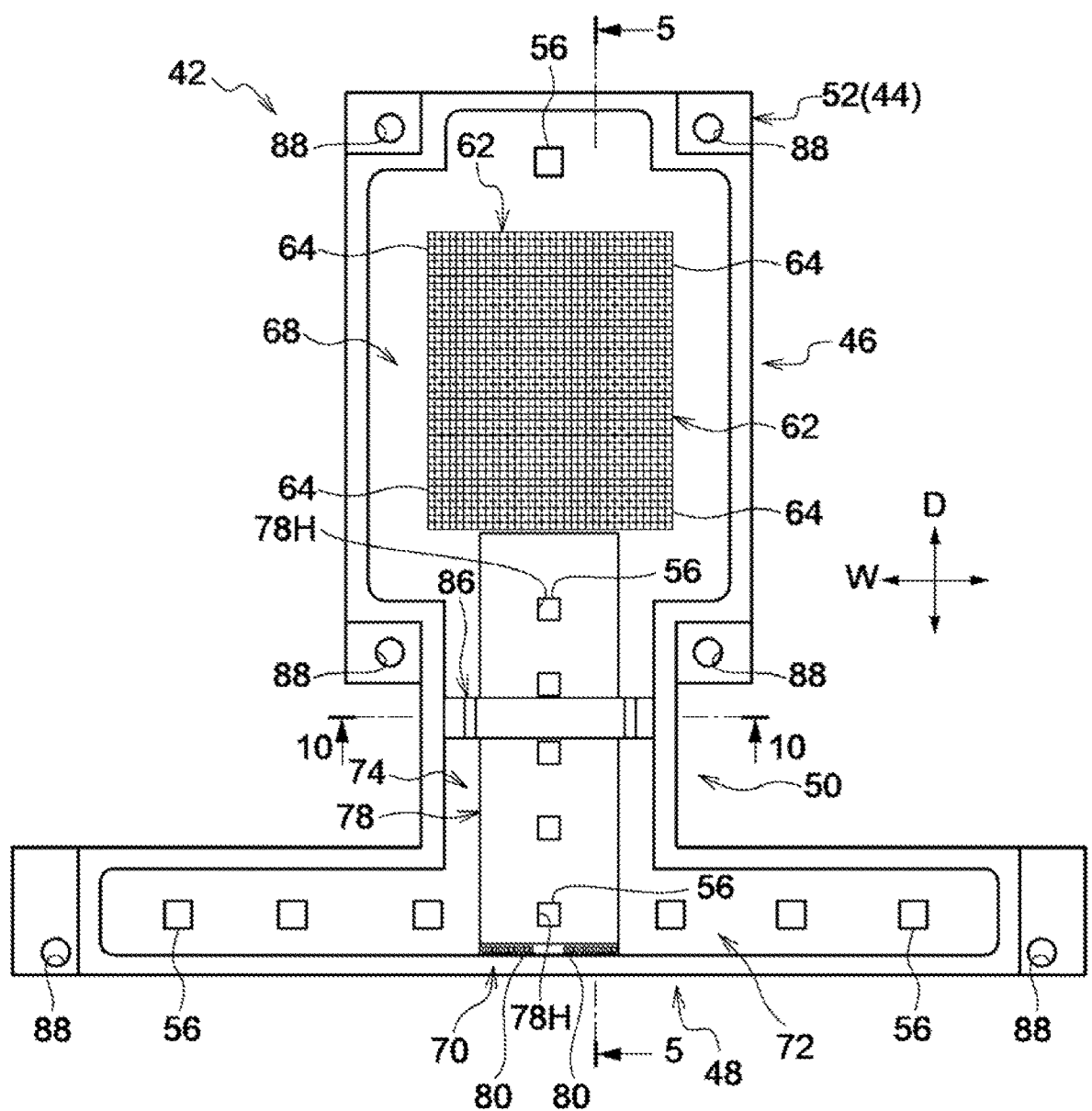
FIG. 4 is a plan view illustrating the internal structure of the cooling device of the first embodiment.

In the present embodiment, as illustrated in FIGS. 2 and 4, the plurality of support columns 56 is arranged in the heat dissipating part 48 at intervals in the width direction of the container 44 and further, is arranged in the connecting part 50 at intervals in the depth direction of the container 44. In addition, as in the heat receiving part 46, one support column 56 is provided on an opposite side of the connecting part 50 with the evaporating part 62 in between.

As illustrated in FIG. 2, in the bottom plate 52, an opening 58 is formed in a part of the heat receiving part 46. By fitting a heat receiving plate 60 into the opening 58, a sealed structure in the container 44 is realized by the bottom plate 52, the top plate 54, and the heat receiving plate 60.

A plurality of column members 64 is erected on the heat receiving plate 60 toward the top plate 54. As illustrated in detail in FIGS. 5 to 7, the plurality of column members 64 is arranged at regular intervals in the width direction and the depth direction, and a grid-like groove part 66 is formed between the column members 64. A groove width W1 of the groove part 66 is narrower than an inner dimension N1 of a flow path 80 of a flow path member 70 to be described below.

Figure 8:
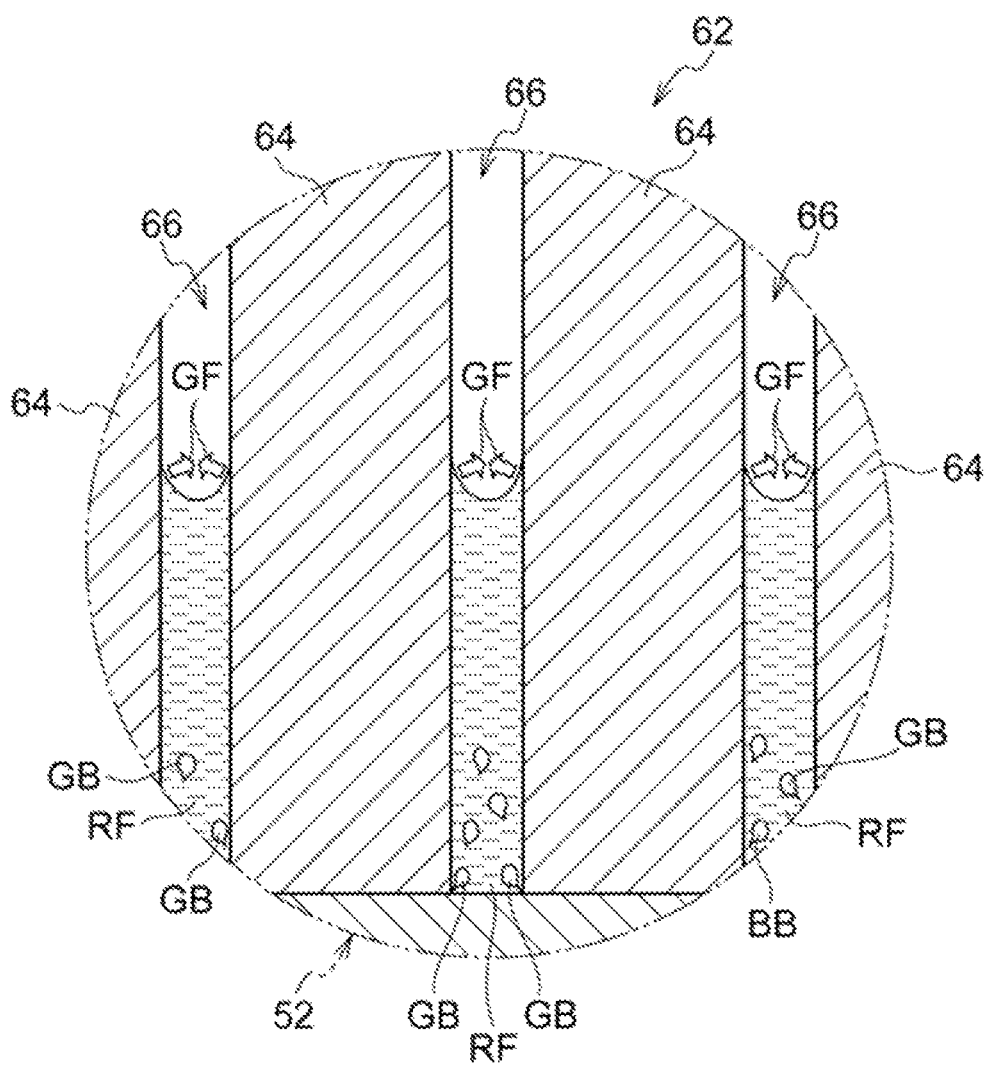
FIG. 8 is a cross-sectional view illustrating a state in which a refrigerant evaporates in the cooling device of the first embodiment.

As illustrated in FIG. 8, in the groove part 66, vaporization of the liquid-phase refrigerant RF is promoted by the heat from the heat receiving part 46 (see FIGS. 3 and 4). This "vaporization" includes "evaporation" in which the refrigerant RF vaporizes from the surface as illustrated by arrow GF, and "boiling" in which the refrigerant RF vaporizes from the inside as illustrated by a bubble GB. Hereinafter, these vaporizations are collectively referred to as "evaporation". The part provided with the column member 64 is a part where the liquid-phase refrigerant RF evaporates in this way, and is the evaporating part 62.

A tip end of the column member 64 is in contact with the top plate 54. With the contact as well, the interval between the top plate 54 and the bottom plate 52 is maintained under the low pressure state inside the container 44, and the internal volume of the container 44 is secured.

As illustrated in FIG. 4, a diffusion region 68 is formed around the column member 64 between the top plate 54 and the bottom plate 52. The gas-phase refrigerant RF that has evaporated in the evaporating part 62 diffuses into the diffusion region 68.

Moreover, the moving region 74 is formed between the heat receiving part 46 and the heat dissipating part 48, between the top plate 54 and the bottom plate 52. The gas-phase refrigerant RF having evaporated in the evaporating part 62 moves to the heat dissipating part 48 through the moving region 74. During this movement, the heat of the refrigerant RF is discharged to the outside of the container 44, so that the gas-phase refrigerant RF is condensed and liquefied. That is, the connecting part 50 and the heat dissipating part 48 are also parts where the gas-phase refrigerant RF is condensed in this way.

Figure 9:
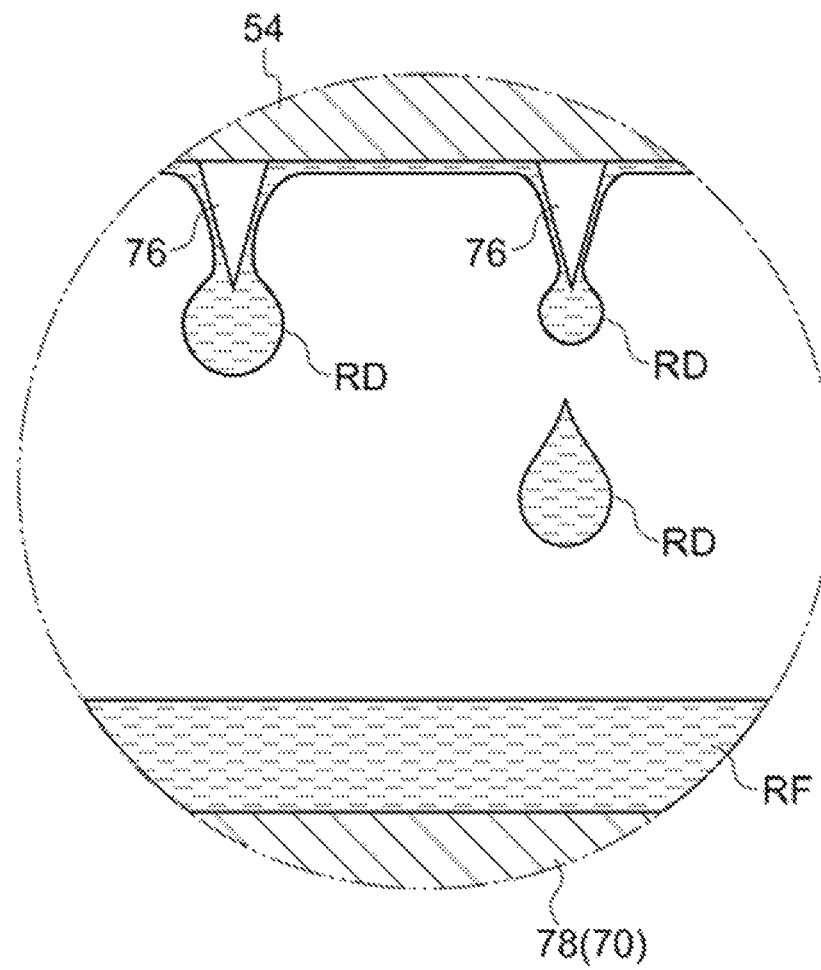
FIG. 9 is a cross-sectional view illustrating a state in which the refrigerant condenses in the cooling device of the first embodiment.

As illustrated in FIG. 9, a plurality of protrusions 76 is formed on the top plate 54 toward the bottom plate 52. Each of the protrusions 76 has a shape tapering toward a tip end side. By providing such protrusions 76, the surface area of the top surface of the condensing part 72 is larger than that of a structure without the protrusions 76.

Figure 5:
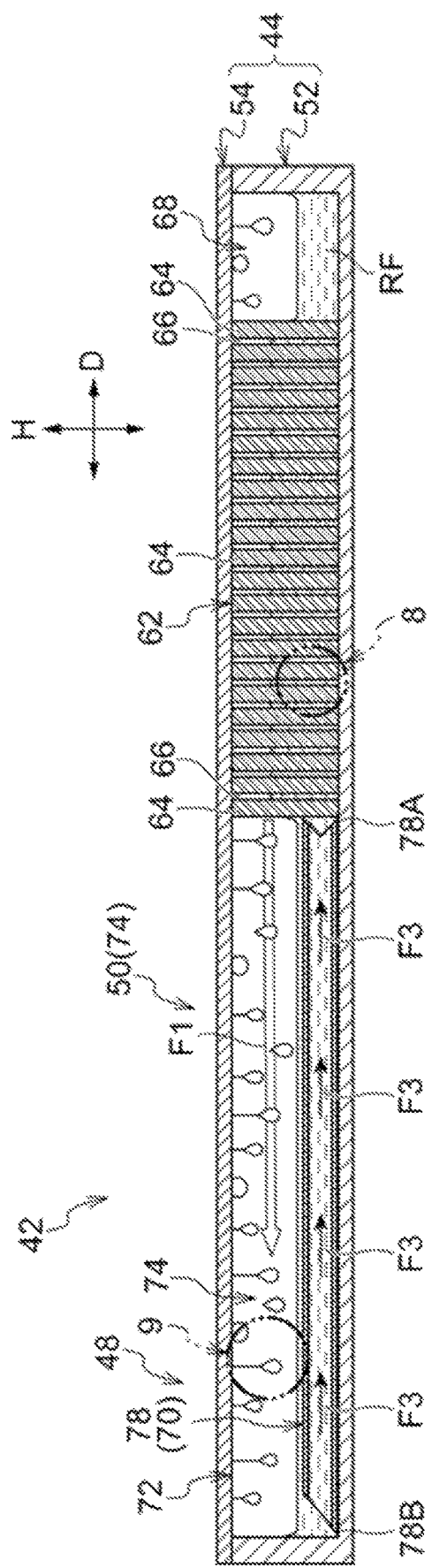
FIG. 5 is a cross-sectional view taken along line 5-5 of FIG. 4 illustrating the cooling device of the first embodiment in a non-tilted state.
Figure 6:
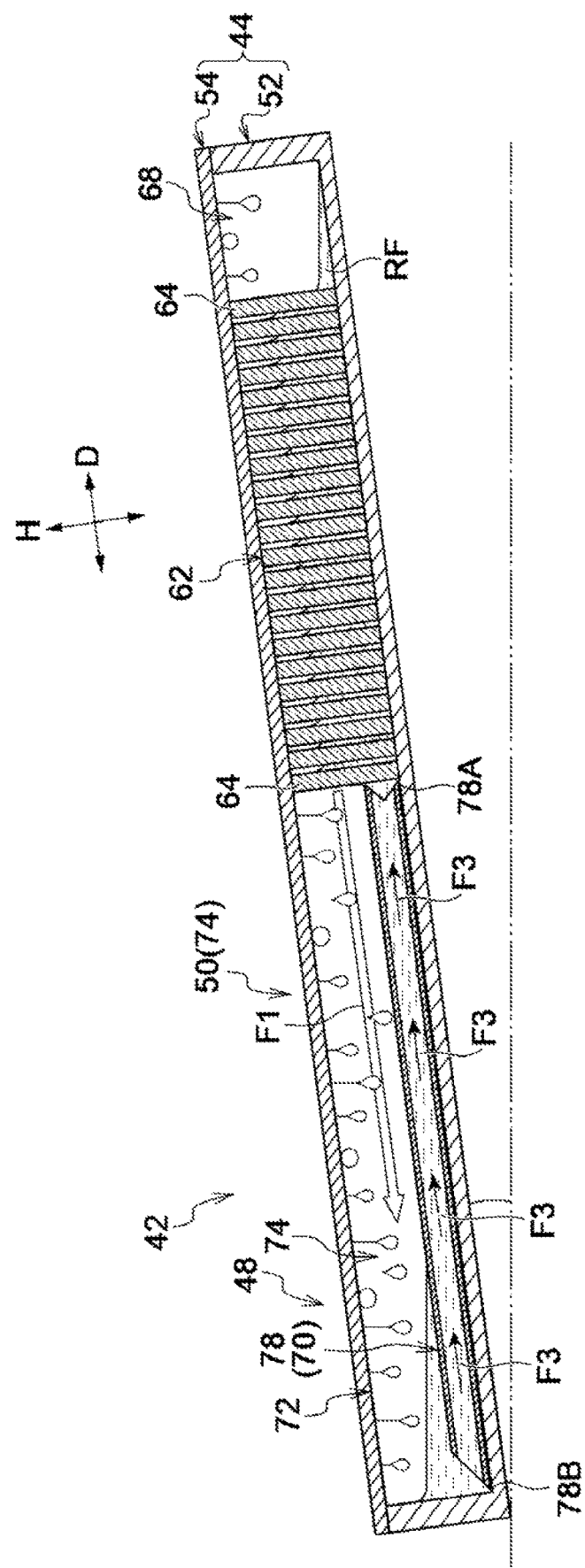
FIG. 6 is a cross-sectional view illustrating the cooling device of the first embodiment in a tilted state.

As illustrated in FIGS. 4 to 6, the flow path member 70 is arranged between the condensing part 72 and the evaporating part 62 inside the container 44. In the first embodiment, the flow path member 70 has a plate-shaped flow path plate 78 having a thickness direction which is the same as the height direction (arrow H direction) of the container 44.

Figure 10:
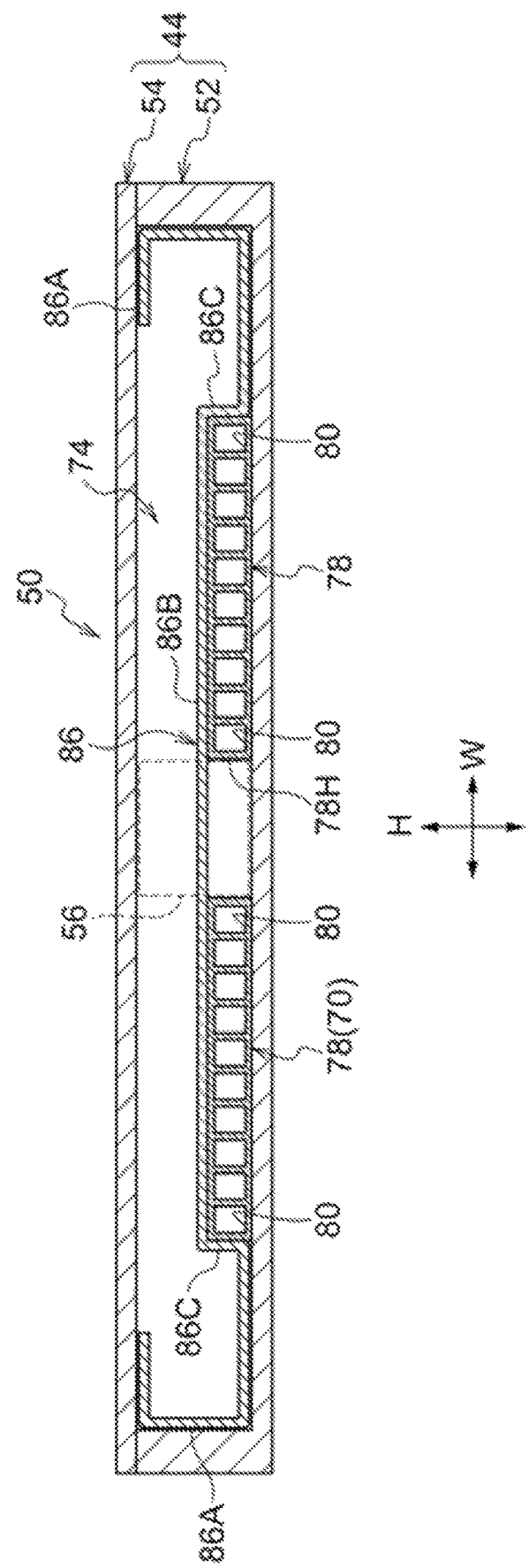
FIG. 10 is a cross-sectional view taken along line 10-10 of FIG. 4 illustrating the cooling device according to the first embodiment.
Figure 11:
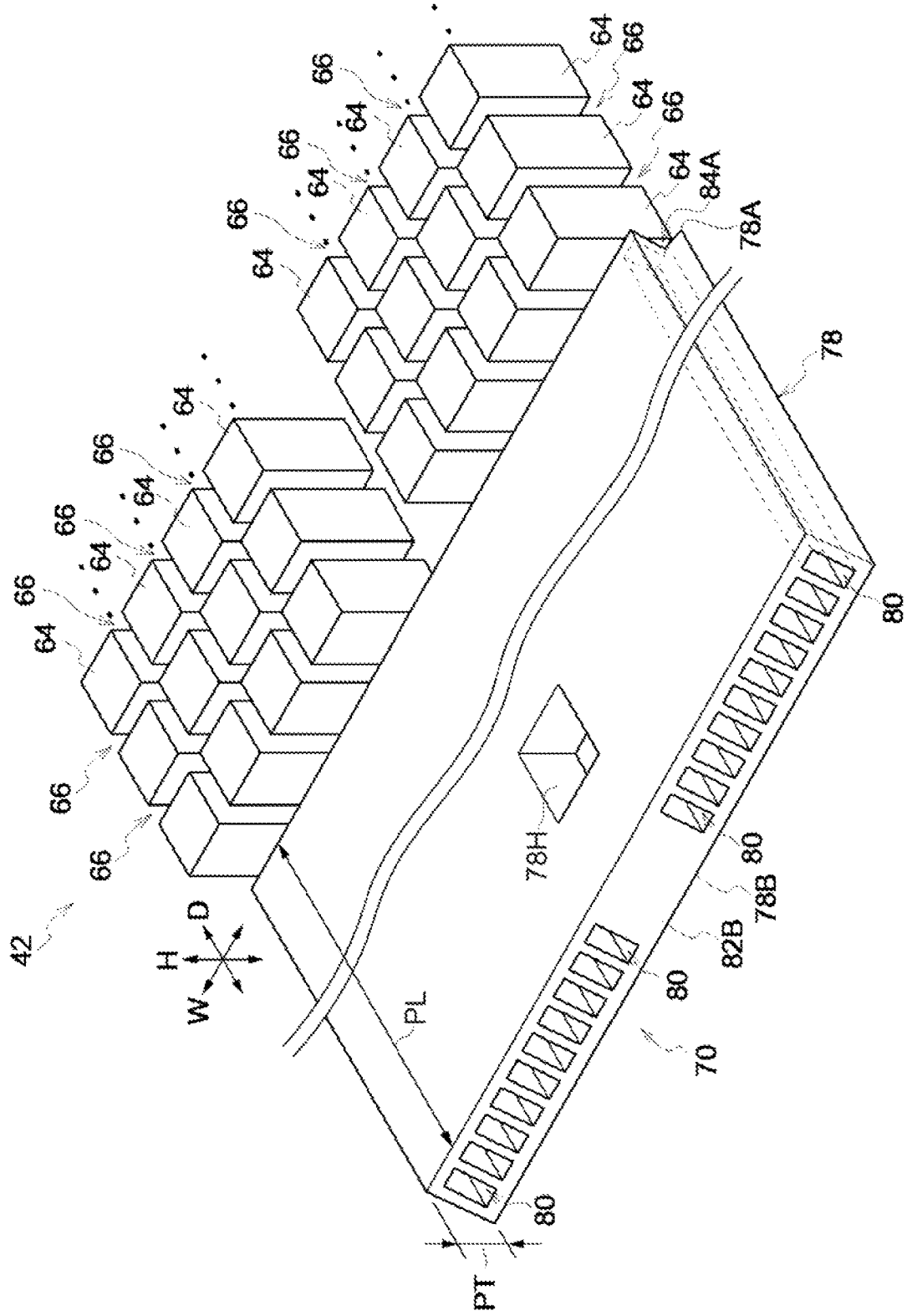
FIG. 11 is an enlarged perspective view illustrating the flow path member and the evaporating part in the cooling device of the first embodiment.

As also illustrated in FIGS. 10 and 11, a plurality of (twenty in the example illustrated in FIGS. 10 and 11) flow paths 80 penetrating from one end surface 78A on the evaporating part 62 side to another end surface 78B on the condensing part 72 side is formed in the flow path plate 78.

The flow path member 70 may be a block-shaped member in addition to such a plate-shaped flow path plate 78. The term "plate-shaped" referred to herein means that a thickness PT (outer dimension in the arrow H direction) is smaller than a length PL (outer dimension in the arrow D direction) (for example, the thickness PT is 0.4 or less with respect to the length PL), and is a shape that can be regarded as a plate. Meanwhile, the "block-shaped" means that the thickness PT is larger than the above-described "plate-shaped" shape with respect to the length PL (for example, the thickness PT is more than 0.4 and 1.0 or less with respect to the length PL), and is a shape that can be regarded as a block. Note that the above dimensional ratio of the example in which the flow path member 70 is the "plate-shaped" or "block-shaped" is merely an example. Furthermore, the flow path member 70 may have either shape in terms of whether it is the plate-shaped or block-shaped as long as the plurality of flow paths 80 can be formed. Either plate-shaped or block-shaped shape, the shape is different from that of a transportation pipe to be described below.

Note that, in the first embodiment, the flow path member 70 has a structure having one flow path plate 78, but as in a second embodiment and the like to be described below, the flow path member 70 can adopt a structure having a plurality of flow path plates 78.

In the first embodiment, the plurality of flow paths 80 is all linear, and a longitudinal direction of the flow path plate 78 coincides with a longitudinal direction of the flow path 80. Then, the plurality of flow paths 80 is formed so as to be arranged at regular intervals in the width direction (arrow W direction) of the flow path plate 78. Furthermore, the flow paths 80 are formed in a row in the thickness direction (arrow H direction) of the flow path plate 78. The flow path 80 has a fixed cross-sectional shape and is continuous from the one end surface 78A to the another end surface 78B of the flow path plate 78. In the first embodiment, each cross-sectional shape of the flow path 80 is rectangular.

The cross-sectional area of the flow path 80 is set such that the refrigerant RF can be transported by a capillary phenomenon by surface tension acting on the liquid-phase refrigerant RF, and the plurality of flow paths 80 as a whole can transport a sufficient amount of refrigerant RF to the evaporating part 62. The flow path 80 is an example of a transport part that transports the liquid-phase refrigerant RF to the evaporating part 62 by the capillary phenomenon.

Moreover, an upper limit of the cross-sectional area of the flow path 80 is determined so that the refrigerant RF can be transported from another end part 70B side to an one end part 70A side by the capillary phenomenon even in a case where the cooling device 42 is inclined such that the one end part 70A side becomes higher than the another end part 70B side of the flow path member 70. Specifically, the inner dimension N1 of the flow path 80 is set to the inner dimension N1 that can secure a flow rate within a range where the capillary phenomenon occurs in this way, and the inner dimension N1 of the flow path 80 is wider than the groove width W1 of the groove part 66 of the evaporating part 62.

Note that the inner dimension N1 of the flow path 80 is, for example, a maximum value of the inner dimension in the arrangement direction (arrow W direction) of the flow paths 80. In the flow path 80 having a rectangular cross section as in the first embodiment, the inner dimension N1 is the length of the short side of the rectangle.

The one end part 70A of the flow path member 70 faces the column member 64 as illustrated in FIGS. 5 and 11. In the first embodiment, a gap part is provided in the one end part 70A. More specifically, by forming a wedge-shaped notch in the one end surface 78A of the flow path plate 78, an inclined part 82A inclined with respect to the longitudinal direction of the flow path member 70 is formed. The inclined part 82A is an example of the gap part in the first embodiment.

Figure 12:
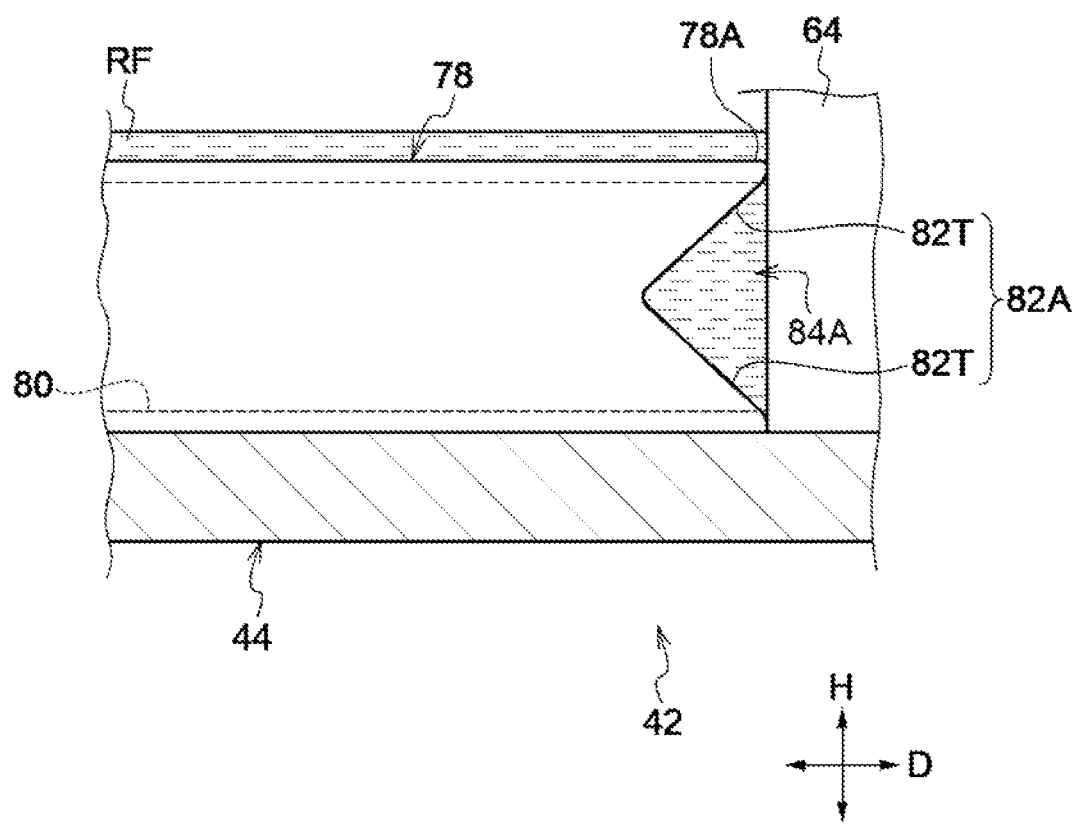
FIG. 12 is a side view illustrating one end part of the flow path member in the cooling device of the first embodiment together with a part of the evaporating part.

In particular, in the first embodiment, as illustrated in FIG. 12, the inclined part 82A has a V-shape having inclined surfaces 82T formed in pairs so as to approach each other as the distance from the column member 64 increases. The part where the inclined part 82A is provided, that is, the region between the inclined surfaces 82T, is a gap 84A in which the liquid-phase refrigerant RF moves from the flow path member 70 to the evaporating part 62.

The notch is continuously formed in the width direction (arrow W direction) in the one end surface 78A of the flow path plate 78. Therefore, the inclined part 82A (gap part) is also continued in the width direction (arrow W direction) in the one end surface 78A of the flow path plate 78.

As illustrated in FIG. 5, the another end surface 78B of the flow path plate 78 faces a side wall 44S of the container 44. The side wall 44S is a wall forming an end part of the container 44 on a front side (condensing part 72 side) in the depth direction.

Figure 13:
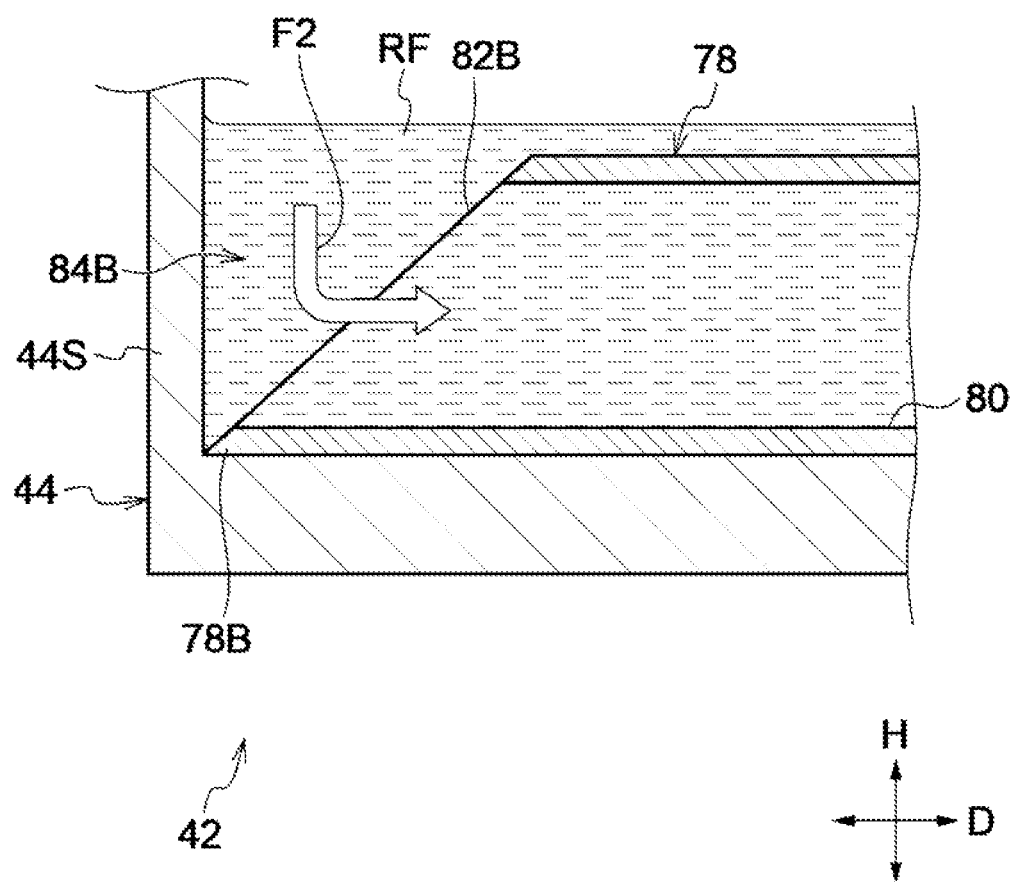
FIG. 13 is a cross-sectional view illustrating another end part of the flow path member in the cooling device of the first embodiment together with a part of the container.

As illustrated in FIG. 13, a second gap part is provided in the another end surface 78B of the flow path plate 78. Specifically, in the first embodiment, a second inclined part 82B obtained by inclining the another end surface 78B in one direction with respect to the longitudinal direction of the flow path member 70 is formed. Then, the region between the side wall 44S and the second inclined part 82B is a second gap 84B in which the liquid-phase refrigerant RF moves from the condensing part 72 into the flow path 80.

As illustrated in FIGS. 10 and 11, a plurality of through holes 78H each corresponding to the support columns 56 is formed in the center of the flow path plate 78 in the width direction. As illustrated in FIGS. 2 to 4, the support column 56 is inserted into the through hole 78H with the flow path plate 78 (flow path member 70) mounted in the container 44. Thereby, displacement of the flow path member 70 in the depth direction (arrow D direction) and the width direction (arrow W direction) is suppressed. Note that an inner dimension of the through hole 78H may be set to be about the same as an outer dimension of the support column 56, and the support column 56 may be press-fitted into the through hole 78H. In this case, since an inner surface of the through hole 78H and an outer surface of the support column 56 are in close contact with each other, the flow path plate 78 can be held in the thickness direction (arrow H direction).

Note that the flow paths 80 are formed at positions avoiding these through holes 78H.

As also illustrated in FIG. 10, a fixture 86 is arranged at the connecting part 50 inside the container 44. The fixture 86 has fitting parts 86A fitted between the top plate 54 and the bottom plate 52 on both sides in the width direction (arrow W direction), and a pressing part 86B that presses the plurality of flow path members 70 against the bottom plate 52 at the center in the width direction. The flow path member 70 is pressed against the bottom plate 52 and fixed by the pressing part 86B. Since the flow path member 70 is in contact with and fixed to the bottom plate 52 in this way, a flow path cross-sectional area sufficient for the movement of the gas-phase refrigerant RF is substantially secured between the top plate 54 and the flow path member 70.

As illustrated in FIGS. 1 to 4, the bottom plate 52 of the container 44 is provided with fastening holes 88. Fasteners such as screws are inserted into the fastening holes 88 and fastened to the substrate 34 so that the cooling device 42 is fix to the substrate 34. Since the element 36 to be cooled is mounted on the substrate 34, the cooling device 42 is also fixed to the element 36.

Note that the top plate 54 has a shape that avoids the fastening holes 88 when viewed in an overlapping direction with the bottom plate 52 (direction of arrow A1 illustrated in FIG. 1). Therefore, when fixing the cooling device 42 to the substrate 34, it is possible to perform a fastening operation (for example, a screw turning operation) of the fastener without being disturbed by the top plate 54.

As illustrated in FIGS. 1 and 2, fins 90 are attached to the top plate 54. The fins 90 increase the substantial surface area of the container 44, that is, a heat dissipation area for dissipating heat to the outside (air cooling). In particular, in the present embodiment, the fins 90 are installed in substantially the entire region of the top plate 54, and a wide heat dissipation area is secured.

Figure 15:
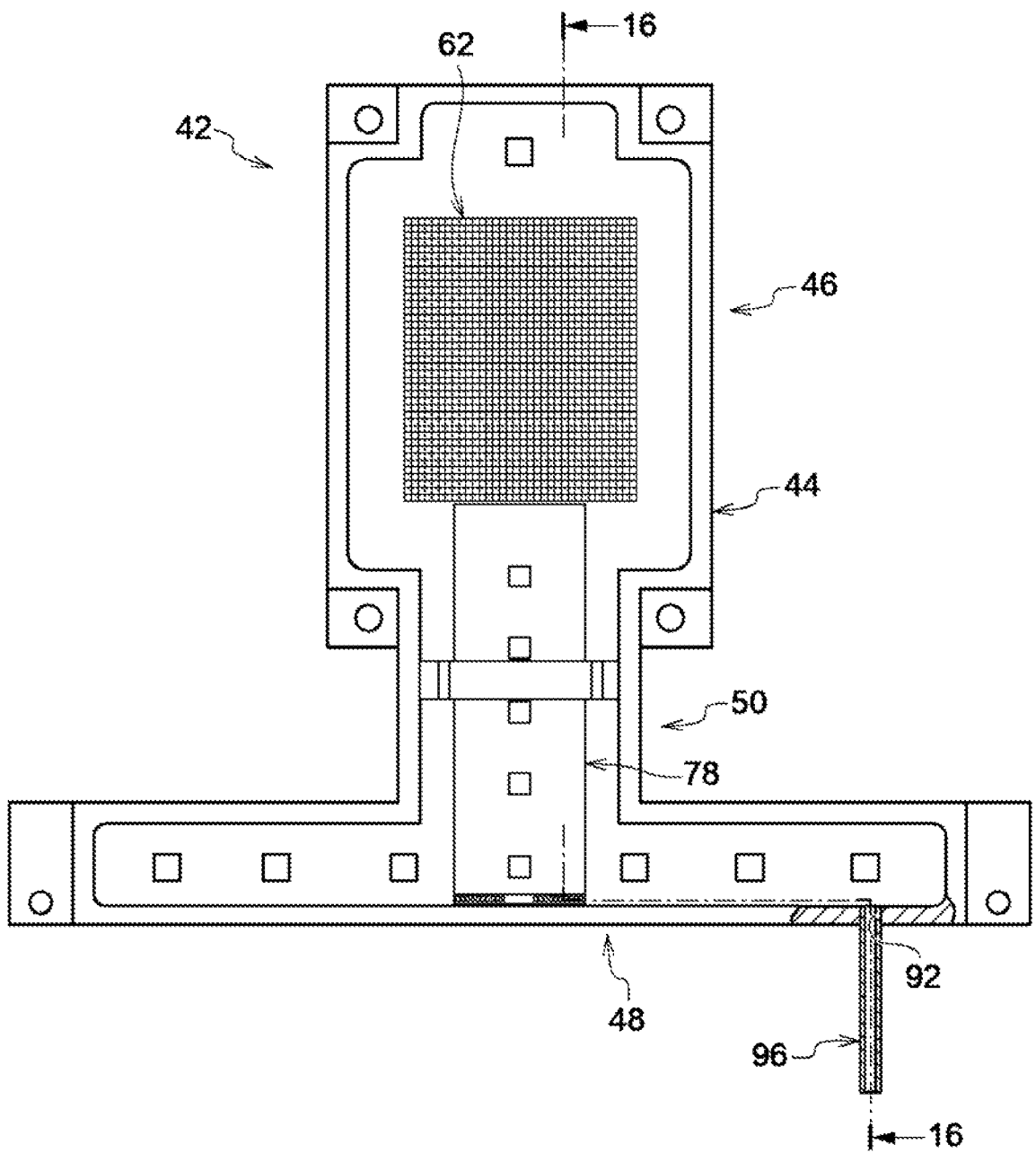
FIG. 15 is a plan view illustrating the internal structure of the cooling device of the present disclosure together with an injection hole and an injection pipe.
Figure 16:
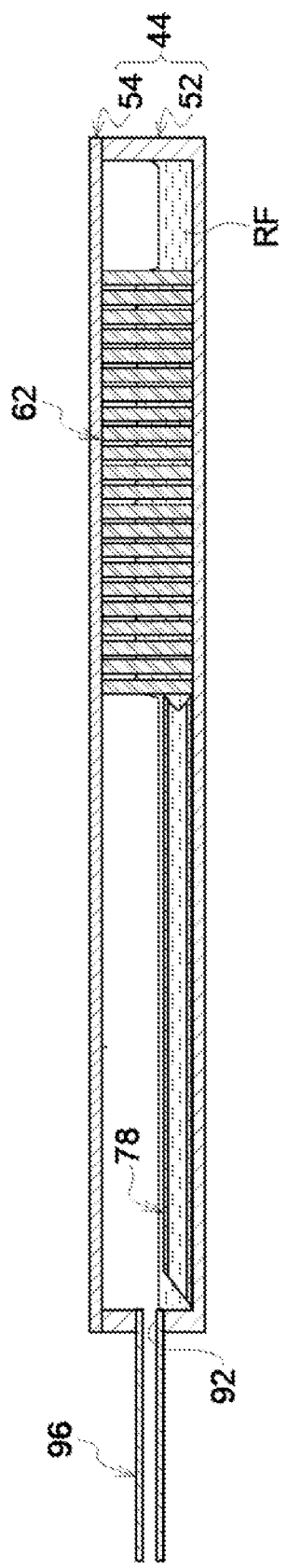
FIG. 16 is a cross-sectional view taken along line 16-16 of FIG. 15 illustrating the internal structure of the cooling device of the present disclosure.
Figure 17:
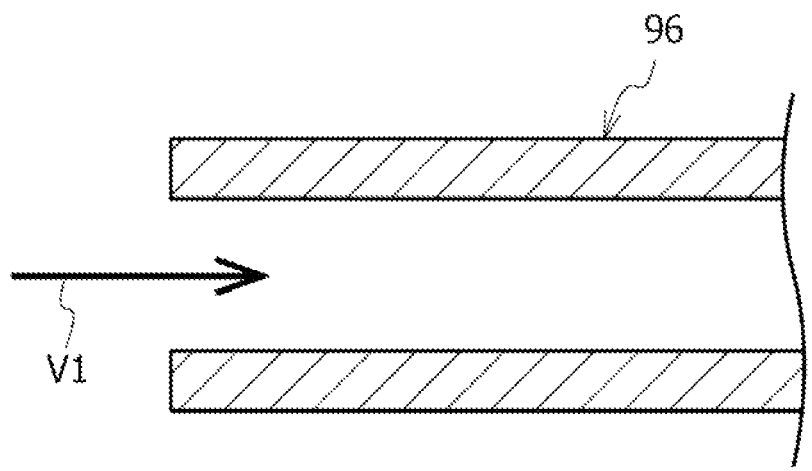
FIG. 17 is a cross-sectional view illustrating the injection pipe of the cooling device of the present disclosure in an unsealed state.
Figure 18:
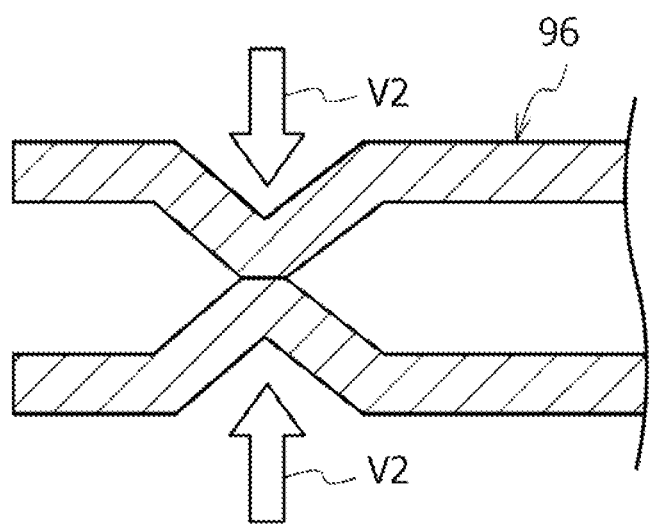
FIG. 18 is a cross-sectional view illustrating the injection pipe of the cooling device of the present disclosure in a compressed and sealed state.
Figure 19:
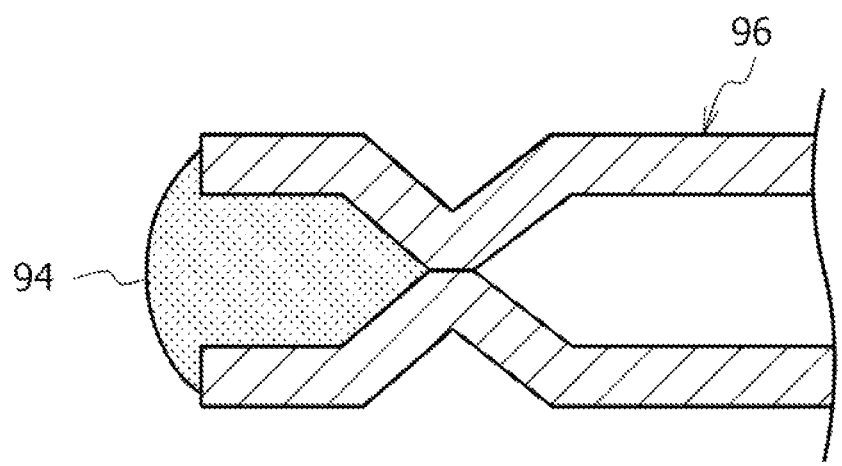
FIG. 19 is a cross-sectional view illustrating the injection hole of the cooling device of the present disclosure in a sealed state with a plug at a tip end of the injection pipe.

As illustrated in FIGS. 15 and 16, the container 44 is provided with an injection hole 92 that communicates the inside and the outside of the container 44. An injection pipe 96 extends through the injection hole 92 to the outside of the container 44. To inject the refrigerant RF into the container 44, the air in the container 44 is discharged using a vacuum pump or the like. Then, as illustrated by arrow V1 in FIG. 17, the refrigerant is injected through the injection pipe 96. Then, the refrigerant in the container 44 is heated and boiled, and dissolved air in the refrigerant RF is discharged to the outside of the container 44. Note that this operation is not necessary in a case of using a degassed refrigerant from which dissolved air has been removed in advance. Next, as illustrated by arrow V2 in FIG. 18, the injection pipe 96 is compressed and sealed from the outside. Moreover, as illustrated in FIG. 19, the injection pipe 96 is tightly sealed by packing a plug 94 in the tip end of the injection pipe 96. That is, since the injection hole 92 is provided, the refrigerant RF can be injected into the container 44 through the injection hole 92. Then, after the injection, the injection hole 92 is sealed with the plug 94, so that the refrigerant RF can be sealed inside the container 44. Note that, in the drawings other than FIGS. 15 to 19, the injection hole 92, the plug 94, and the injection pipe 96 are not illustrated.

Next, operations of the present embodiment will be described.

As illustrated in FIG. 5, when the heat receiving part 46 receives heat from the element 36 (see FIG. 3), this heat vaporizes the liquid-phase refrigerant RF in the groove part 66 in the evaporating part 62. That is, as also illustrated in FIG. 8, the liquid-phase refrigerant RF becomes a gas phase due to evaporation from the surface of the refrigerant RF (see arrow GF) and boiling from the inside of the refrigerant RF (see bubble GB).

The gas-phase refrigerant RF is diffused into the diffusion region 68 and moves to the heat dissipating part 48 through the moving region 74 (see arrows F1 in FIGS. 5 and 6). In the diffusion region 68 and the moving region 74, a part of the gas-phase refrigerant RF is condensed and liquefied by the heat dissipation through the fins 90. Moreover, the refrigerant RF that has reached the heat dissipating part 48 while maintaining the gas phase state is also cooled in the heat dissipating part 48 through the fins 90, thereby being condensed and liquefied. By liquefying the gas-phase refrigerant RF in this way, condensation heat is released from the top plate 54 to the outside of the container 44. As a result, the heat of the element 36 is discharged into the air outside the container 44.

As illustrated in FIG. 4, the condensing part 72 is formed wider in the width direction (arrow W direction) than the evaporating part 62. Therefore, a larger area for the heat dissipation from the gas-phase refrigerant RF can be secured than a structure in which the condensing part 72 is not wide in width, and the condensation of the refrigerant RF can be promoted.

Inside the container 44, the liquid-phase refrigerant RF enters the flow path 80 from the another end surface 78B side of the flow path plate 78, as illustrated by arrow F2 in FIG. 13. Moreover, as illustrated by arrows F3 in FIGS. 5 and 6, the refrigerant RF is transported to the one end surface 78A side, that is, toward the evaporating part 62, by the capillary phenomenon.

Then, in the evaporating part 62, the liquid-phase refrigerant RF is evaporated and vaporized again in the groove part 66. In this way, inside the container 44, the refrigerant RF is circulated between the evaporating part 62 and the condensing part 72 while repeating the phase transition between the liquid phase and the gas phase, so that the heat received by the heat receiving part 46 can be transferred to the heat dissipating part 48. Thereby, the element 36 to be cooled can be cooled.

Figure 7:
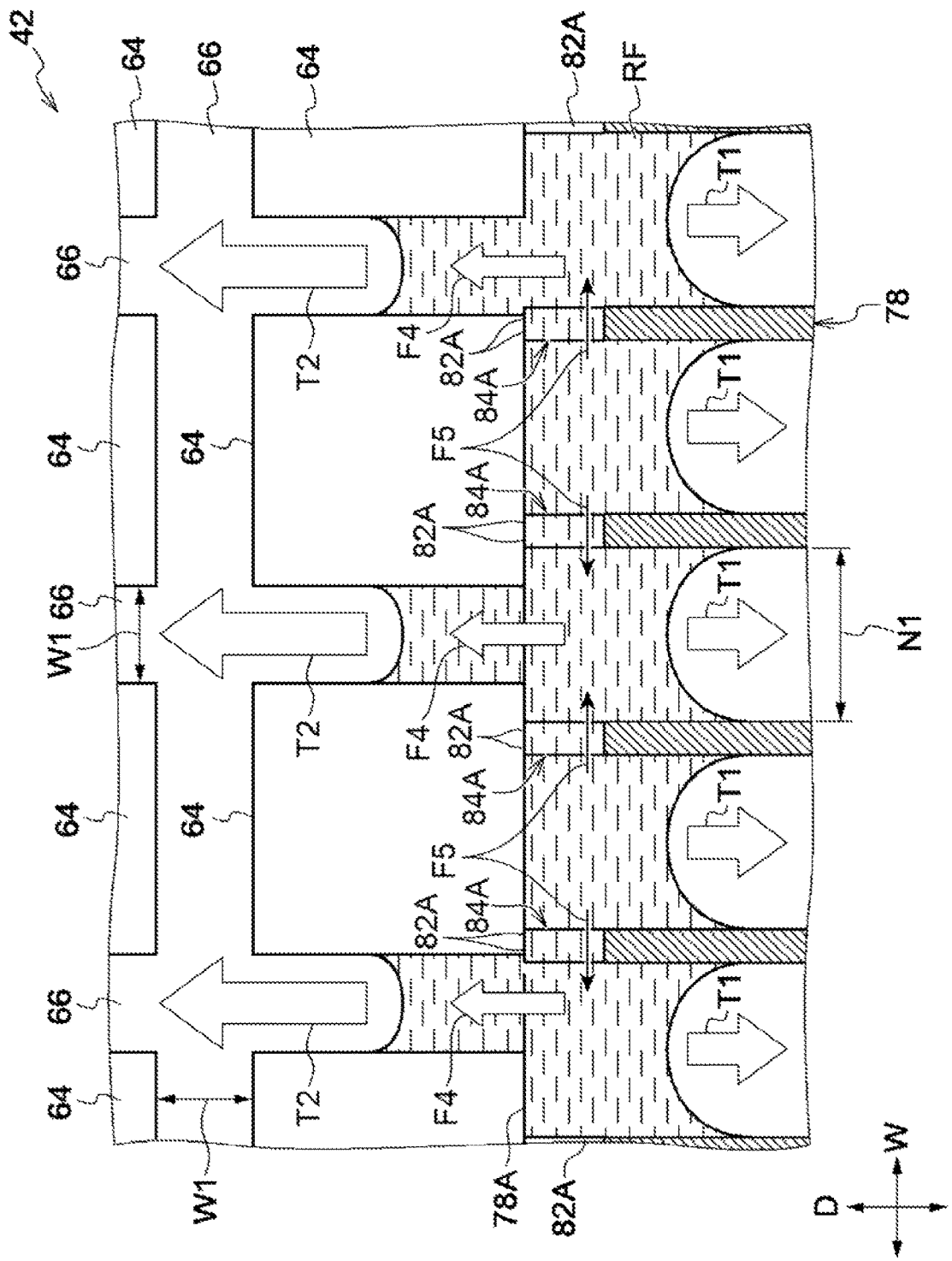
FIG. 7 is a plan view illustrating one end part of a flow path member in the cooling device of the first embodiment together with a part of an evaporating part.

As illustrated in FIG. 7, in the present embodiment, the groove width W1 of the groove part 66 of the evaporating part 62 is narrower than the inner dimension N1 of the flow path 80.

Figure 14:
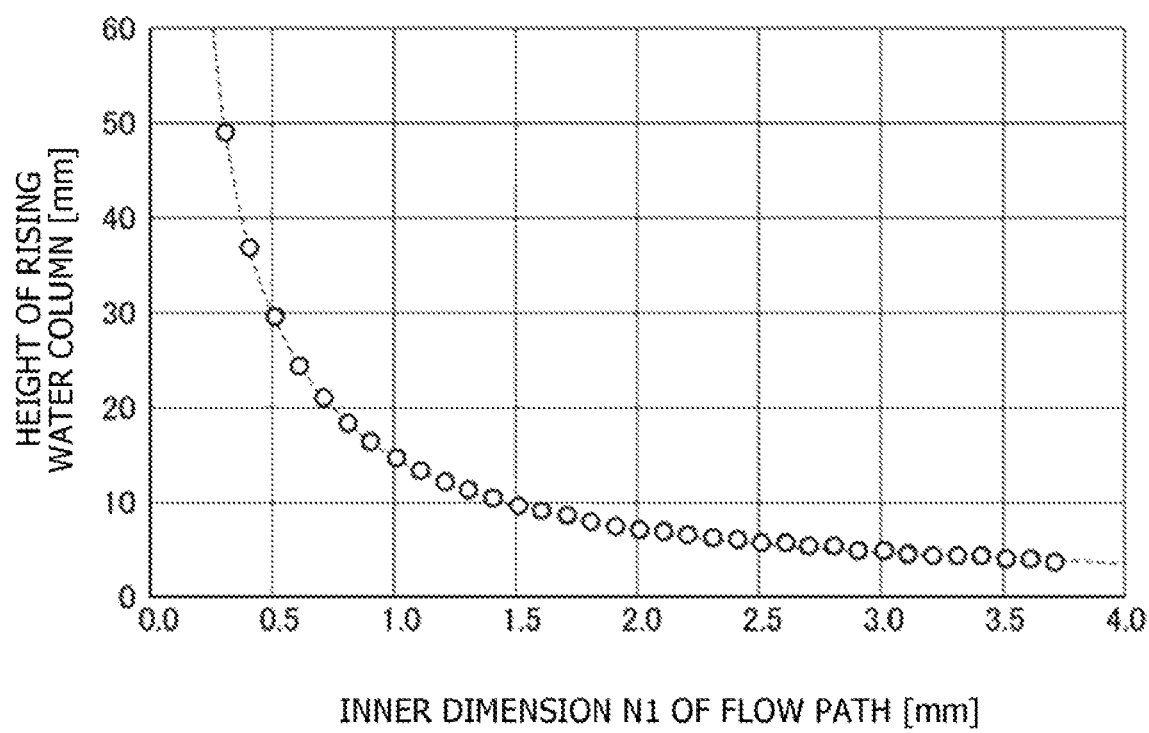
FIG. 14 is a graph illustrating a relationship between an inner diameter of the flow path member and a height of a water column rising in the flow path member.

FIG. 14 illustrates a relationship between the inner dimension N1 of the flow path 80 and a rising height of a liquid column that rises in the flow path member 70 due to surface tension (capillary phenomenon) when a liquid temperature is 25° C. This graph is an example of water used as the refrigerant RF in the present embodiment.

As can be seen from this graph, the smaller the inner dimension N1 of the flow path 80, the higher the rising height of the liquid column. That is, the refrigerant RF can be raised by higher surface tension as the inner dimension N1 is smaller.

In the flow path plate 78, as illustrated by arrows F3 in FIGS. 5 and 6, the liquid-phase refrigerant RF is transported to the evaporating part 62 through the flow path 80. However, on the one end surface 78A side of the flow path plate 78, as illustrated in FIG. 7, refrigerant suction force T1 in a direction away from the evaporating part 62 may act due to the surface tension of the liquid-phase refrigerant RF inside. Meanwhile, in the evaporating part 62, refrigerant suction force T2 that draws the refrigerant RF into the evaporating part 62 may act due to the surface tension of the liquid-phase refrigerant RF in the groove part 66. The refrigerant suction force T1 and the refrigerant suction force T2 are forces of opposite direction to each other, but the refrigerant suction force T2 is larger, so the refrigerant RF flows from the flow path 80 toward the evaporating part 62 as illustrated by arrow F4.

Here, for example, as illustrated in FIG. 6, consider a case of using the cooling device 42 that is tilted such that the one end part 70A of the flow path member 70 is higher than the another end part 70B. As an example, it is assumed that the one end surface 78A is about 25 mm higher than the another end surface 78B when considering the flow path plate 78 alone. In this case, it can be seen from the graph of FIG. 14 that the refrigerant RF can be transported from the another end surface 78B side toward the one end surface 78A side in the flow path 80 by the surface tension by setting the inner dimension N1 of the flow path 80 to 0.6 mm or less.

As described above, from the viewpoint of increasing the surface tension acting on the refrigerant RF in the flow path 80, the inner dimension N1 of the flow path 80 may be simply made smaller. Note that, if the inner dimension N1 of the flow path 80 is reduced, the flow path cross-sectional area of the refrigerant RF is also reduced, so that the amount of refrigerant RF that can be transported per unit time is also reduced. In the technology of the present disclosure, since the flow path 80 can be mounted at high density, the amount of refrigerant RF that can be transported per unit time can be maintained even in a case where a lower limit value of the inner dimension N1 is lowered.

As illustrated in FIG. 7, in the first embodiment, the groove width W1 of the groove part 66 is narrower than the inner dimension N1 of the flow path 80. From the relationship illustrated in FIG. 14, the surface tension acting on the liquid-phase refrigerant RF in the evaporating part 62 is larger than the surface tension acting on the liquid-phase refrigerant RF in the flow path 80. Therefore, the force for moving the refrigerant RF from the flow path 80 to the evaporating part 62 can be applied, and the refrigerant RF can be moved from the flow path 80 to the evaporating part 62, by the difference between the refrigerant suction force T2 and the refrigerant suction force T1.

Note that, to transport the liquid-phase refrigerant RF from the condensing part 72 to the evaporating part 62 by surface tension, for example, it is conceivable to use a cylindrical member as the transport pipe, instead of the above-described flow path member 70. In this transport pipe, the cylindrical internal space functions as a flow path through which the liquid-phase refrigerant RF flows. Then, by arranging a plurality of the transport pipes side by side in a radial direction, for example, it is possible to form a structure having a plurality of flow paths.

However, since the transport pipe itself has a wall thickness (a difference between the outer diameter and the inner diameter), when the plurality of transport pipes is arranged side by side in the radial direction, the interval between flow paths that are adjacent to each other becomes wide. That is, in the structure having the plurality of transport pipes arranged in the radial direction, high-density arrangement of the flow paths is difficult.

In contrast, in the first embodiment, the flow path member 70 has the plate-shaped flow path plate 78, and the plurality of flow paths 80 is formed in the flow path plate 78. Through holes that functions as the flow paths 80 can be formed in close proximity to the flow path plate 78. That is, in the present embodiment, the plurality of flow paths 80 can be arranged at high density without being affected by the wall thickness of the transport pipe. Then, in the present embodiment, by arranging the flow paths 80 at high density, it is possible to efficiently transport the liquid-phase refrigerant RF from the condensing part 72 to the evaporating part 62 and enhance the cooling capacity as the cooling device 42.

Furthermore, in the cooling device 42 of the first embodiment, the gap 84A is provided between the one end surface 78A of the flow path plate 78 (flow path member 70) and the column member 64. Therefore, the liquid-phase refrigerant RF transported through the flow path 80 flows into the groove part 66 of the evaporating part 62 through the gap 84A.

Here, consider a structure formed flat on the one end surface 78A of the flow path plate 78 without providing the gap 84A. In a flow path plate having the flat one end surface 78A, when an opening part of a flow path faces the column member 64 and is in contact with the entire circumference, this opening part may be covered by the column member 64. It is possible to secure a range not covered by the column member 64 in the opening part of the flow path by increasing the inner dimension N1 of the flow path. However, as described above, to ensure that the surface tension reliably acts on the refrigerant RF, there is the upper limit on the inner dimension N1 of the flow path.

In contrast, in the first embodiment, the inclined part 82A is provided on the one end surface 78A of the flow path plate 78 as an example of the gap part. Then, even if the tip end part of the flow path plate 78 is in contact with the evaporating part 62, the gap 84A not in contact with the evaporating part 62 is formed between the flow path plate 78 and the evaporating part 62. That is, the structure is a structure in which the opening part of the flow path 80 is not completely blocked by the column member 64. Therefore, as illustrated by arrow F5 in FIG. 7, the liquid-phase refrigerant RF transported through the flow path 80 flows into the groove part 66 of the evaporating part 62 through the gap 84A. That is, a structure that facilitates the movement of the liquid-phase refrigerant RF from the flow path member 70 to the evaporating part 62 is realized.

Then, since the liquid-phase refrigerant RF is sufficiently transported to the evaporating part 62, the cooling capacity of the cooling device 42 can be maintained, so that the temperature rise of the element 36 to be cooled can be effectively suppressed, contributing to the improvement of operation stability and extension of life of the element 36.

Furthermore, as compared with a cooling device not adopting the structure of the first embodiment, it is possible to lower blowing capacity of a cooling fan in order to obtain the same level of cooling capacity, thereby reducing noise.

Moreover, since the cooling device 42 of the first embodiment is a so-called air cooling system that applies the cooling air to the fins 90 to cool the fins, there is no need for, for example, equipment for circulating the cooling water, thereby reducing cost, as compared with a water cooling system (or liquid cooling system) In the water cooling system, pipes such as hoses and pipes for flowing cooling water are provided, whereas in the present embodiment, such pipes are not necessary, so that space efficiency is excellent, and the pipes do not disturb maintenance work and maintainability is excellent. For example, it is possible to enhance the certainty of the maintenance work and shorten the work time.

Next, a second embodiment will be described. In the second embodiment, similar elements, members, and the like to those in the first embodiment are given the same reference numerals to those in the first embodiment, and detailed description thereof will be omitted. Furthermore, since an overall structure of a cooling device is similar to that of the first embodiment, illustration is omitted.

Figure 20:
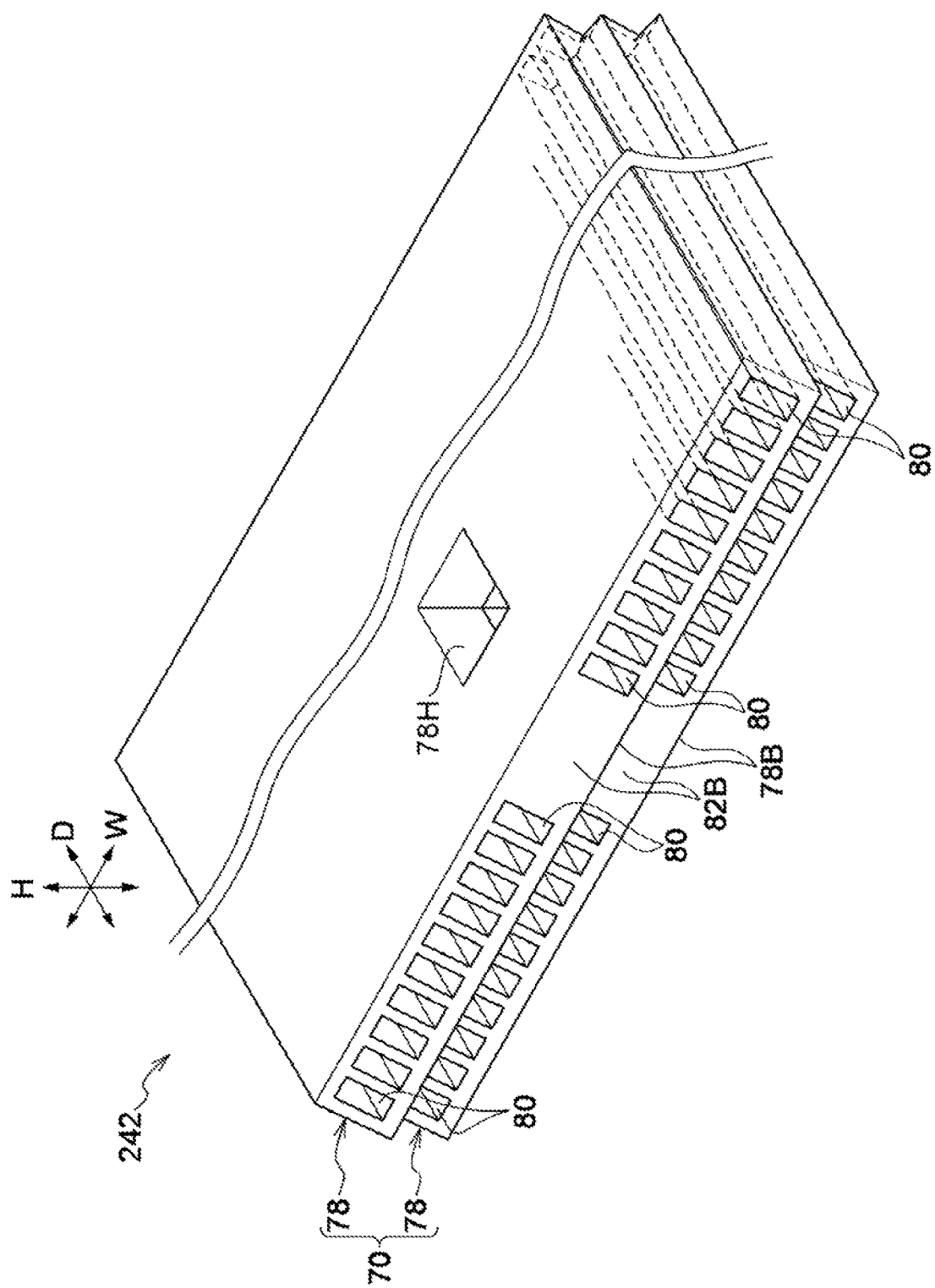
FIG. 20 is a perspective view illustrating a flow path member in a cooling device of a second embodiment.
Figure 21:
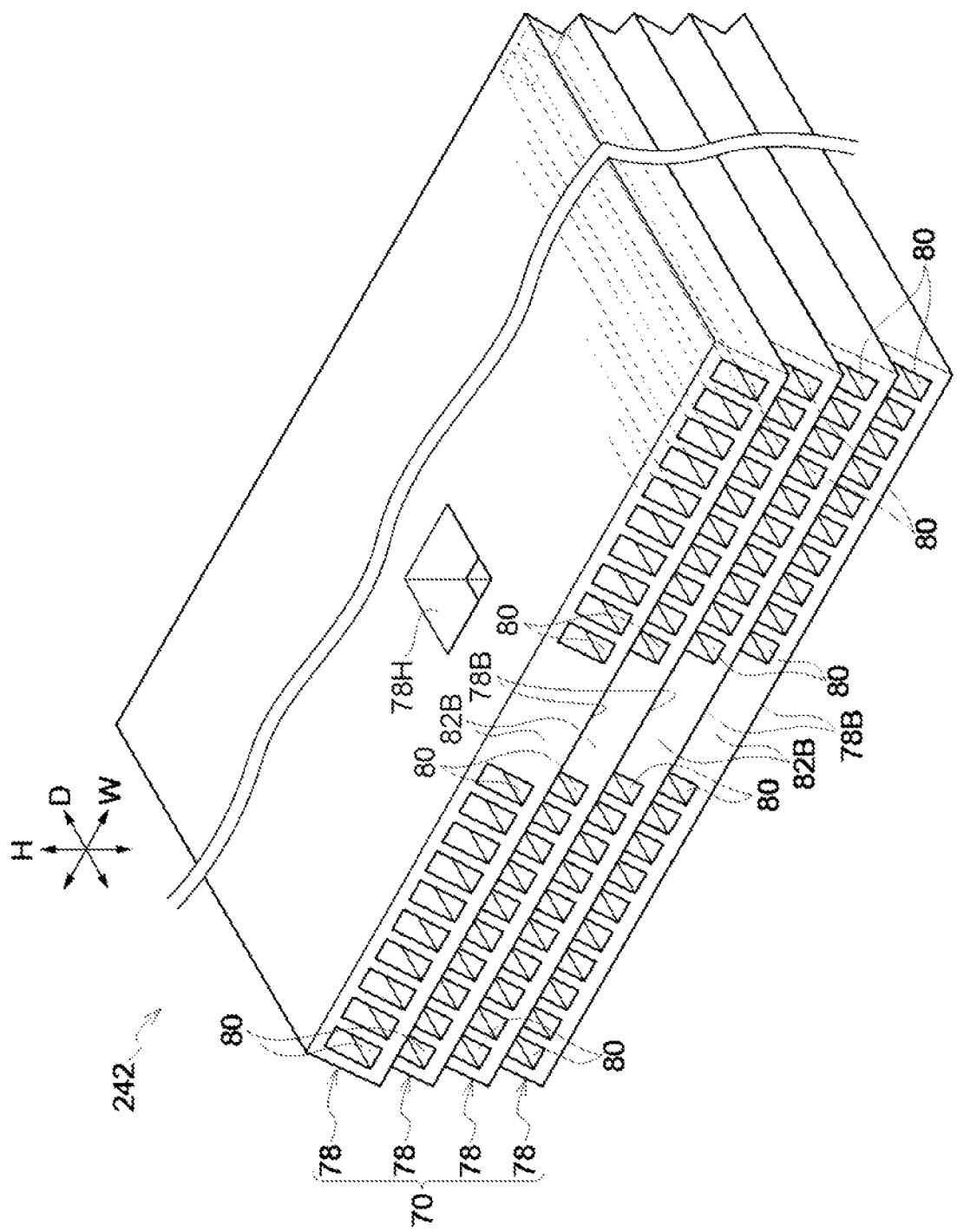
FIG. 21 is a perspective view illustrating an example different from FIG. 20 of the flow path member in the cooling device of the second embodiment.

As illustrated in FIGS. 20 and 21, a cooling device 242 of the second embodiment has a structure in which a plurality of plate-shaped flow path plates 78 is arranged and stacked in a plate thickness direction as a flow path member 70. As an example, the number of stacked flow path plates 78 is two in the example illustrated in FIG. 20 and four in the example illustrated in FIG. 21.

In the structure in which the flow path member 70 has the plurality of flow path plates 78 stacked in this way, a plurality of flow paths 80 is also arranged in a height direction (arrow H direction) of the flow path member 70. Therefore, as compared with the structure having one flow path plate 78, it is possible to efficiently transport more liquid-phase refrigerant RF from a condensing part 72 to an evaporating part 62, and enhance cooling capacity as the cooling device 242.

Note that, in the second embodiment, in the examples illustrated in FIGS. 20 and 21, the plurality of flow path plates 78 has the same shape and is stacked in the thickness direction. However, even if the shapes of the plurality of flow path plates 78 do not match, any shape may be used as long as they can be stacked.

In the second embodiment, the number of flow path plates 78 is not limited, and two or more is sufficient. Furthermore, the overall height of the flow path member 70 is not limited as long as a moving region 74 can be formed between the flow path member 70 and a top plate 54, in a connecting part 50 of a container 44. For example, in a case where the height of an inner dimension of the container 44 is sufficiently high, even if five or more flow path plates 78 are stacked to increase the height dimension as the flow path member 70, the moving region 74 having a sufficient large cross-sectional area can be secured in the connecting part 50.

Next, a third embodiment will be described. In the third embodiment, similar elements, members, and the like to those in the first and second embodiments are given the same reference numerals to those in the first and second embodiments, and detailed description thereof will be omitted.

Figure 22:
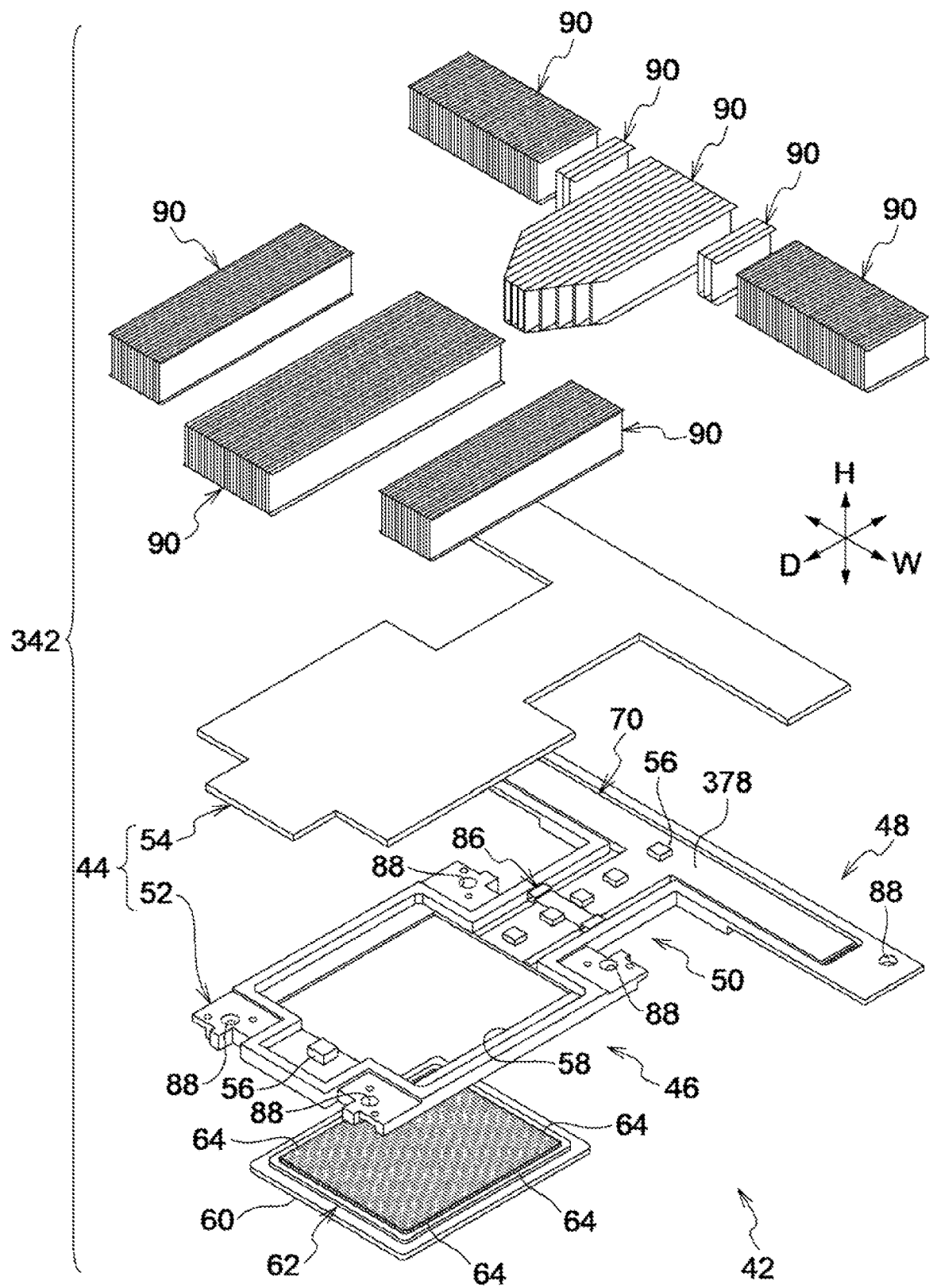
FIG. 22 is an exploded perspective view illustrating a cooling device according to a third embodiment.
Figure 23:
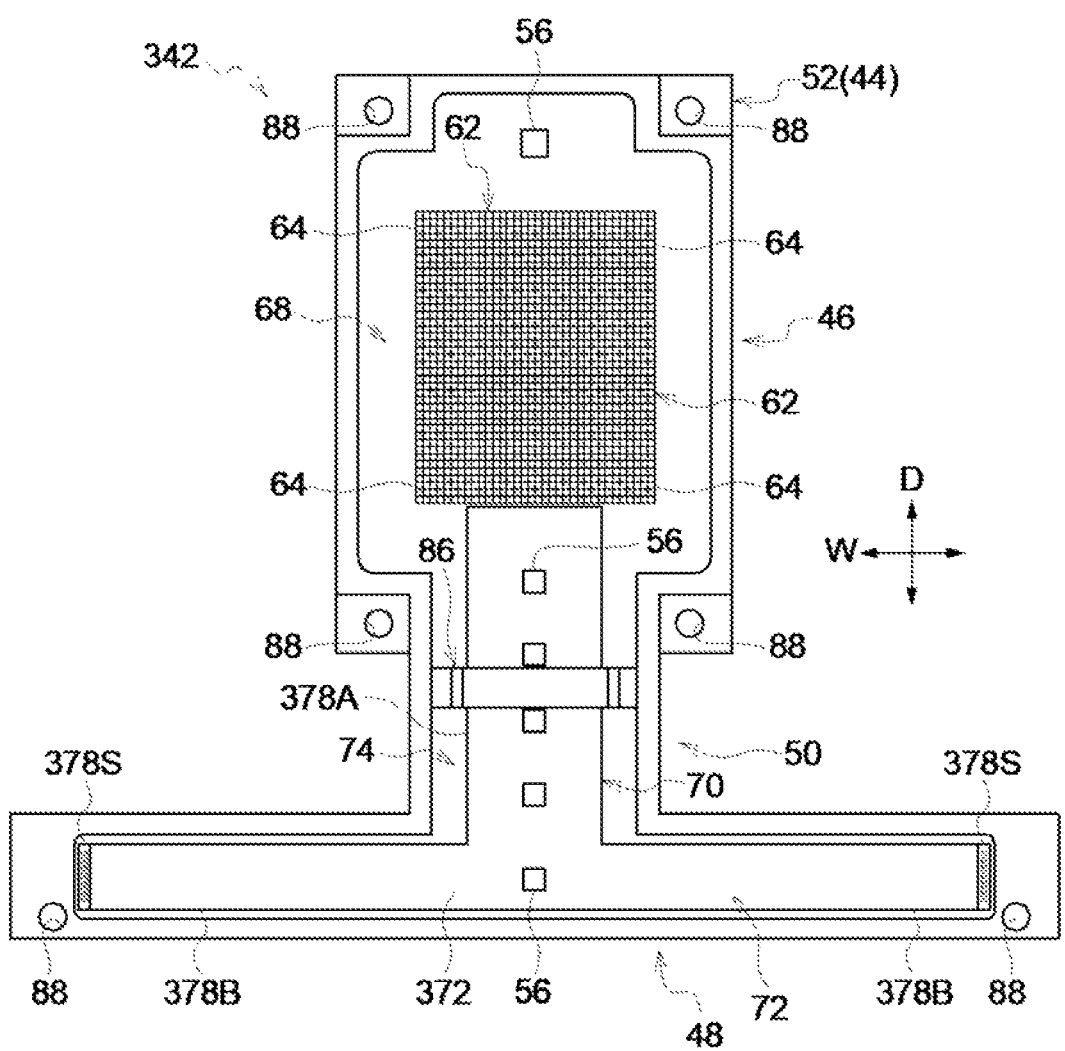
FIG. 23 is a plan view illustrating an internal structure of the cooling device of the third embodiment.

In a cooling device 342 of the third embodiment, as illustrated in FIGS. 22 and 23, the shape of a flow path member 70 is different from that of the first embodiment.

Specifically, the flow path member 70 of the third embodiment has a flow path plate 378. The flow path plate 378 has a first part 378A located at a connecting part 50 in a container 44, and two second parts 378B each branching outward in a width direction from the first part 378A on a condensing part 72 side. A tip end side of the second part 378B is a side surface 378S of the flow path plate 378. Note that the side surface 378S is inclined with respect to a longitudinal direction (arrow W direction) of the second part 378B, similarly to the another end surface 78B of the flow path plate 78 of the first embodiment.

Having such a shape, the flow path plate 378 is a plate-shaped member formed into a T shape in plan view as a whole. Then, as illustrated in FIG. 23, the first part 378A is located in the connecting part 50 and the second parts 378B are located in a heat dissipating part 48 in the container 44.

Figure 24:
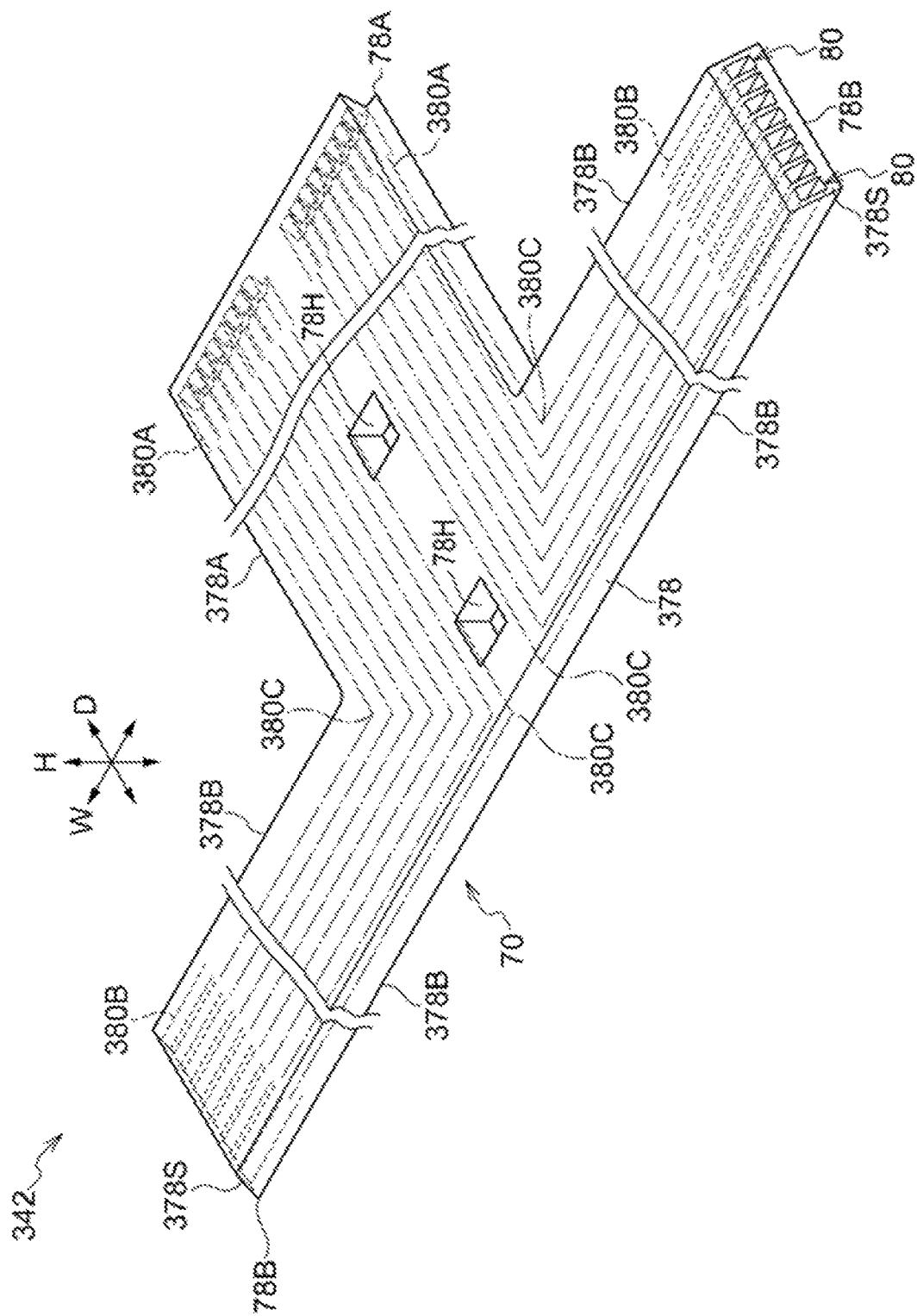
FIG. 24 is a perspective view illustrating a flow path member in the cooling device of the third embodiment.

As illustrated in FIG. 24, a plurality of flow paths 80 is formed in the flow path plate 378. Each of the flow paths 80 has a first flow path part 380A located in the first part 378A, and a second flow path part 380B bent by a curved part 380C from the first flow path part 380A and located in either one of the two second parts 378B. A tip end of each second flow path part 380B is opened to the side surface 378S of the flow path plate 378. Note that, in the example illustrated in FIG. 24, the flow path 80 is bent at the curved part 380C. Furthermore, in the example illustrated in FIG. 23, support columns 56 in the heat dissipating part 48 are omitted, but a structure in which the support columns 56 are provided in the heat dissipating part 48 may be adopted. In this case, a through hole 78H is also formed in the second part 378B of the flow path plate 378. Then, in the second part 378B, the second flow path part 380B of the flow path 80 is formed at a position avoiding the through hole 78H.

In the cooling device 342 of the third embodiment having such a structure, a liquid-phase refrigerant RF of the condensing part 72 flows into the flow path 80 from the side surface 378S. Then, as in the first embodiment, the liquid-phase refrigerant RF is transported to an evaporating part 62 through the flow path 80 by surface tension acting on the liquid-phase refrigerant RF.

As described above, in the third embodiment, since the flow path 80 is bent at the curved part 380C, the opening of the second flow path part 380B is located at the position different from the position of the first embodiment in the width direction (arrow W direction). Therefore, it is possible to realize a structure in which the liquid-phase refrigerant RF flows into the flow path 80 at the position different from the position of the first embodiment.

Figure 25:
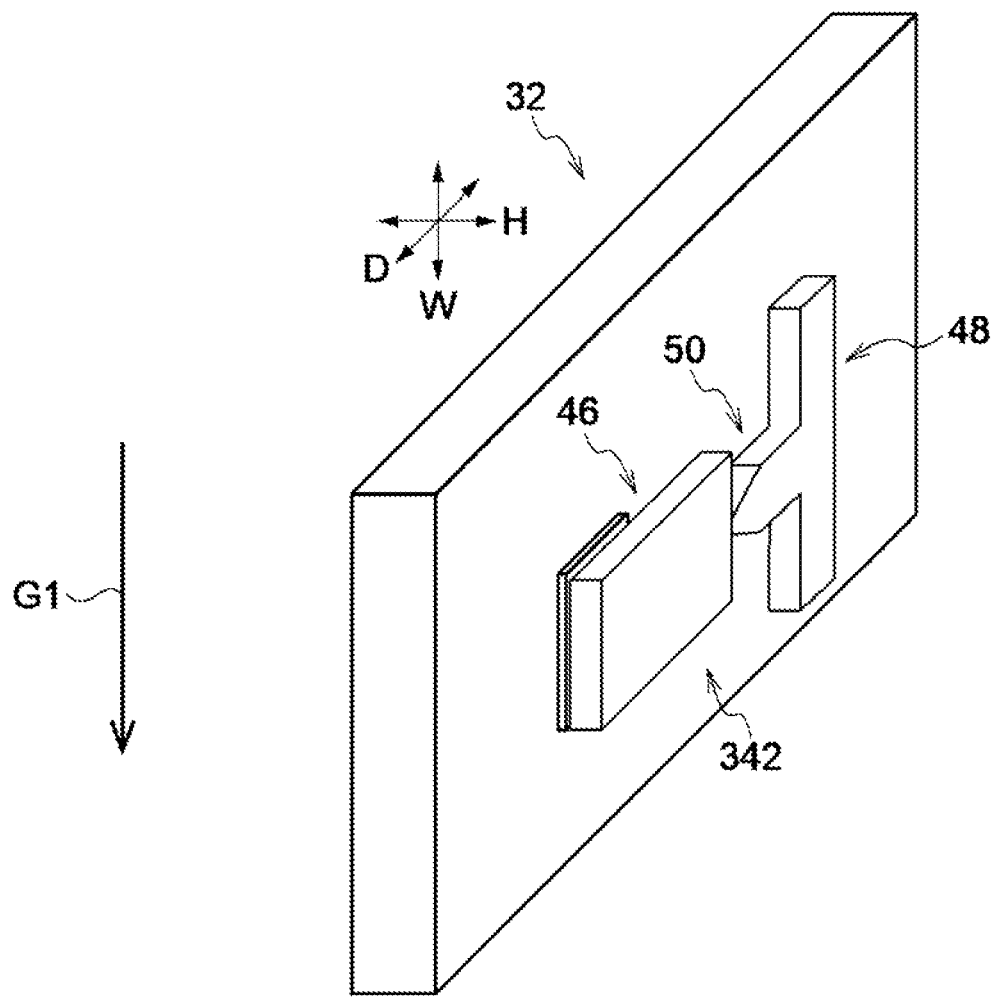
FIG. 25 is an explanatory diagram illustrating an example of a usage state of the cooling device according to the third embodiment.

Here, FIG. 25 illustrates an example of an electronic device 32 using the cooling device 342 of the third embodiment in a used state. This is an example used in a direction that matches a vertical direction (arrow G1 direction).

Figure 26:
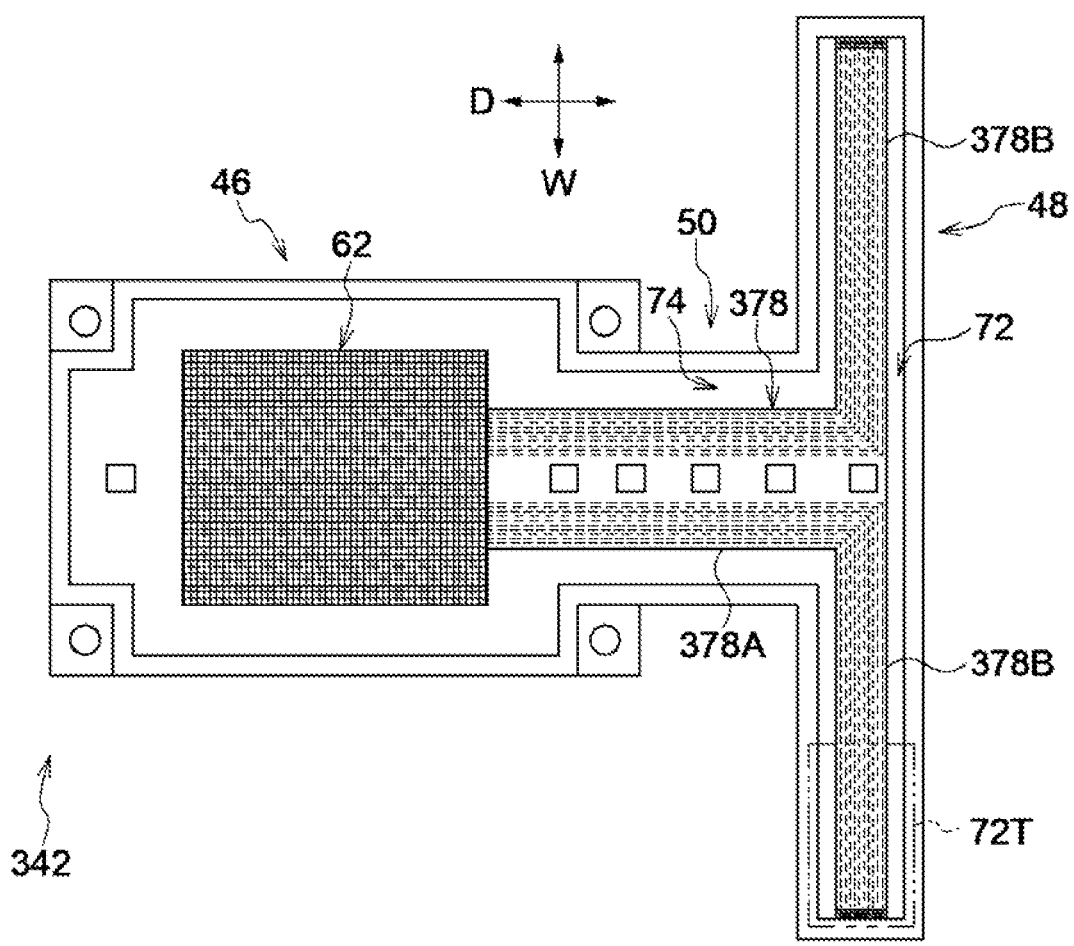
FIG. 26 is a side view illustrating an example of a usage state of the cooling device according to the third embodiment.

As also illustrated in FIG. 26, in the case where the electronic device 32 is used in the width direction (arrow W direction) matching the vertical direction, one end part (illustrated as an end part 72T in the width direction in FIG. 26) in the width direction of the condensing part 72 is located in a vertically lower side. Therefore, the liquid-phase refrigerant RF generated in the condensing part 72 is accumulated in this end part 72T side.

In the cooling device 342 of the third embodiment, the opening of the flow path 80 is located in the end part 72T. Therefore, a structure in which the refrigerant RF in the end part 72T flows into the flow path 80 when the liquid-phase refrigerant RF is accumulated in the end part 72T can be realized. That is, in the electronic device 32 arranged in the width direction (arrow W direction) matching the vertical direction, the cooling device 342 capable of effectively cooling an object to be cooled by reliably circulating the phase-changing refrigerant RF can be obtained.

Although only one electronic device 32 is illustrated in FIG. 25, in practice, a plurality of the electronic devices 32 may be arranged side by side in a thickness direction (arrow H direction in FIG. 25). In other words, in a case of arranging each of the electronic devices 32 in the width direction (arrow W direction) matching the vertical direction in order to efficiently arrange the plurality of electronic devices 32, the structure in which the liquid-phase refrigerant RF accumulated in the end part 72T flows into the flow path 80 can be realized.

Note that, in the example illustrated in FIG. 24, the flow path 80 is bent at the curved part 380C. Since the flow path 80 can be substantially formed into a shape having two straight parts, the structure can be simplified and the flow path can be easily formed.

Next, a fourth embodiment will be described. In the fourth embodiment, similar elements, members, and the like to those in the first to third embodiments are given the same reference numerals to those in the first to third embodiments, and detailed description thereof will be omitted.

Figure 27:
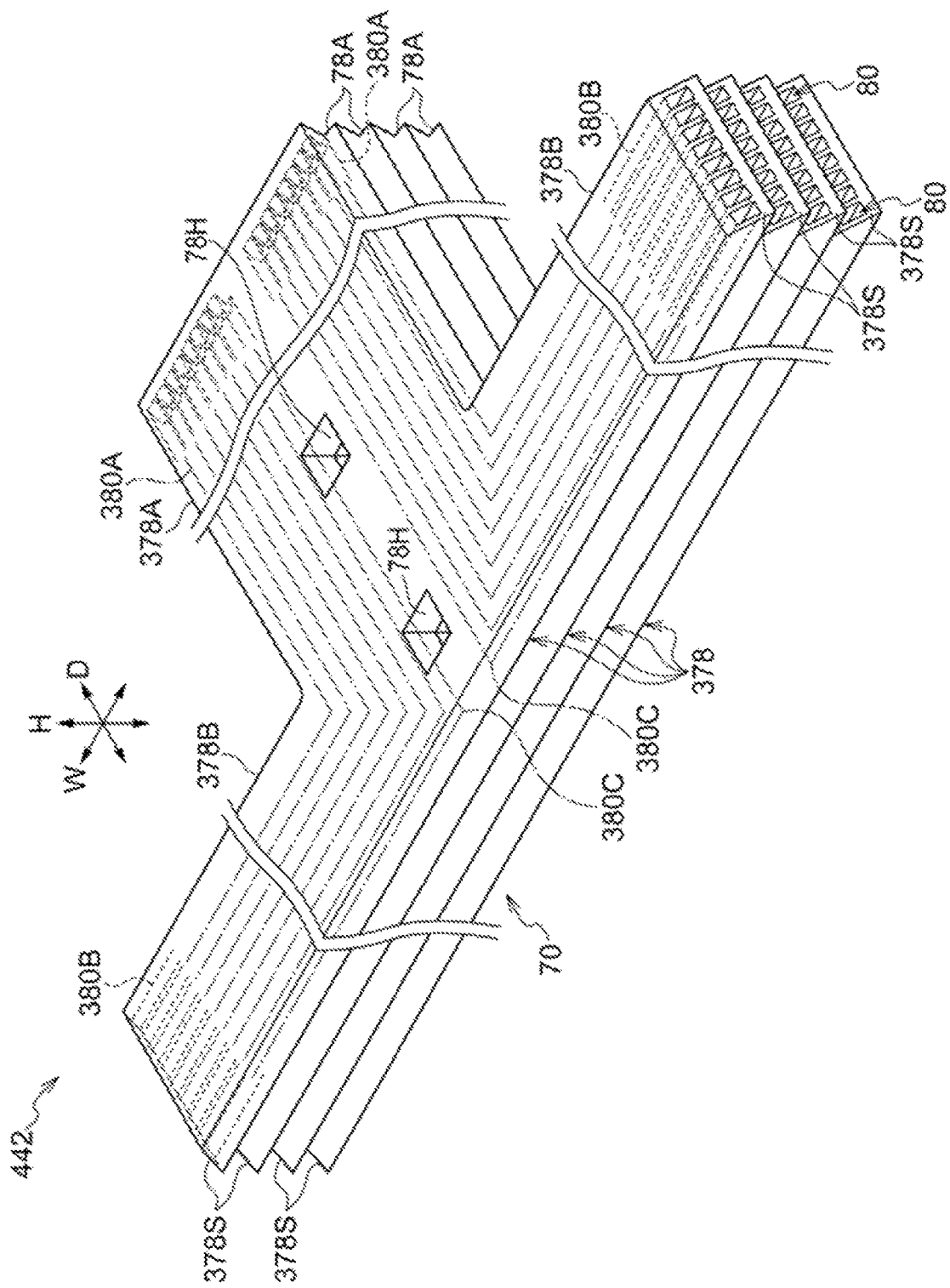
FIG. 27 is a perspective view illustrating a flow path member in a cooling device of a fourth embodiment.

In a cooling device 442 of the fourth embodiment, as illustrated in FIG. 27, a flow path member 70 has a plurality of flow path plates 378. The flow path plates 378 are stacked in a thickness direction as in the second embodiment (see FIGS. 20 and 21).

Even in the fourth embodiment having such a structure, a liquid-phase refrigerant RF of a condensing part 72 is introduced from a flow path 80 opened to a second part 378B into the flow path 80 and transported to an evaporating part 62 by surface tension acting on the liquid-phase refrigerant RF, as in the third embodiment.

Furthermore, even in a case of arranging the cooling device in a width direction (arrow W direction) matching an up-down direction as in the example illustrated in FIG. 25, the structure in which the liquid-phase refrigerant RF accumulated in an end part 72T flows into the flow path 80 can be realized.

Note that, in the fourth embodiment, in the example illustrated in FIG. 27, four flow path plates 378 are stacked, but the number of flow path plates 378 is not limited as long as the number is plural.

Next, a fifth embodiment will be described. In the fifth embodiment, similar elements, members, and the like to those in the first to fourth embodiments are given the same reference numerals to those in the first embodiment, and detailed description thereof will be omitted.

Figure 28:
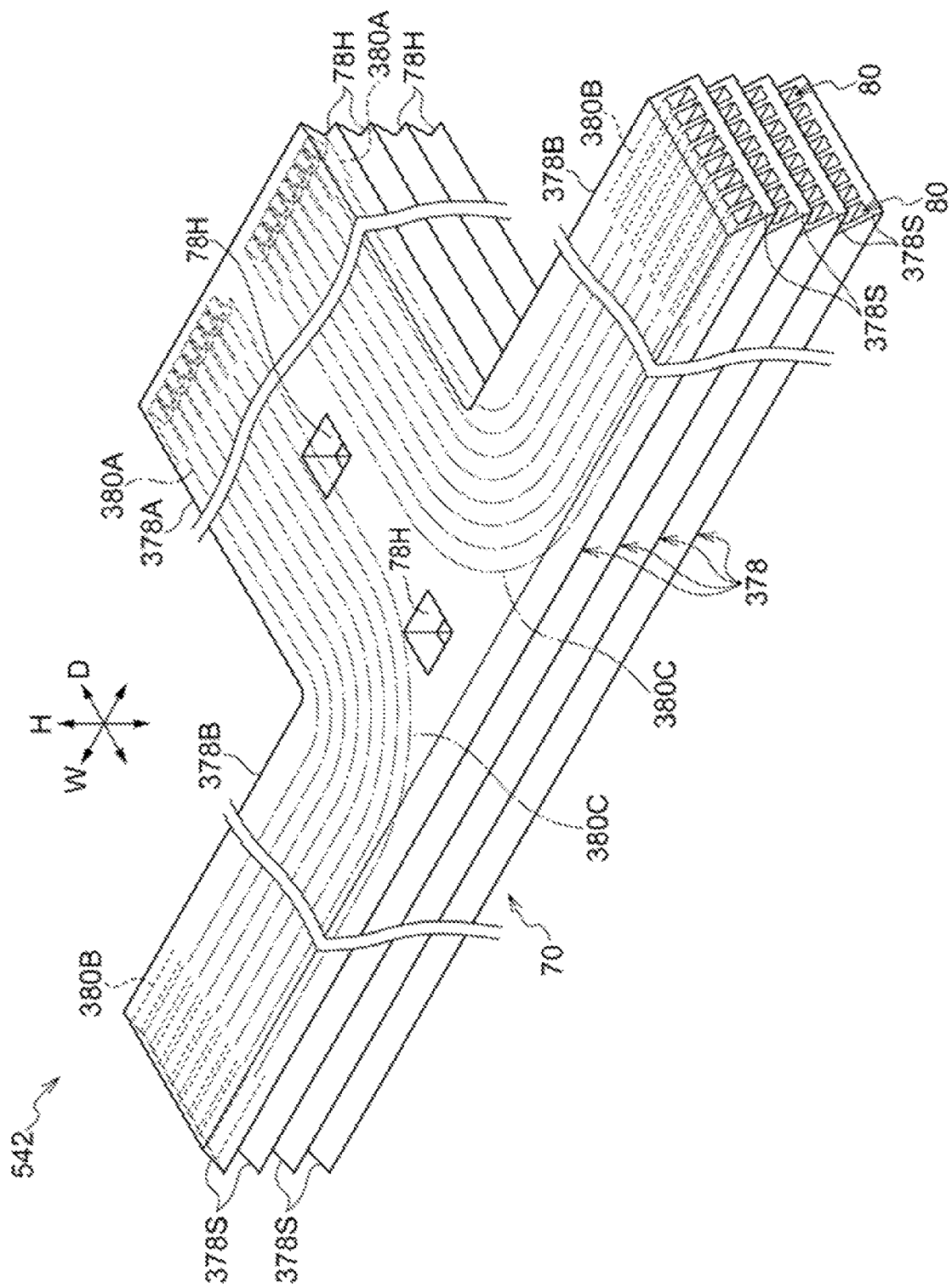
FIG. 28 is a perspective view illustrating a flow path member in a cooling device of a fifth embodiment.

In a cooling device 542 of the fifth embodiment, as illustrated in FIG. 28, a curved part 380C of a flow path 80 has a shape gently curved between a first part 378A and a second part 378B.

In the fifth embodiment, the curved part 380C between the first flow path part 380A and the second flow path part 380B is curved in this way, and there is no bent part in the flow path 80. Thereby, a pressure loss when a fluid flows through the flow path 80 is reduced as compared with a structure having a bent part. Therefore, a decrease in the flow speed when the liquid-phase refrigerant RF flows in the flow path 80 can be suppressed, and the refrigerant RF can be transported to the evaporating part 62 by a smooth flow.

Note that, even in the fifth embodiment, FIG. 28 illustrates an example of a structure in which the flow path member 70 has the plurality of stacked flow path plates 378, but the number of flow path plates 378 is not limited. For example, as in the example illustrated in FIG. 24, the structure having one flow path plate 378 may be adopted.

Next, a sixth embodiment will be described. In the sixth embodiment, similar elements, members, and the like to those in the first to fifth embodiments are given the same reference numerals to those in the first embodiment, and detailed description thereof will be omitted.

Figure 29:
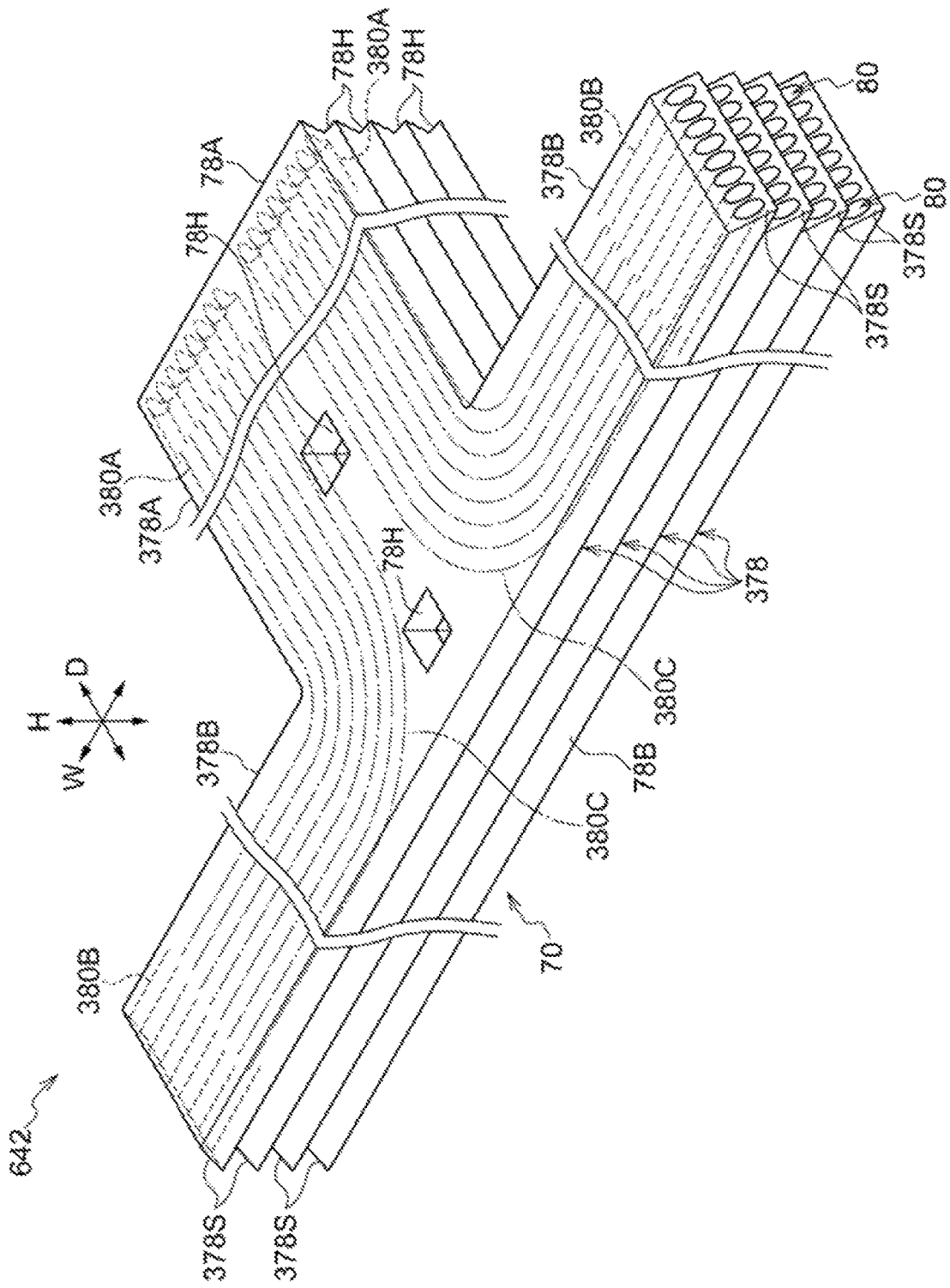
FIG. 29 is a perspective view illustrating a flow path member in a cooling device of a sixth embodiment.
Figure 30:
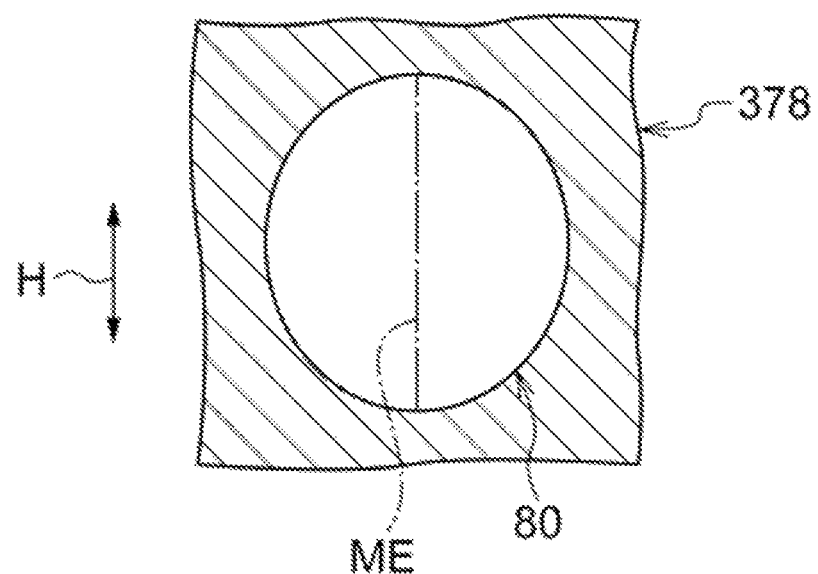
FIG. 30 is a cross-sectional view of a vicinity of a flow path of the flow path member in the cooling device of the sixth embodiment.

In a cooling device 642 of the sixth embodiment, as illustrated in FIG. 29, the cross-sectional shape of a flow path 80 is elliptical. In the example illustrated in detail in FIG. 30, in the elliptical flow path 80, a direction of an elliptical long axis ME coincides with a thickness direction (arrow H direction) of a flow path plate 378. Furthermore, the cross-sectional area of the flow path 80 is set such that a sufficient amount of a liquid-phase refrigerant RF can be transported from a condensing part 72 to an evaporating part 62 by the liquid-phase refrigerant RF, as in the first to fifth embodiments.

In the sixth embodiment, since the cross-sectional shape of the flow path 80 is elliptical in this way, a pressure loss when the fluid flows through the flow path 80 is reduced, as compared with the structure in which the shape of the flow path 80 is rectangular. Therefore, a decrease in flow speed when the liquid-phase refrigerant RF flows in the flow path 80 can be suppressed, and the refrigerant RF can be transported to the evaporating part 62 by a smooth flow.

Note that, to reduce the pressure loss when the fluid flows through the flow path 80 as compared with a rectangular cross-sectional shape in this way, the cross-sectional shape of the flow path 80 is not limited to the above-described elliptical but may be circular (perfect circle shape) or oval.

In the sixth embodiment, FIG. 29 illustrates an example in which a flow path member 70 has a structure having a plurality of stacked flow path plates 378. However, for example, as in the example illustrated in FIG. 24, the flow path member 70 may have a structure having one flow path plate 378. Furthermore, as the flow path 80, a shape in which a curved part 380C having a curved shape is not provided, and a first flow path part 380A and a second flow path part 380B are bent by a curved part having a bent shape and are continuous (see FIGS. 24 and 27).

Next, a seventh embodiment will be described. In the seventh embodiment, similar elements, members, and the like to those in the first to sixth embodiments are given the same reference numerals to those in the first embodiment, and detailed description thereof will be omitted.

Figure 31:
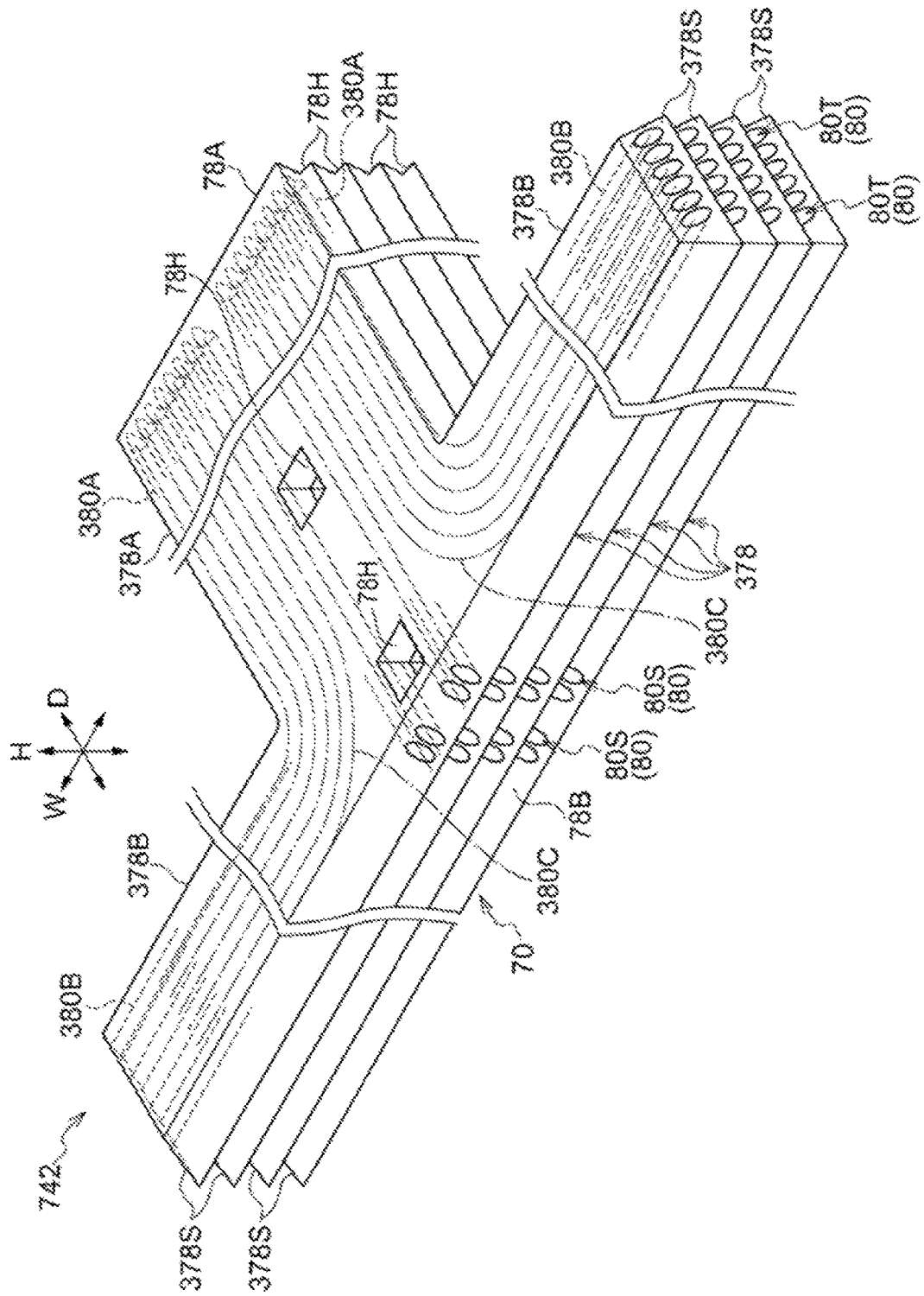
FIG. 31 is a perspective view illustrating a flow path member in a cooling device of a seventh embodiment.

A cooling device 742 of the seventh embodiment has, as illustrated in FIG. 31, two types of flow paths 80S and 80T as a flow path 80 formed in a flow path plate 378.

The flow path 80S is a linear flow path that is continuous from one end surface 78A side to the another end surface 78B side of the flow path plate 378. In contrast, the flow path 80T is a flow path having a shape extending from the one end surface 78A side to the another end surface 78B side of the flow path plate 378, but curved by a curved part 380C in the middle and continues to a side surface 378S.

Note that, in the example illustrated in FIG. 31, the curved part 380C of the flow path 80T has a curved shape, but may have a bent shape as illustrated in FIGS. 24 and 27, for example.

In the seventh embodiment, each flow path plate 378 has a structure having two types of flow paths: the flow path 80S opened to the another end surface 78B and the flow path 80T opened to the side surface 378S. Therefore, in the seventh embodiment, when an electronic device 32 (see FIG. 25) is used in a width direction matching a horizontal direction, a liquid-phase refrigerant RF can be introduced from a condensing part 72 into the flow path 80S or the flow path 80T and transported to an evaporating part 62. In particular, in a case of using the electronic device 32 in a thickness direction (arrow H direction) matching a gravity direction, the refrigerant RF is introduced into the flow path 80 not only from the another end surface 78B but also from the side surface 378S and transported to the evaporating part 62, thereby enhancing transport efficiency. Moreover, even in a case of using the electronic device 32 in the width direction matching a vertical direction (see FIG. 26), the liquid-phase refrigerant RF can be introduced from the condensing part 72 into the flow path 80 or the flow path 80 and transported to the evaporating part 62. That is, in the seventh embodiment, it is not necessary to use the cooling device 742 properly in these two directions, and a highly versatile cooling device can be obtained.

Note that, in the seventh embodiment, FIG. 31 illustrates an example in which a flow path member 70 has a structure having a plurality of stacked flow path plates 378. However, for example, as in the example illustrated in FIG. 24, the flow path member 70 may have a structure having one flow path plate 378. Furthermore, the cross-sectional shape of the flow path 80S and the flow path 80T is not limited to elliptical, and may be rectangular, for example, as in the examples illustrated in FIGS. 21, 24, and the like.

Next, an eighth embodiment will be described. In the eighth embodiment, similar elements, members, and the like to those in the first to seventh embodiments are given the same reference numerals to those in the first embodiment, and detailed description thereof will be omitted.

Figure 32:
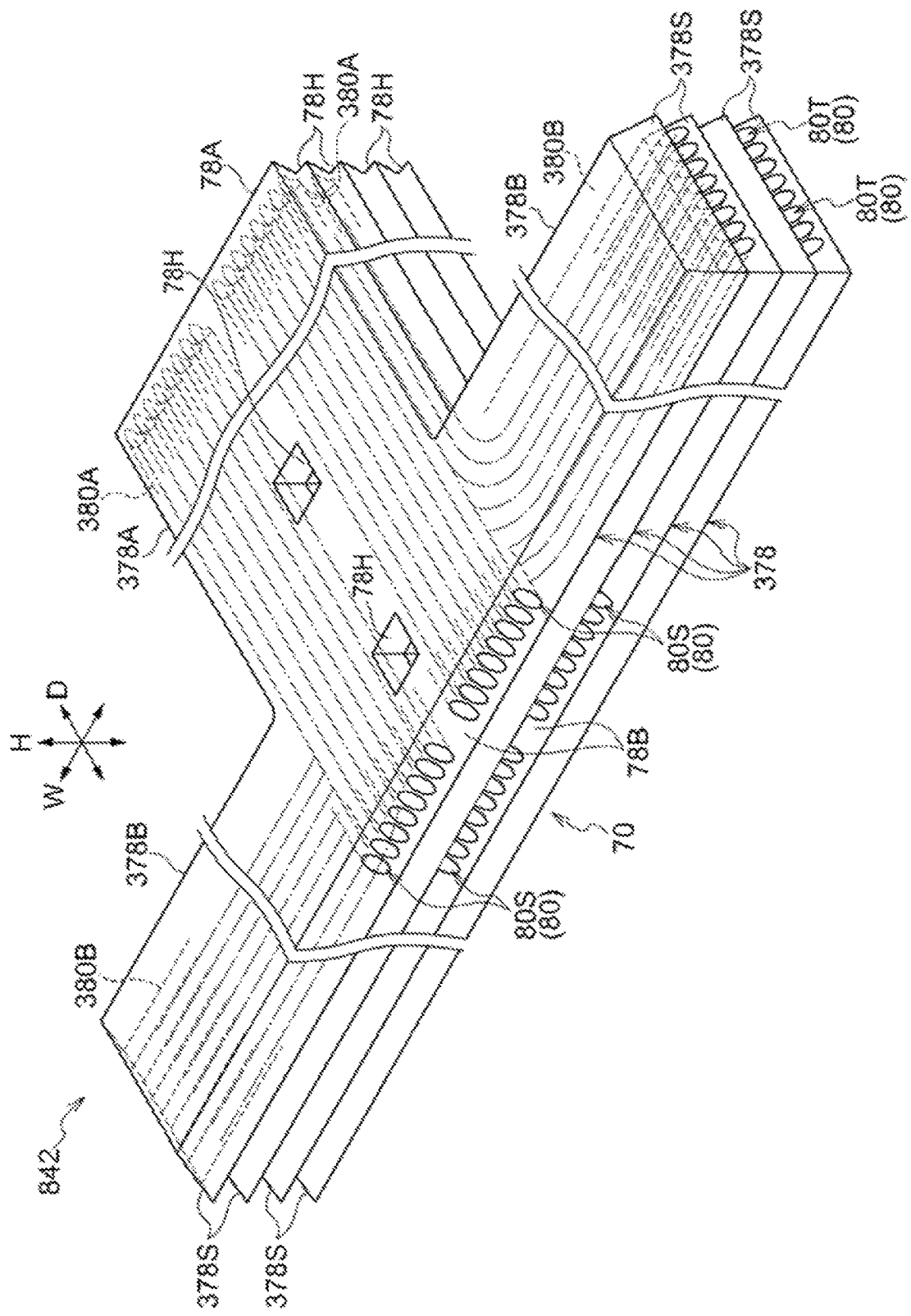
FIG. 32 is a perspective view illustrating a flow path member in a cooling device of an eighth embodiment.

As illustrated in FIG. 32, a cooling device 842 of the eighth embodiment has four stacked flow path plates 378. In FIG. 32, these four flow path plates 378 are distinguished as a first layer, a second layer, a third layer, and a fourth layer in order from an upper side.

In the flow path plate 378 as the first layer and the flow path plate 378 as the third layer, a linear flow path 80S continuous from one end surface 78A side to the another end surface 78B side is formed in a first part 378A. In contrast, in the flow path plate 378 as the second layer and the flow path plate 378 as the fourth layer, a flow path 80T having a shape extending from the one end surface 78A side to the another end surface 78B side, but curved by a curved part 380C in the middle and continues to a side surface 378S is formed.

In the eighth embodiment, when a flow path member 70 having the plurality of flow path plates 378 is viewed as a whole, the flow path member 70 has a structure having two types of flow paths 80: the flow path 80S opened to the another end surface 78B and the flow path 80T opened to the side surface 378S. Therefore, even in the eighth embodiment, a liquid-phase refrigerant RF can be introduced from a condensing part 72 to the flow paths and transported to an evaporating part 62 in both a case of using the electronic device 32 (see FIG. 25) in a horizontal direction and a case of using the electronic device 32 in a vertical direction. In these cases, it is not necessary to use the cooling device properly in these two directions, and a highly versatile cooling device can be obtained.

Note that, in the eighth embodiment, FIG. 32 illustrates a structure in which the flow path 80S is formed in the flow path plate 378 as the first layer and the flow path plate 378 as the third layer, and the flow path 80T is formed in the flow path plate 378 as the second layer and the flow path plate 378 as the fourth layer are formed. However, the types of the flow paths formed in the respective flow path plates 378 are not limited as long as a structure having two types of flow paths: a flow path opening to the another end surface 78B and a flow path opening to the side surface 378S is realized in the flow path member 70 as a whole.

In the eighth embodiment, since each flow path plate 378 is simply formed with either the linear flow path 80S or the curved flow path 80T with the curved part 380C, formation of the flow path in each flow path plate 378 is easy.

Note that the cross-sectional shape of the flow path 80S and the flow path 80T is not limited to elliptical or circular, and may be rectangular, for example, as in the examples illustrated in FIG. 24 and the like.

Next, a ninth embodiment will be described. In the ninth embodiment, similar elements, members, and the like to those in the first to eighth embodiments are given the same reference numerals to those in the first embodiment, and detailed description thereof will be omitted.

Figure 33:
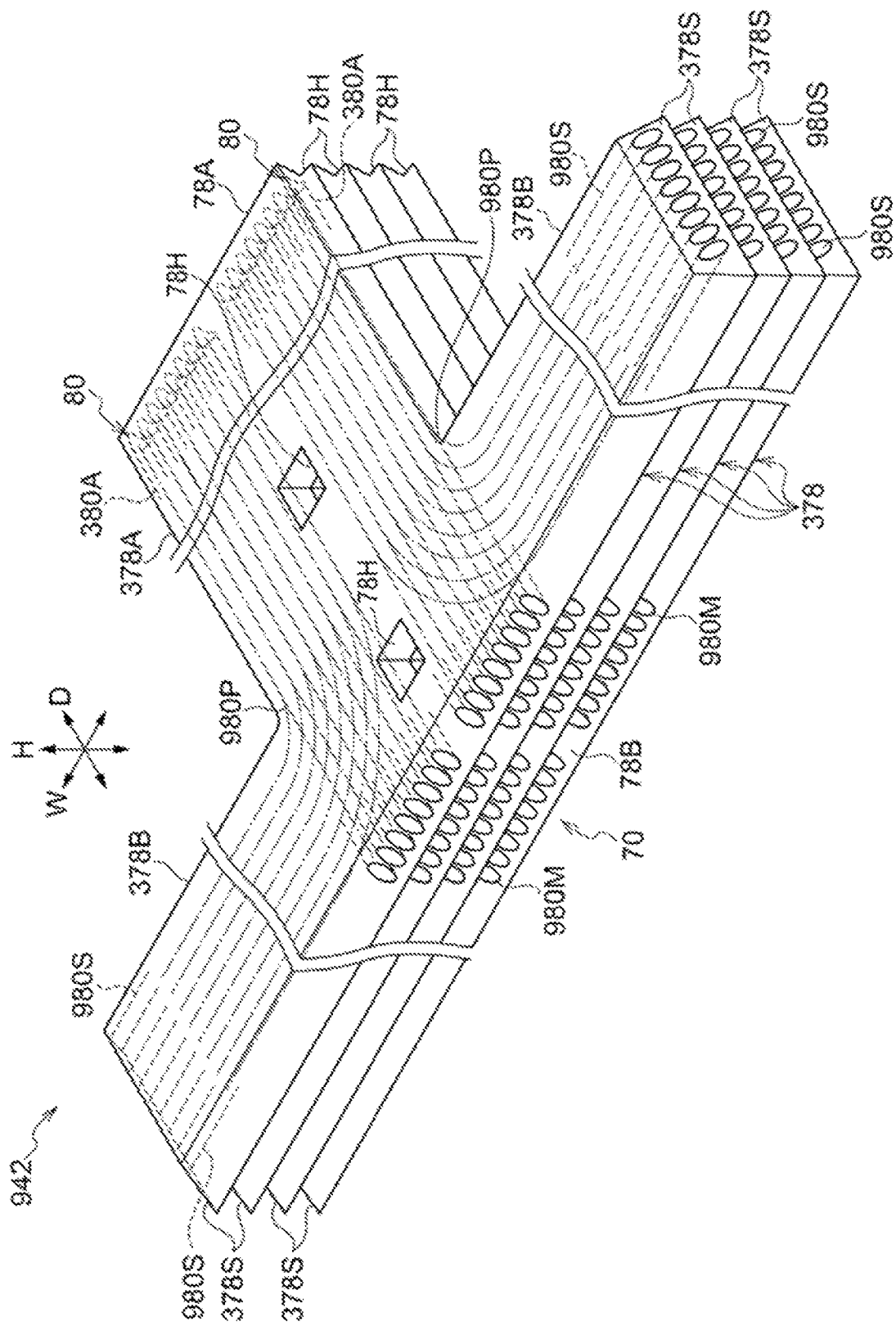
FIG. 33 is a perspective view illustrating a flow path member in a cooling device of a ninth embodiment.
Figure 34:
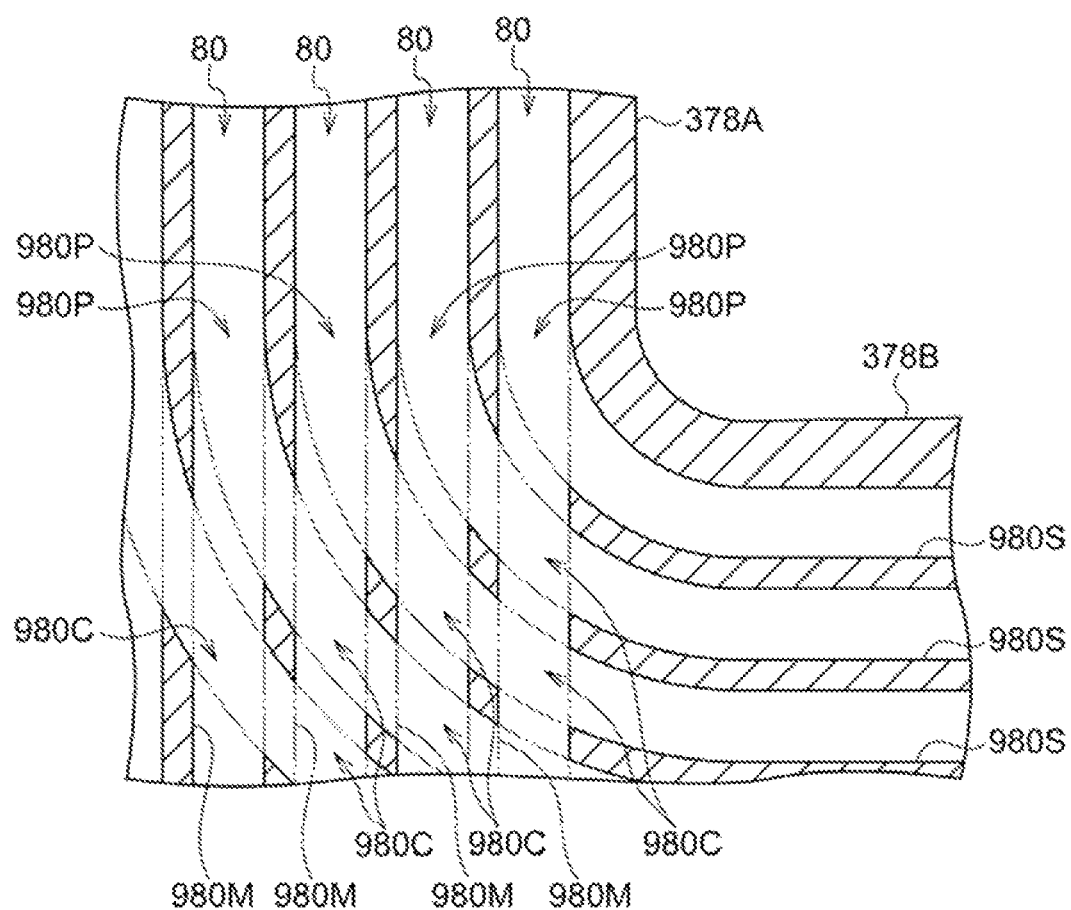
FIG. 34 is a cross-sectional view of a vicinity of a branch part of a flow path of the flow path member in the cooling device of the ninth embodiment.

In a cooling device 942 of the ninth embodiment, as illustrated in FIGS. 33 and 34, a flow path 80 formed in each flow path plate 378 has a main stream part 980M and a tributary part 980S. The main stream part 980M is a linear flow path part that is continuous from one end surface 78A to the another end surface 78B. The tributary part 980S is a flow path part that branches from the main stream part 980M by a branch part 980P and opens to a side surface 378S.

As illustrated in FIG. 34, the plurality of flow paths 80 has a structure in which the main stream part 980M and the tributary part 980S intersect at an intersection part 980C.

As described above, in the ninth embodiment, since each of the flow paths 80 is branched into the main stream part 980M and the tributary part 980S, the structure having both the first flow path part and the second flow path part can be realized in each flow path 80. Then, a cross-sectional area of the flow path 80 can be partially widely secured while maintaining an inner dimension that causes surface tension to act on a liquid-phase refrigerant RF.

Furthermore, since the flow path 80 is branched by the branch part 980P on a condensing part 72 side, the shape of the flow path having two openings formed in the condensing part 72 side can be easily obtained.

Furthermore, since the main stream part 980M and the tributary part 980S intersect at the intersection part 980C, various patterns are generated as the flow of the liquid-phase refrigerant RF from the another end surface 78B side or the side surface 378S side to the one end surface 78A side. Thereby, the structure in which the liquid-phase refrigerant RF is efficiently transported from the another end surface 78B side and the side surface 378S side to the one end surface 78A side can be realized, and cooling performance of the cooling device can be improved.

Next, a tenth embodiment will be described. In the tenth embodiment, similar elements, members, and the like to those in the first to ninth embodiments are given the same reference numerals to those in the first embodiment, and detailed description thereof will be omitted.

Figure 35:
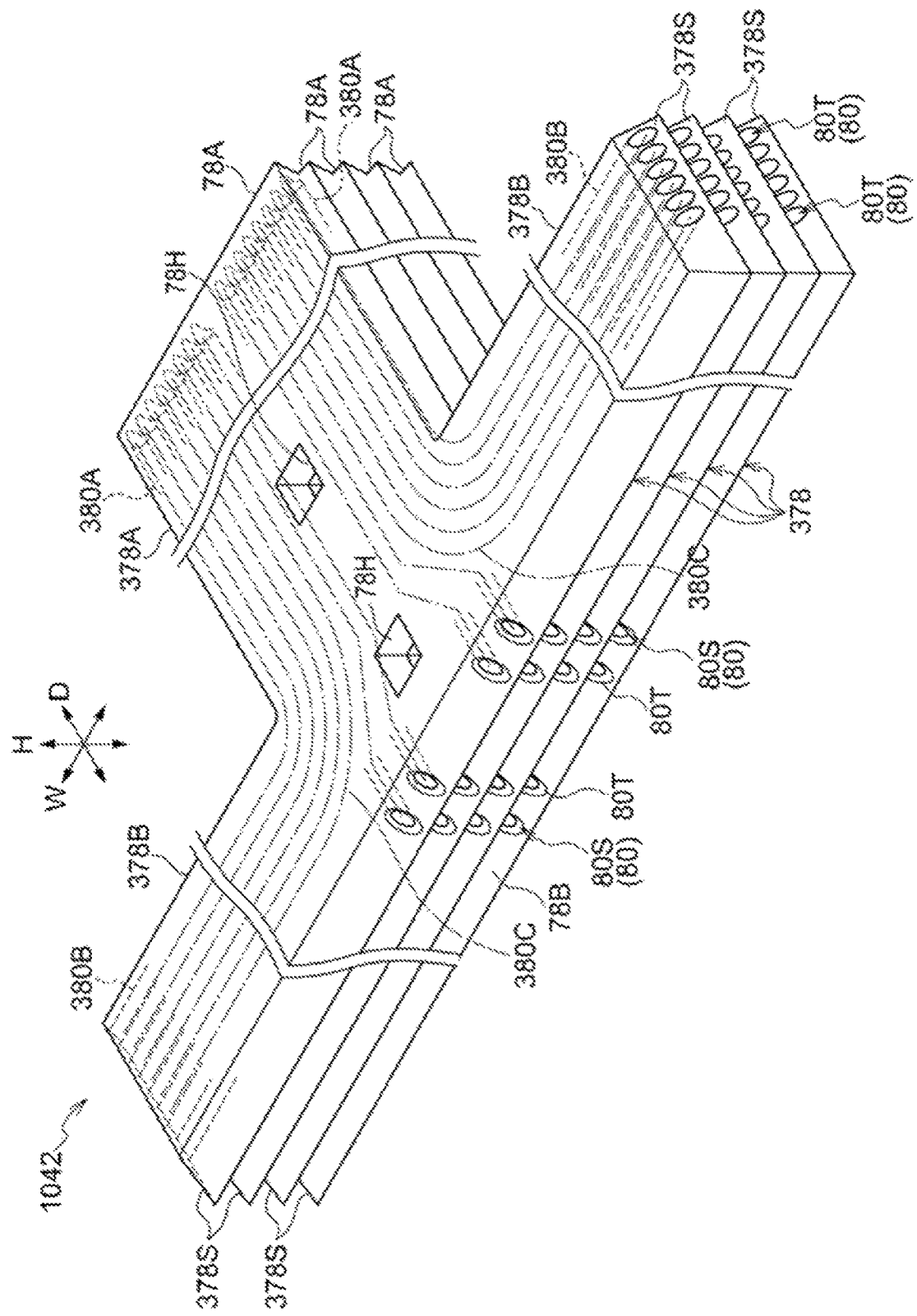
FIG. 35 is a perspective view illustrating a flow path member in a cooling device of a tenth embodiment.

In a cooling device 1042 of the tenth embodiment, as illustrated in FIG. 35, a tapered part 80T in which a cross-sectional area of a flow path 80S gradually increases toward the another end surface 78B is formed in an opening part in the another end surface 78B side of the flow path 80S.

Therefore, in the tenth embodiment, a liquid-phase refrigerant RF easily flows into the flow path 80S from the another end surface 78B side. Thereby, the structure in which the liquid-phase refrigerant RF is efficiently transported from the another end surface 78B side to the one end surface 78A side can be realized, and cooling performance of the cooling device can be improved.

Next, an eleventh embodiment will be described. In the eleventh embodiment, similar elements, members, and the like to those in the first to tenth embodiments are given the same reference numerals to those in the first embodiment, and detailed description thereof will be omitted.

Figure 36:
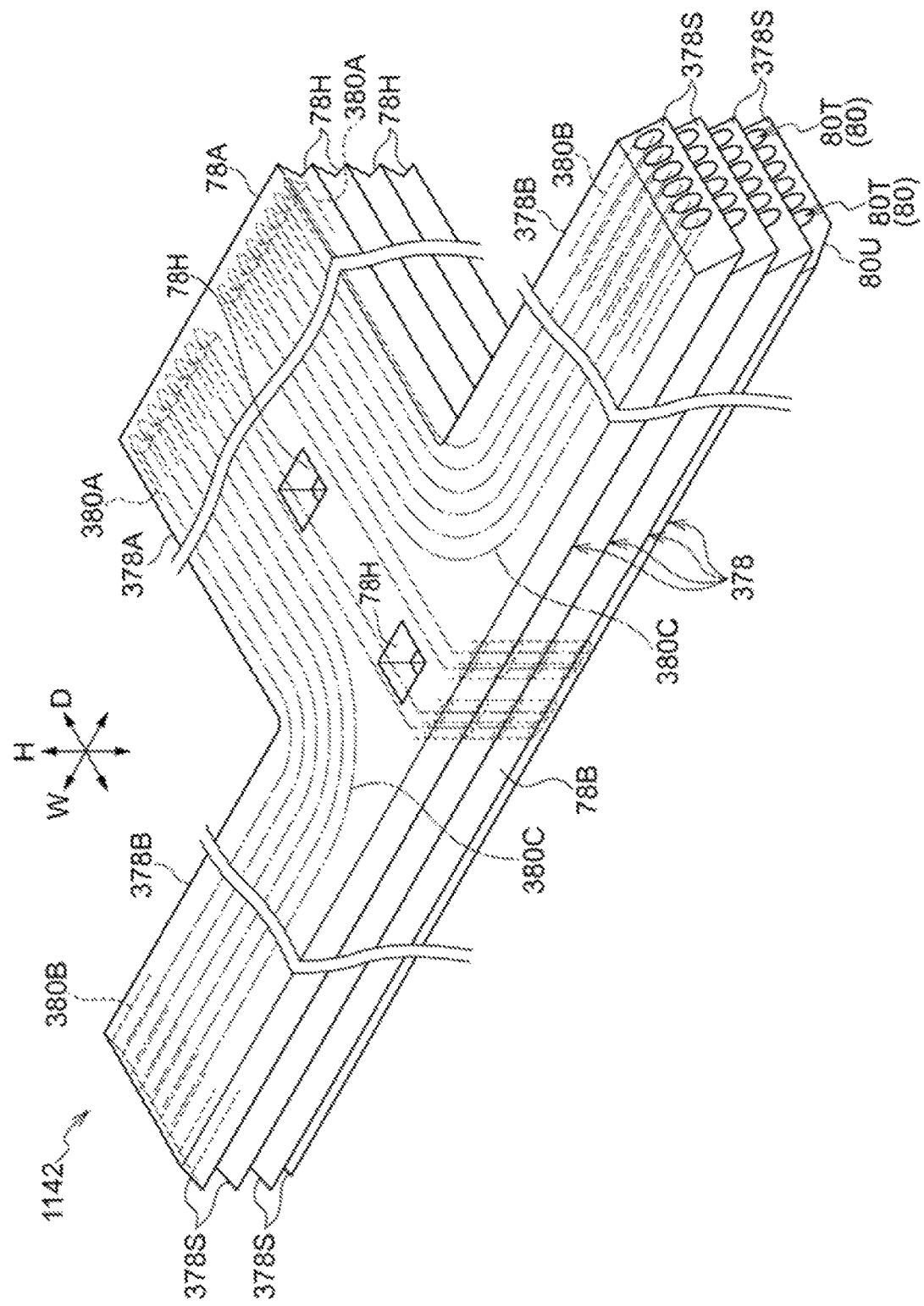
FIG. 36 is a perspective view illustrating a flow path member in a cooling device of an eleventh embodiment.
Figure 37:
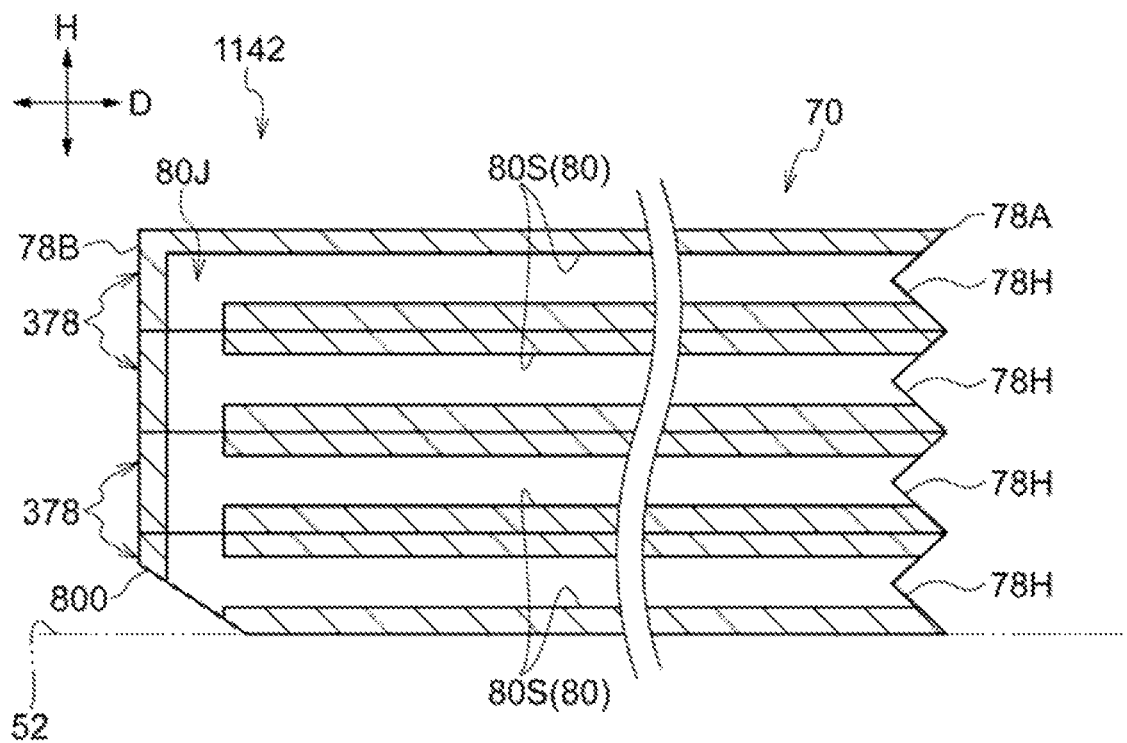
FIG. 37 is a cross-sectional view of a vicinity of a merging flow path of the flow path members in the cooling device of the eleventh embodiment.

In a cooling device 1142 of the eleventh embodiment, as illustrated in FIGS. 36 and 37, flow paths 80S on the another end surface 78B side are merged by a merging flow path 803 extending in a thickness direction. More specifically, as illustrated in FIG. 37, the flow paths 80S are merged by the merging flow path 803 formed such that four flow path plates 378 become continuous in a thickness direction when a flow path member 70 is viewed in the thickness direction (arrow H direction).

The merging flow path 803 is opened to a lower side in FIG. 37, and an inclined surface 80U inclined with respect to a bottom plate 52 is formed in the opening part.

In the eleventh embodiment, since the opening of the flow path 80 is opened toward the bottom plate 52 in this way, the liquid-phase refrigerant RF accumulated in a bottom of a container 44 (in a vicinity of the bottom plate 52) can be caused to efficiently flow into the flow paths 80.

Next, a twelfth embodiment will be described. In the twelfth embodiment, similar elements, members, and the like to those in the first to eleventh embodiments are given the same reference numerals to those in the first embodiment, and detailed description thereof will be omitted.

Figure 38:
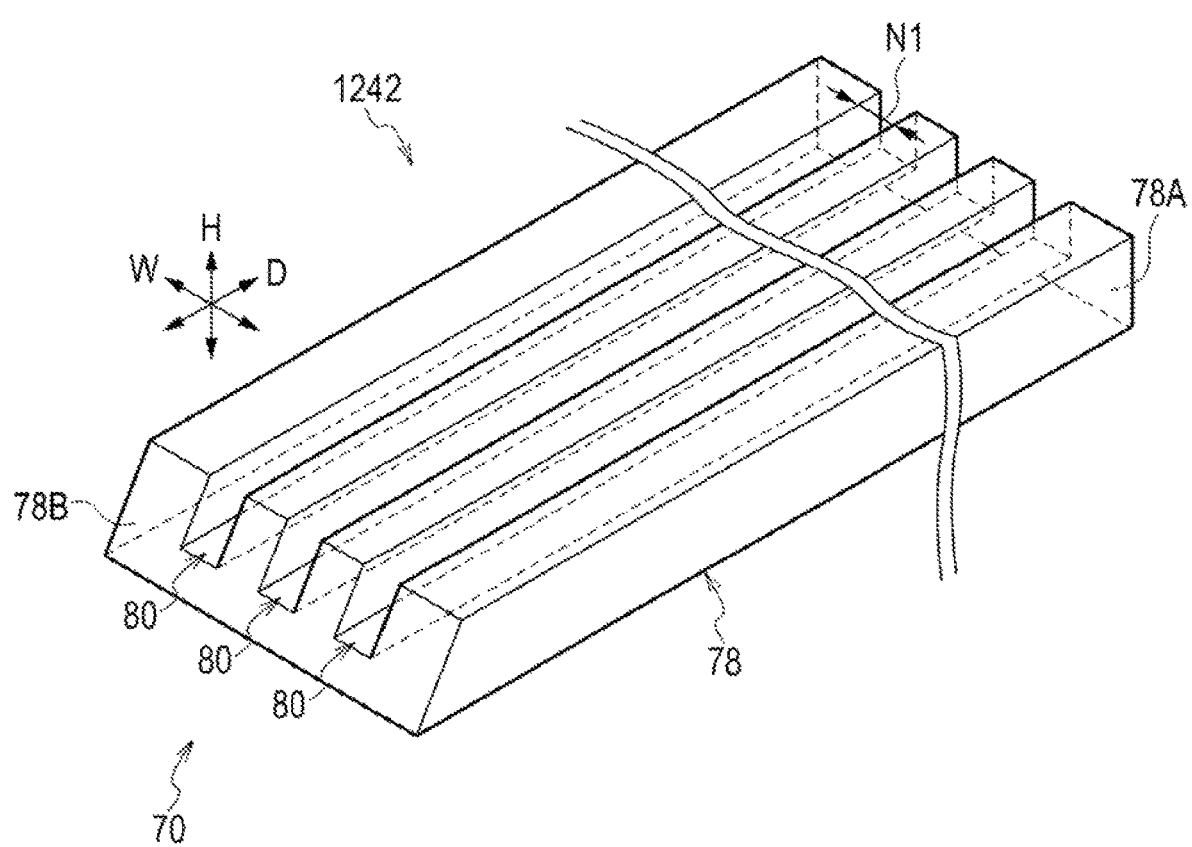
FIG. 38 is a perspective view illustrating a flow path member in a cooling device of a twelfth embodiment.

In a cooling device 1242 of the twelfth embodiment, as illustrated in FIG. 38, a flow path member 70 has one flow path plate 78.

In the twelfth embodiment, a flow path 80 formed in the flow path plate 78 has a groove shape partially opened to one surface (upper surface in the example of FIG. 38) in a plate thickness direction (arrow H direction) of the flow path plate 78. Each of the flow paths 80 is linearly continuous from one end surface 78A side to the another end surface 78B side of the flow path plate 78. In the twelfth embodiment, a cross-sectional shape of the flow path 80 as viewed in a longitudinal direction (arrow D direction) of the flow path plate 78 is rectangular.

Even in the twelfth embodiment, an inner dimension N1 (width) of the flow path 80 is set such that a liquid-phase refrigerant RF is transported from the another end surface 78B side to the one end surface 78A side by surface tension acting on the liquid-phase refrigerant RF. Moreover, the inner dimension N1 of the flow path 80 is wider than a groove width W1 (see FIG. 7) of a groove part 66 of an evaporating part 62.

Note that, in FIG. 38, three flow paths 80 are illustrated in the width direction (arrow D direction), but the number of flow paths 80 is not limited as long as the number is plural. For example, as illustrated in FIG. 11 as the first embodiment, about eight flow paths may be formed in the width direction. Furthermore, a through hole 78H (see FIG. 11) is formed in the flow path plate 78.

Even in the twelfth embodiment having the flow path 80 having such a shape, by arranging the plurality of flow paths 80 in the plate-shaped flow path plate 78 at high density, it is possible to efficiently transport the liquid-phase refrigerant RF from a condensing part 72 to an evaporating part 62 (see FIG. 5) and enhance cooling capacity as the cooling device.

Furthermore, since the groove-shaped flow path 80 partially opened upward is located in a moving region 74, the liquid-phase refrigerant RF (water droplets) condensed and dropped in the moving region 74 is directly housed in the flow path 80, as illustrated in FIG. 5. Thereby, the liquid-phase refrigerant RF can be efficiently transported to the evaporating part 62.

Note that, in contrast, for example, the shape of the flow path 80 as illustrated in FIG. 11 or the like is different from the groove-shaped flow path 80 in that the upper part of the flow path plate is closed. In such a flow path 80 having a closed cross-sectional shape, evaporation of the liquid-phase refrigerant RF transported by surface tension can be suppressed during transportation. Furthermore, even in a case where the cooling device is turned upside down, inadvertent leakage of the liquid-phase refrigerant RF from the flow path 80 due to gravity can be suppressed.

Next, a thirteenth embodiment will be described. In the thirteenth embodiment, similar elements, members, and the like to those in the first to twelfth embodiments are given the same reference numerals to those in the first embodiment, and detailed description thereof will be omitted.

Figure 39:
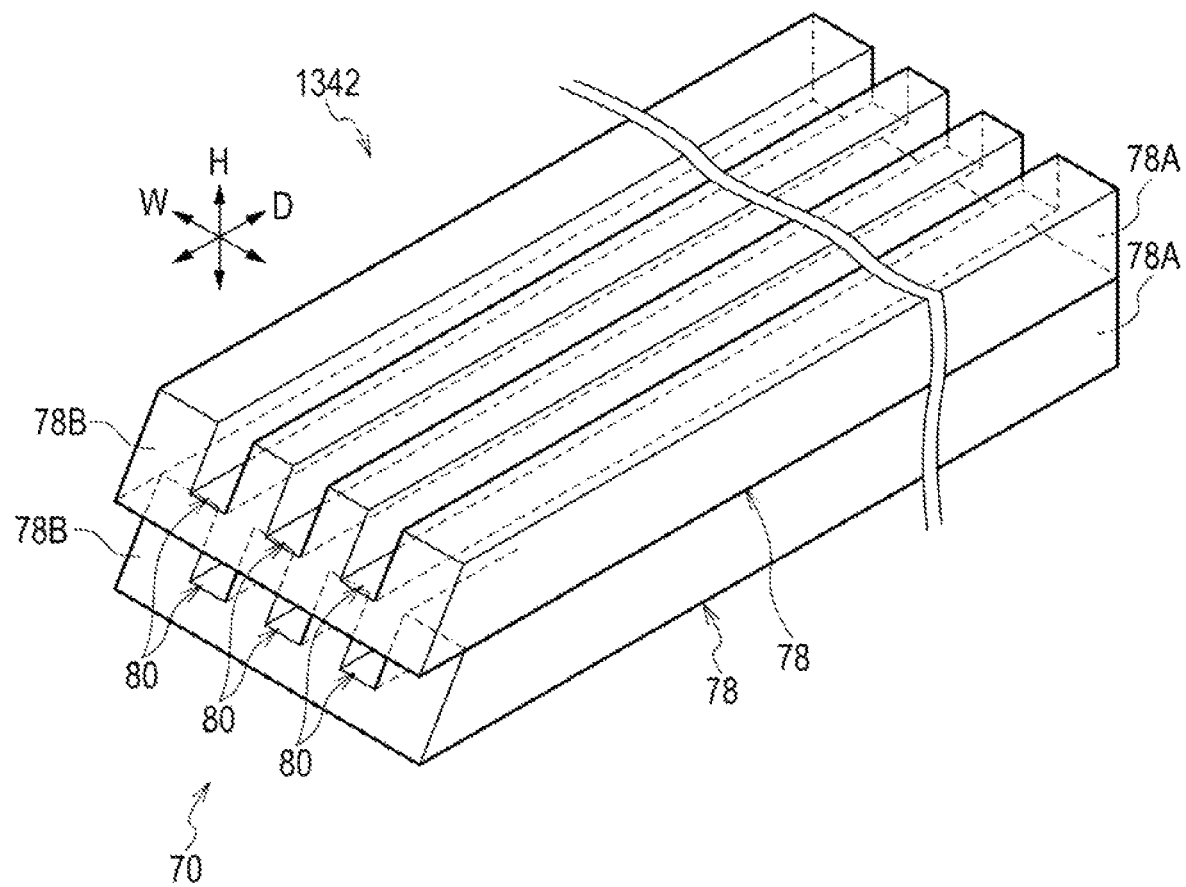
FIG. 39 is a perspective view illustrating a flow path member in a cooling device of a thirteenth embodiment.

In a cooling device 1342 of the thirteenth embodiment, as illustrated in FIG. 39, a flow path member 70 has a plurality of flow path plates 78 (two in the example illustrated in FIG. 39). The flow path plates 78 are stacked in same plate thickness direction, that is, in a direction in which flow paths 80 of the two flow path plates 78 are opened upward in FIG. 39. The flow path 80 of the lower flow path plate 78 has the open part substantially closed by the upper flow path plate 78, and is a flow path 80 having a closed cross-sectional shape.

Even in the thirteenth embodiment having the flow path member 70 having such a structure, it is possible to arrange the plurality of flow paths 80 at high density on the plate-shaped flow path plate 78. As a result, a liquid-phase refrigerant RF can be efficiently transported from a condensing part 72 to an evaporating part 62 (see FIG. 5), and cooling capacity as the cooling device can be enhanced.

Moreover, since the plurality of flow path plates 78 is stacked in the thickness direction, the number of flow paths 80 is larger than that of the structure having one flow path plate 78. Since the cross-sectional area of the flow path is widened as a whole of the flow path member 70, a larger amount of liquid-phase refrigerant RF can be transported from one end surface 78A side to the another end surface 78B side.

Next, a fourteenth embodiment will be described. In the fourteenth embodiment, similar elements, members, and the like to those in the first to thirteenth embodiments are given the same reference numerals to those in the first embodiment, and detailed description thereof will be omitted.

Figure 40:
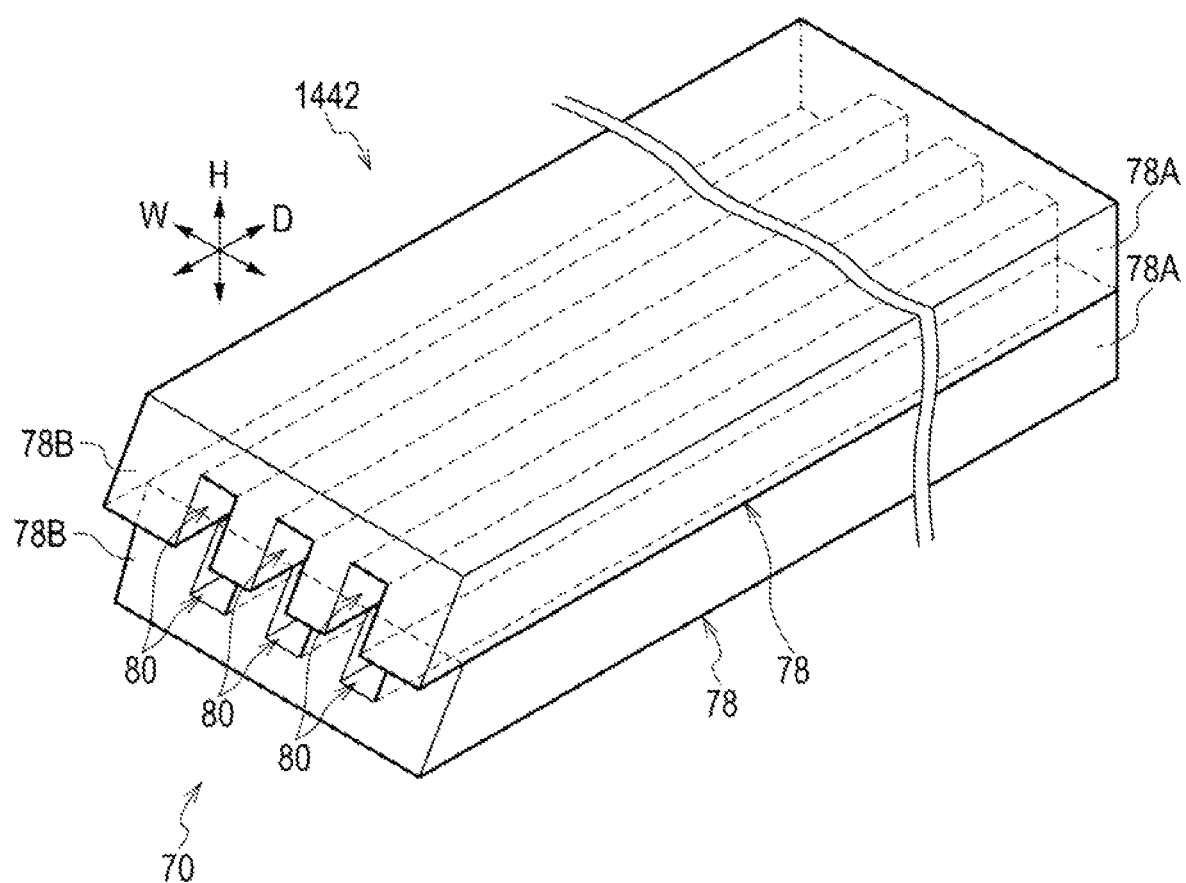
FIG. 40 is a perspective view illustrating a flow path member in a cooling device of a fourteenth embodiment.

In a cooling device 1442 of the fourteenth embodiment, as illustrated in FIG. 40, a flow path member 70 has two flow path plates 78. The two flow path plates 78 are stacked in opposite directions in a plate thickness direction, that is, in directions in which surfaces where the respective flow paths 80 are formed are in contact with each other in the two flow path plates 78. Therefore, the flow path 80 of the upper flow path plate 78 and the lower flow path plate 78 in FIG. 40 form a flow path having a closed cross-sectional shape as a whole, where the formed parts of the flow path 80 face each other.

Even in the fourteenth embodiment having the flow path member 70 having such a structure, it is possible to arrange the plurality of flow paths 80 at high density on the plate-shaped flow path plates 78. As a result, a liquid-phase refrigerant RF can be efficiently transported from a condensing part 72 to an evaporating part 62 (see FIG. 5), and cooling capacity as the cooling device can be enhanced.

Moreover, since the plurality of flow path plates 78 is stacked in the thickness direction, the number of flow paths 80 is larger than that of the structure having one flow path plate 78. Since the cross-sectional area of the flow path is widened as a whole of the flow path member 70, a larger amount of liquid-phase refrigerant RF can be transported from one end surface 78A side to the another end surface 78B side.

Then, since the formed parts of the flow paths 80 face each other in the flow path 80 of the upper flow path plate 78 and the lower flow path plate 78, the flow paths 80 having a large flow path cross-sectional area can be formed using the two flow path plates 78.

Next, a fifteenth embodiment will be described. In the fifteenth embodiment, similar elements, members, and the like to those in the first to fourteenth embodiments are given the same reference numerals to those in the first embodiment, and detailed description thereof will be omitted.

Figure 41:
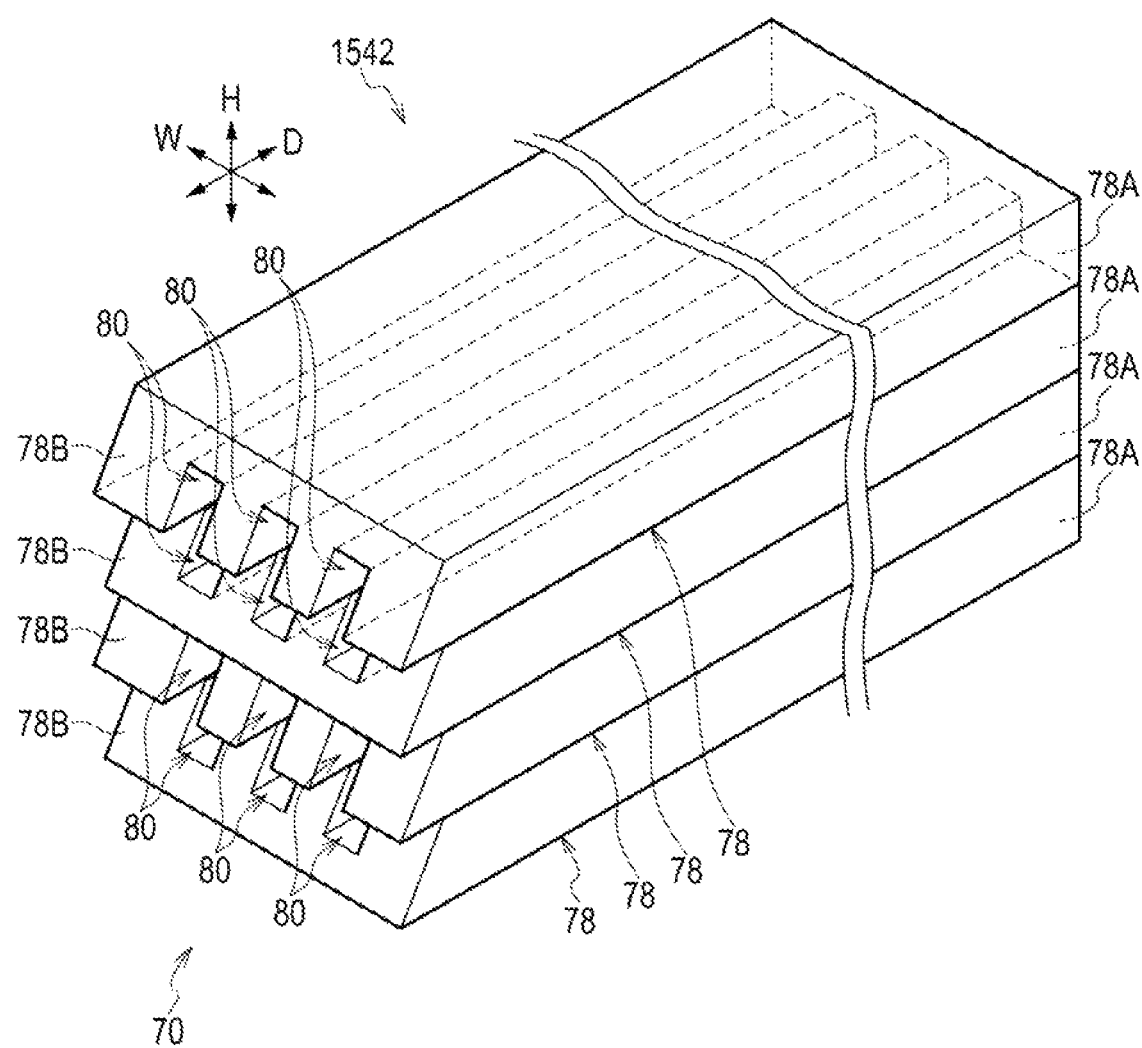
FIG. 41 is a perspective view illustrating a flow path member in a cooling device of a fifteenth embodiment.

As illustrated in FIG. 41, in a cooling device 1542 of the fifteenth embodiment, a flow path member 70 has four flow path plates 78. The flow path plate 78 as the first layer and the flow path plate 78 as the second layer from the top of FIG. 41, of the four flow path plates 78, are stacked in opposite directions in a plate thickness direction. Therefore, these two flow path plates 78 are stacked in a direction where opening parts of respective flow paths 80 face each other.

Similarly, the flow path plate 78 as the third layer and the flow path plate 78 as the fourth layer from the top of FIG. 41 are stacked in opposite directions in the plate thickness direction, that is, in the direction where the opening parts of the respective flow paths 80 face each other in these two flow path plates 78.

Even in the fifteenth embodiment having the flow path member 70 having such a structure, it is possible to arrange the plurality of flow paths 80 at high density on the plate-shaped flow path plates 78. As a result, a liquid-phase refrigerant RF can be efficiently transported from a condensing part 72 to an evaporating part 62 (see FIG. 5), and cooling capacity as the cooling device can be enhanced.

Moreover, since the plurality of flow path plates 78 is stacked in the thickness direction, the number of flow paths 80 is larger than that of the structure having one flow path plate 78. Since the cross-sectional area of the flow path is widened as a whole of the flow path member 70, a larger amount of liquid-phase refrigerant RF can be transported from one end surface 78A side to the another end surface 78B side.

Next, a sixteenth embodiment will be described. In the sixteenth embodiment, similar elements, members, and the like to those in the first to fifteenth embodiments are given the same reference numerals to those in the first embodiment, and detailed description thereof will be omitted.

Figure 42:
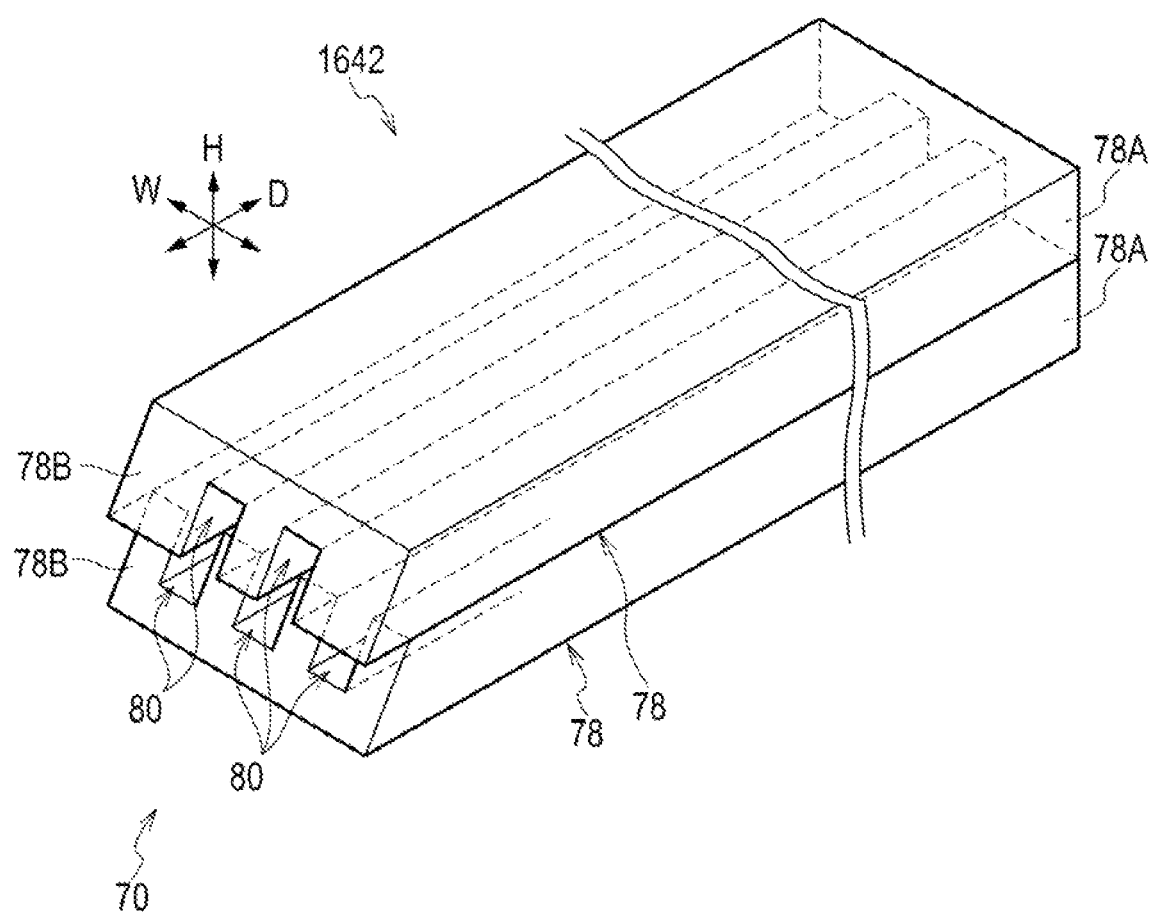
FIG. 42 is a perspective view illustrating a flow path member in a cooling device of a sixteenth embodiment.

As illustrated in FIG. 42, in a cooling device 1642 of the sixteenth embodiment, a flow path member 70 has two flow path plates 78. In FIG. 42, the upper (first layer) flow path plate 78 is formed with two flow paths 80 opened to a lower surface, and the lower (second layer) flow path plate 78 is formed with three flow paths 80 opened to an upper surface.

Positions of the flow paths 80 of the two flow path plates 78 are positions that do not overlap each other in an up-down direction in a plan view (viewed in the arrow H direction), and a formed part and a non-formed part of the flow paths 80 face each other in the upper and lower flow path plates 78. Therefore, the opening part of the flow path 80 of the upper flow path plate 78 is blocked by the lower flow path plate 78, and the opening part of the flow path 80 of the lower flow path plate 78 is blocked by the upper flow path plate 78.

Even in the sixteenth embodiment having the flow path member 70 having such a structure, it is possible to arrange the plurality of flow paths 80 at high density on the plate-shaped flow path plates 78. As a result, a liquid-phase refrigerant RF can be efficiently transported from a condensing part 72 to an evaporating part 62 (see FIG. 5), and cooling capacity as the cooling device can be enhanced.

Moreover, since the plurality of flow path plates 78 is stacked in the thickness direction, the number of flow paths 80 is larger than that of the structure having one flow path plate 78. Since the cross-sectional area of the flow path is widened as a whole of the flow path member 70, a larger amount of liquid-phase refrigerant RF can be transported from one end surface 78A side to the another end surface 78B side.

In the upper and lower flow path plates 78, the formed part and the non-formed part of the flow paths 80 face each other. Therefore, a wide cross-sectional area through which the liquid-phase refrigerant RF flows can be secured as the flow path member 70 as a whole without increasing the cross-sectional areas of the respective flow paths 80.

Next, a seventeenth embodiment will be described. In the seventeenth embodiment, similar elements, members, and the like to those in the first to sixteenth embodiments are given the same reference numerals to those in the first embodiment, and detailed description thereof will be omitted.

Figure 43:
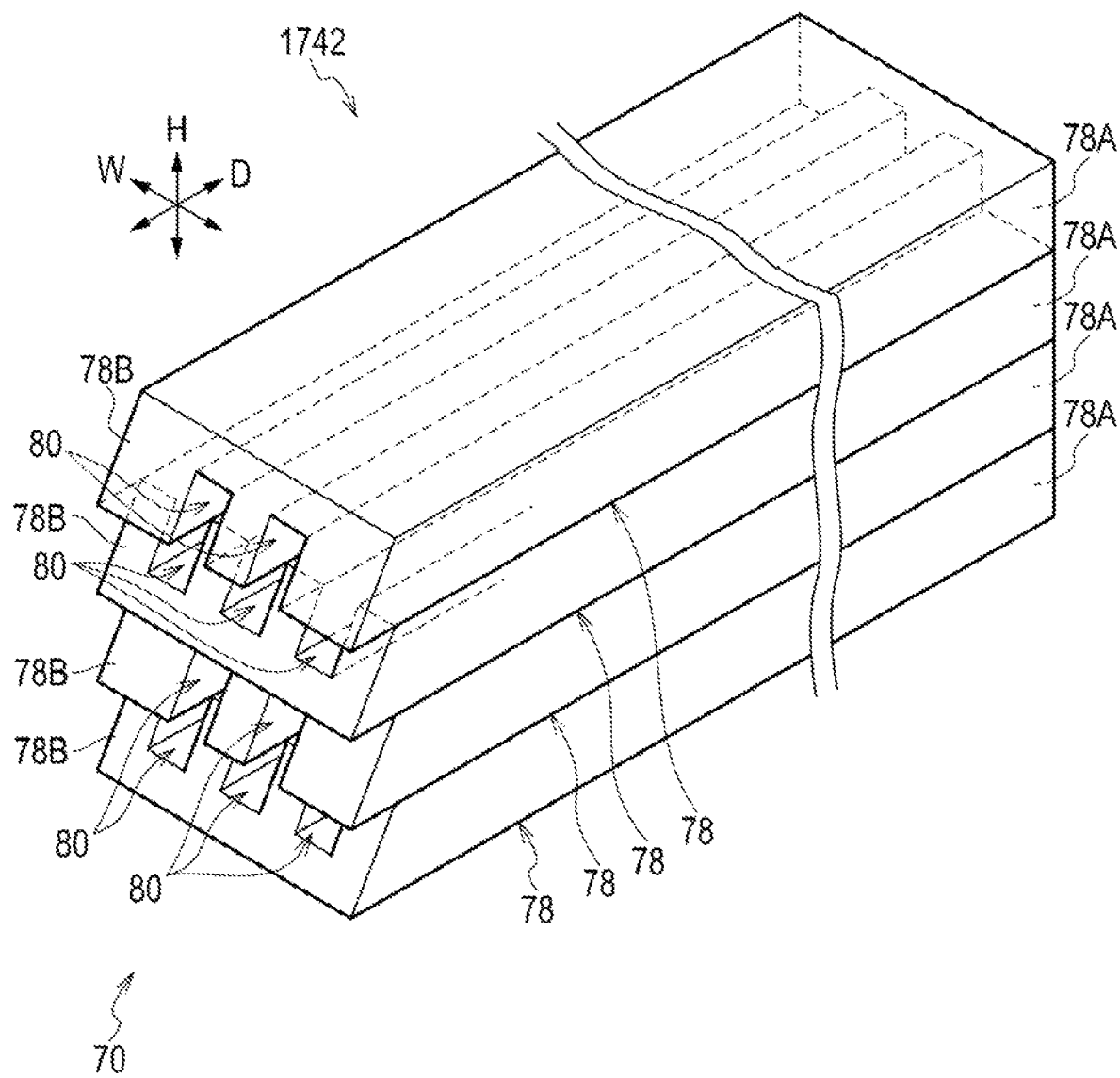
FIG. 43 is a perspective view illustrating a flow path member in a cooling device of a seventeenth embodiment.
Figure 44:
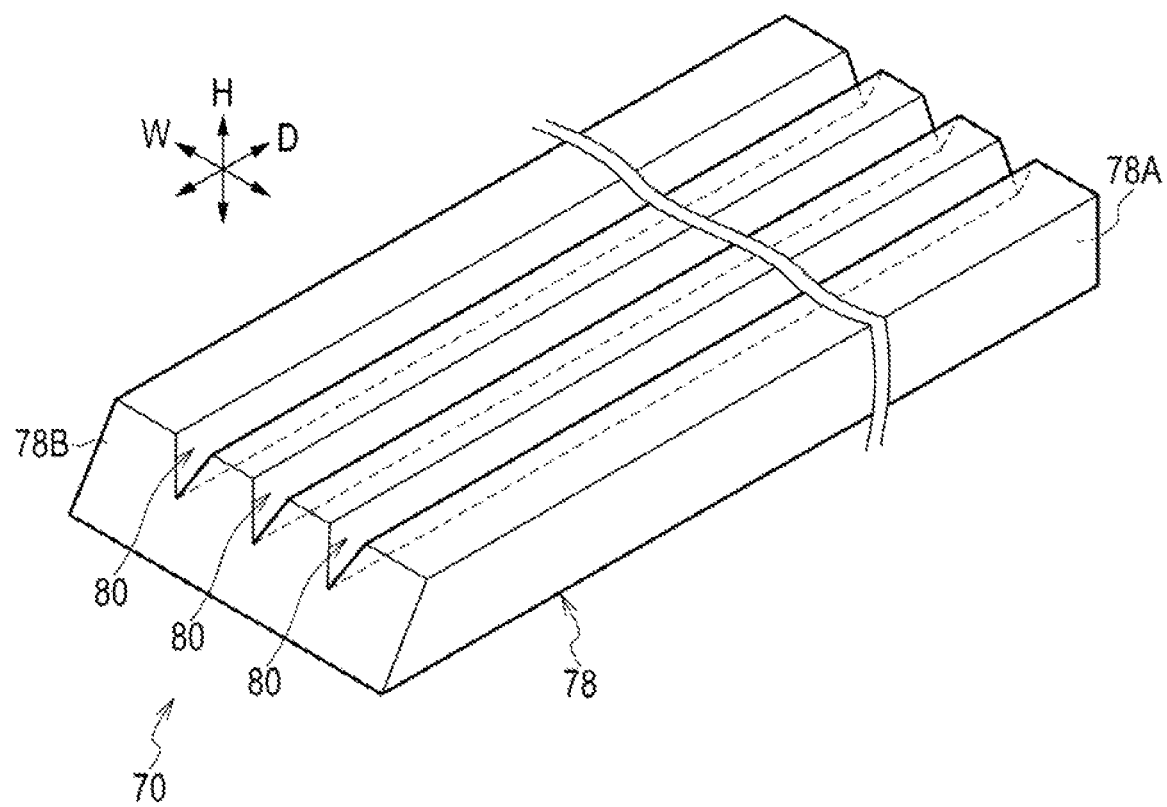
FIG. 44 is a perspective view illustrating an example of the flow path member in the cooling device of the disclosed technology.

In a cooling device 1742 of the seventeenth embodiment, as illustrated in FIG. 43, a flow path member 70 has four flow path plates 78. In FIG. 44, the flow path plate 78 as the first layer is formed with two flow paths 80 opened to a lower surface, and the flow path plate 78 as the second layer is formed with three flow paths 80 opened to an upper surface. Moreover, the flow path plate 78 as the third layer is formed with two flow paths 80 opened to a lower surface, and the flow path plate 78 as the fourth layer is formed with three flow paths 80 opened to an upper surface.

Then, the flow paths 80 are located at positions not overlapping in the up down direction in the flow path plate 78 as the first layer and the flow path plate 78 as the second layer. Therefore, the opening part of the flow path 80 of the flow path plate 78 as the first layer is blocked by the flow path plate 78 as the second layer, and the opening part of the flow path 80 of the flow path plate 78 as the second layer is blocked by the flow path plate 78 as the first layer. Similarly, the flow paths 80 are located at positions not overlapping in the up down direction in the flow path plate 78 as the third layer and the flow path plate 78 as the fourth layer. Therefore, the opening part of the flow path 80 of the flow path plate 78 as the third layer is blocked by the flow path plate 78 as the fourth layer, and the opening part of the flow path 80 of the flow path plate 78 as the fourth layer is blocked by the flow path plate 78 as the third layer.

Even in the seventeenth embodiment having the flow path member 70 having such a structure, it is possible to arrange the plurality of flow paths 80 at high density on the plate-shaped flow path plates 78. As a result, a liquid-phase refrigerant RF can be efficiently transported from a condensing part 72 to an evaporating part 62 (see FIG. 5), and cooling capacity as the cooling device can be enhanced.

Moreover, since the plurality of flow path plates 78 is stacked in the thickness direction, the number of flow paths 80 is larger than that of the structure having one flow path plate 78. Since the cross-sectional area of the flow path is widened as a whole of the flow path member 70, a larger amount of liquid-phase refrigerant RF can be transported from one end surface 78A side to the another end surface 78B side.

In the above-described twelfth to seventeenth embodiments, the cross-sectional shape of the flow path 80 opened to one surface of the flow path plate 78 is not limited to the rectangle illustrated in FIGS. 38 to 43.

Figure 45:
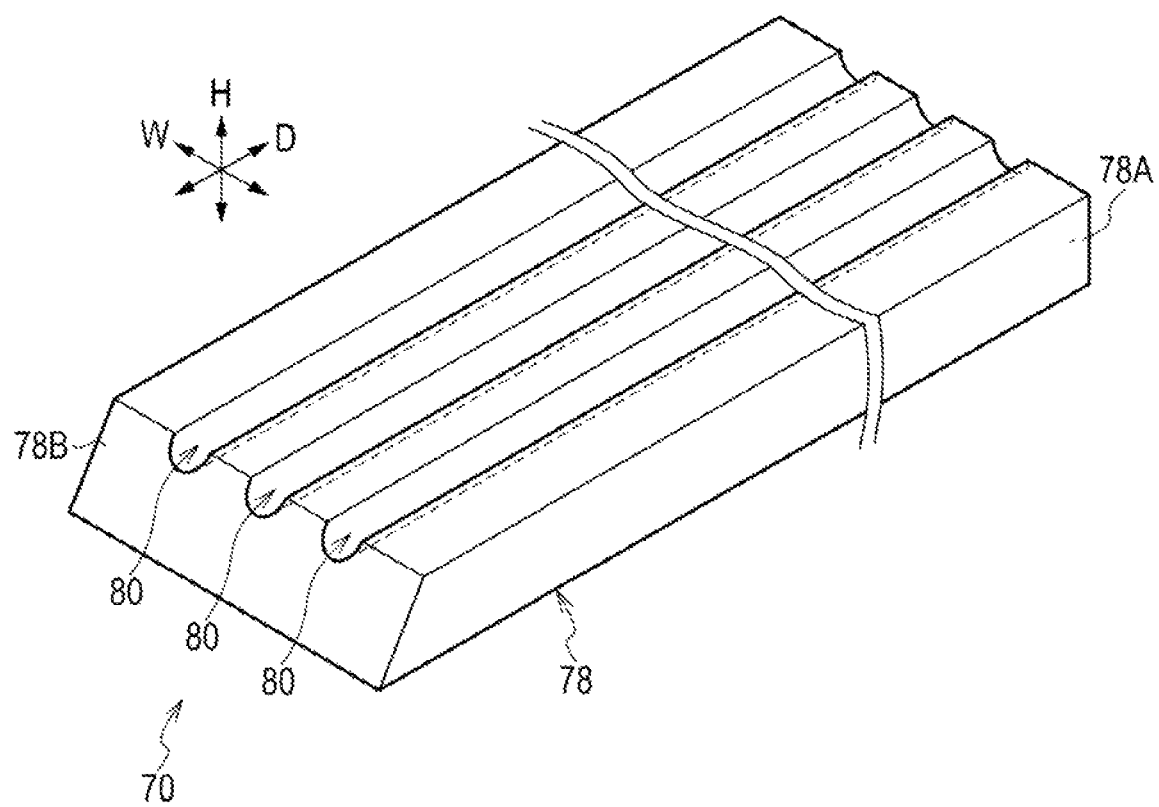
FIG. 45 is a perspective view illustrating an example of the flow path member in the cooling device of the disclosed technology.

For example, the cross-sectional shape may be a V shape (triangular shape) as illustrated in FIG. 44 or may be a curved shape (arc shape) as illustrated in FIG. 45.

Furthermore, in the above-described twelfth to seventeenth embodiments, a structure in which the flow path 80 is formed not only in one surface (upper surface) of the flow path plate 78 but also in the opposite surface (lower surface) can be adopted.

Figure 46:
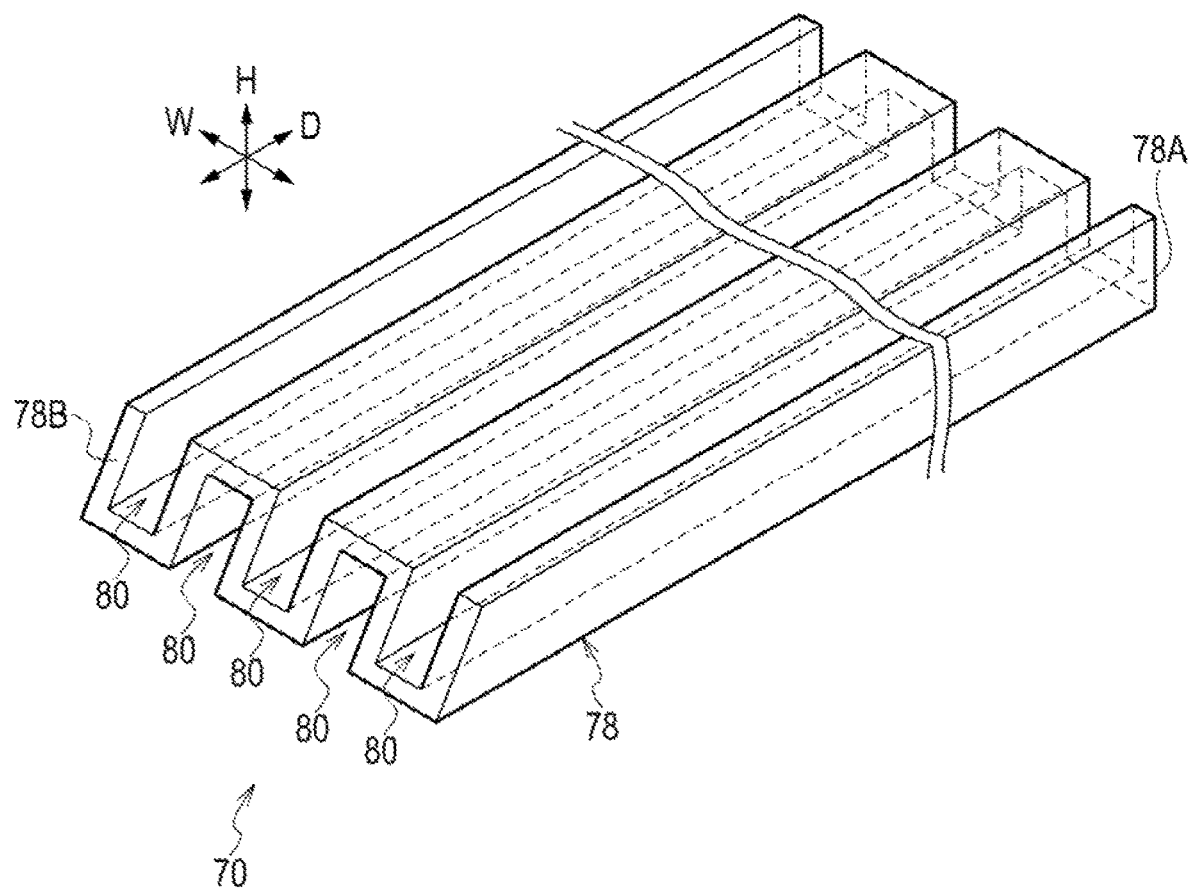
FIG. 46 is a perspective view illustrating an example of the flow path member in the cooling device of the disclosed technology.
Figure 47:
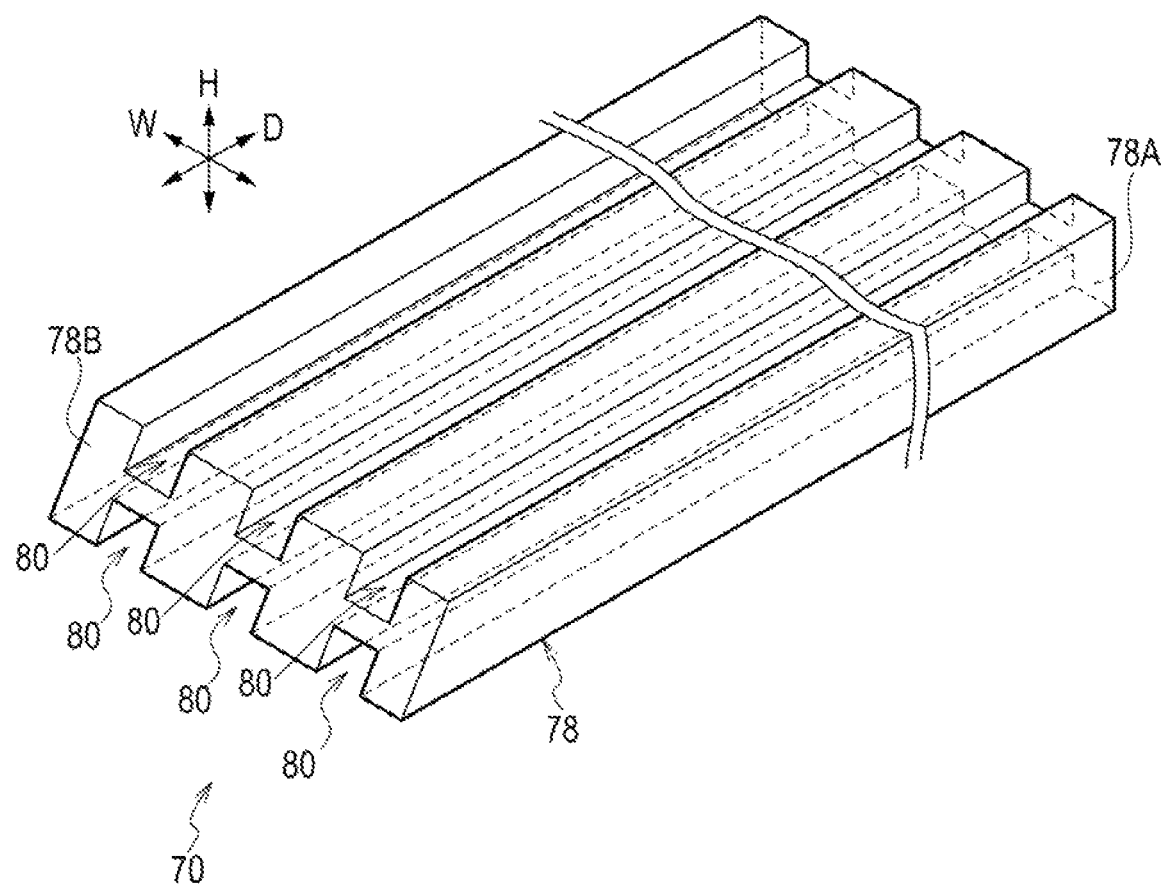
FIG. 47 is a perspective view illustrating an example of the flow path member in the cooling device of the disclosed technology.

For example, as illustrated in FIGS. 46 and 47, one flow path plate 78 may have a structure having a flow path 80 formed in the upper surface and a flow path 80 formed in the lower surface. In the structure illustrated in FIG. 46, the flow path 80 opened to the upper surface and the flow path 80 opened to the lower surface do not overlap when the flow path plate 78 is viewed in a plan view (viewed in the arrow H direction). In contrast, in the structure illustrated in FIG. 47, the flow path 80 opened to the upper surface and the flow path 80 opened to the lower surface overlap each other.

By forming the flow paths 80 in both sides in the plate thickness direction of the flow path plate 78 in this way, a structure having many flow paths 80 can be realized as compared with a structure having the flow paths 80 formed in only one side.

In the above-described twelfth to seventeenth embodiments, the structure of the flow path member is not limited to the structure having the flow path plate 78 that is a flat plate-shaped member. For example, a structure having a T-shaped flow path member (see FIG. 24 and the like) 378 in a plan view may be adopted instead of the flow path plate 78.

Moreover, the structure of the flow path plate is not limited to the structure having the flow paths or grooves formed in the flat plate-shaped member.

Figure 48:
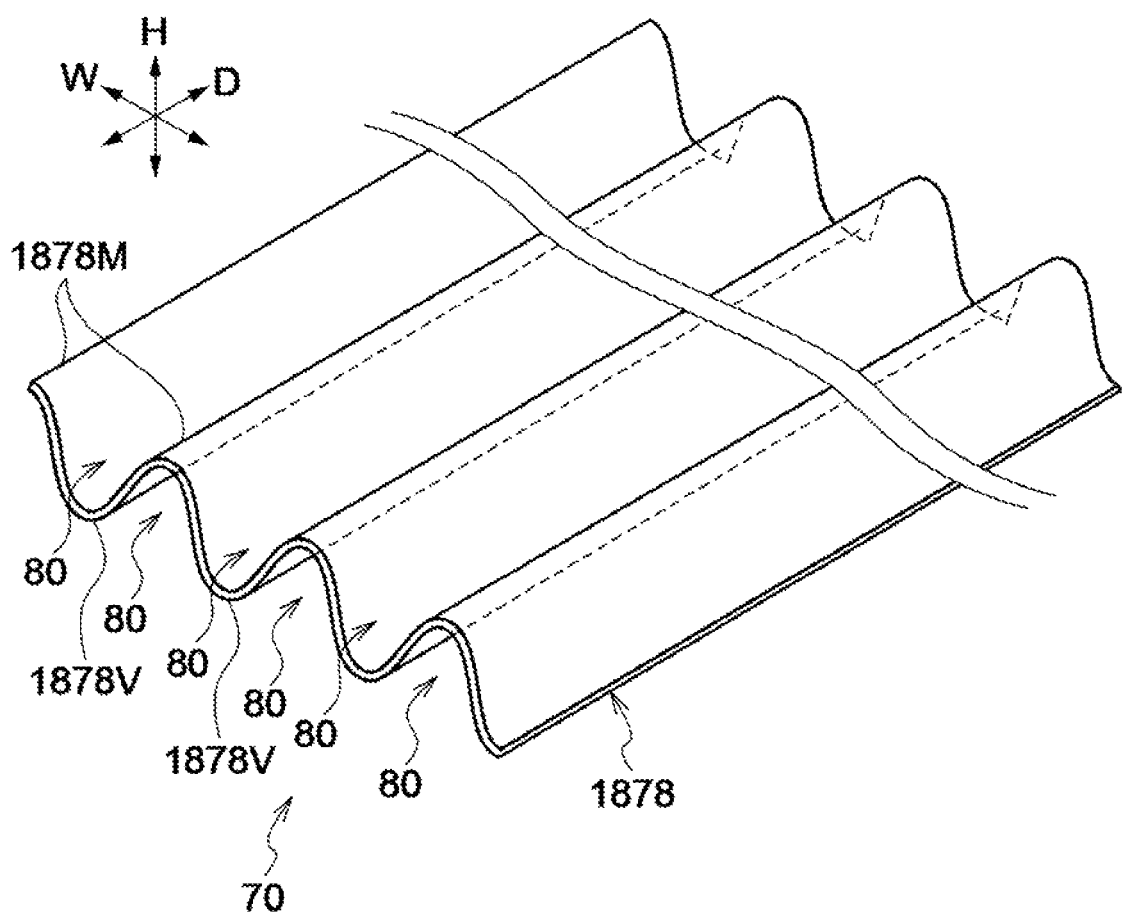
FIG. 48 is a perspective view illustrating an example of the flow path member in the cooling device of the disclosed technology.

For example, in the flow path member 70 illustrated in FIG. 48, a corrugated plate 1878 having a wavy shape in the width direction (arrow W direction) when viewed in the longitudinal direction (arrow D direction) is used as the flow path member 70. In such a corrugated plate 1878, a flow path 80 opened to an upper surface side is present between mountain parts 1878M that are adjacent each other. Furthermore, a flow path 80 opened to a lower surface side is present between valley parts 1878V that are adjacent each other.

Figure 49:
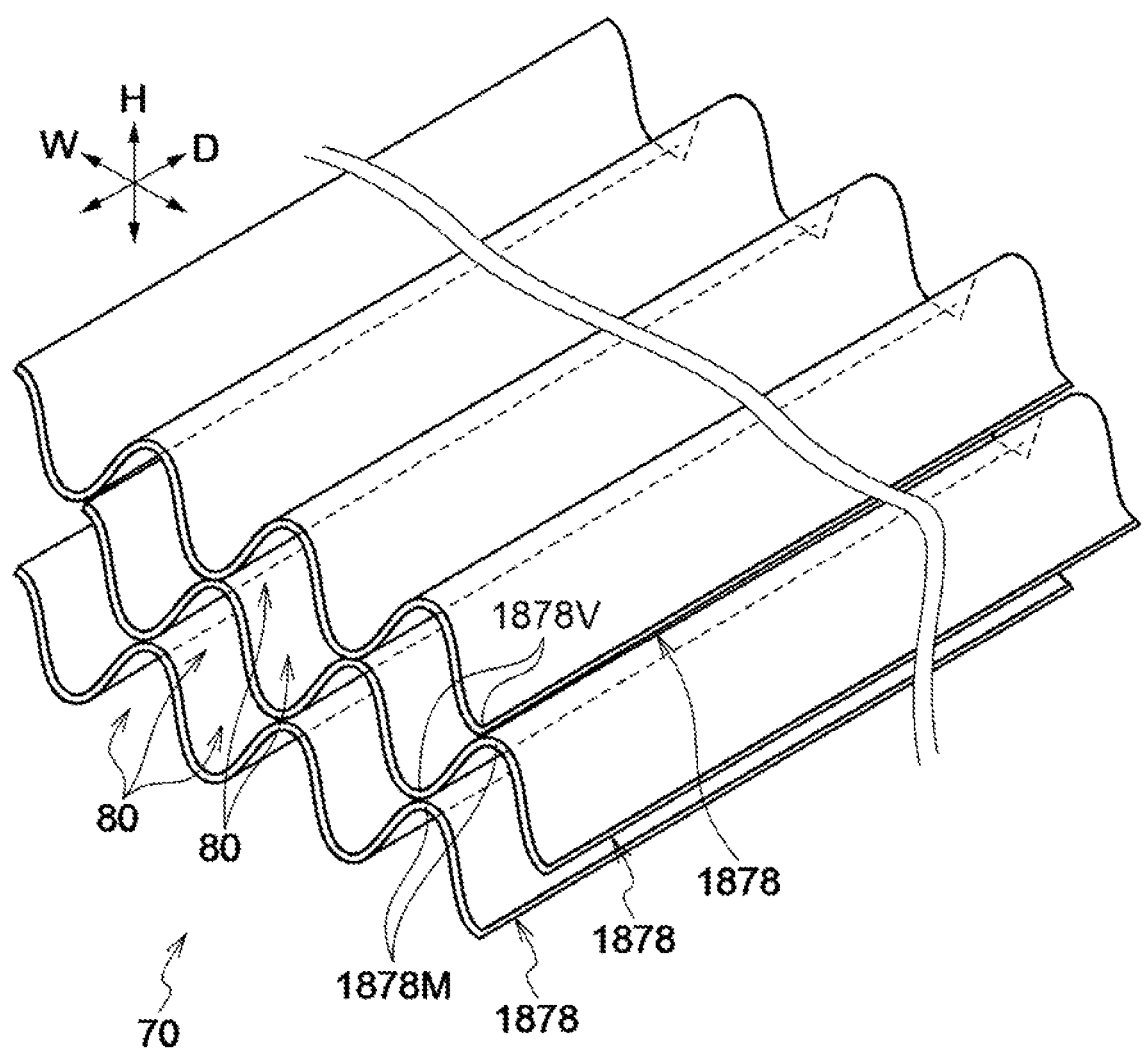
FIG. 49 is a perspective view illustrating an example of the flow path member in the cooling device of the disclosed technology.

In the flow path member 70 illustrated in FIG. 49, a plurality of corrugated plates 1878 (three in the illustrated example) are stacked in the thickness direction (arrow H direction). The three corrugated plates 1878 are arranged such that the valley part 1878V of the corrugated plate 1878 as the first layer and the mountain part 1878M of the corrugated plate 1878 as the second layer come into contact with each other, and the valley part 1878V of the corrugated plate 1878 as the second layer and the mountain part 1878M of the corrugated plate 1878 as the third layer come into contact with each other. As a result, a structure in which the flow paths having a closed cross-sectional shape are present between the corrugated plates 1878 of the respective layers is realized.

Then, the flow paths 80 having a large flow path cross-sectional area can be formed using two corrugated plates 1878.

Figure 50:
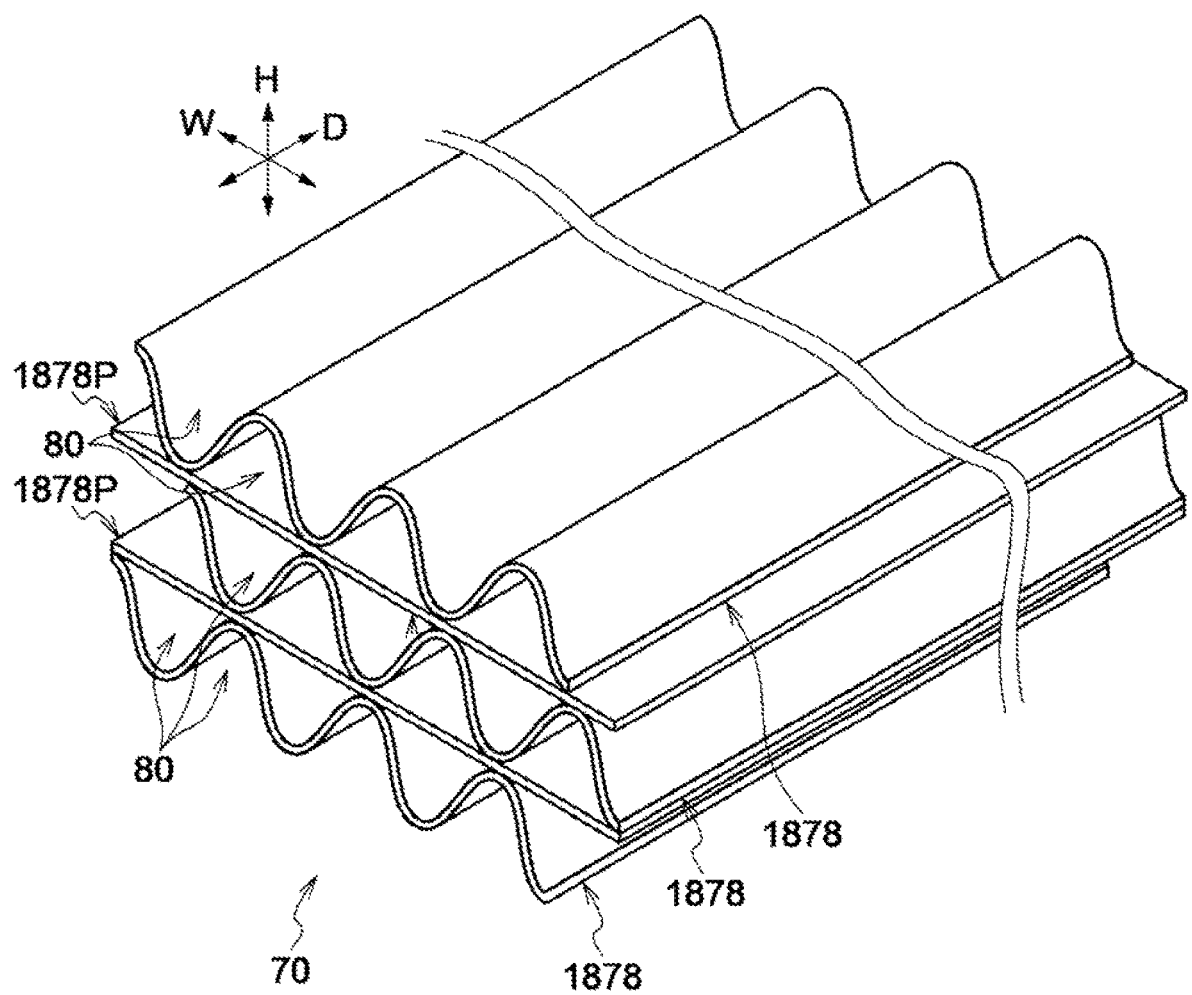
FIG. 50 is a perspective view illustrating an example of the flow path member in the cooling device of the disclosed technology.

In the flow path member 70 illustrated in FIG. 50, a partition wall 1878P is arranged between the corrugated plates 1878 of the respective layers. The partition wall 1878P can separate the flow path 80 formed between the respective layers up and down. Then, a structure that does not reduce the total flow path cross-sectional area is realized in the flow path member 70 as a whole.

The overall shapes of the flow path members 70 illustrated in FIGS. 38 to 50 are not limited to the shapes illustrated in the figures. For example, as illustrated in FIGS. 23 and 24, a shape having the first part 378A located at the connecting part 50 in the container 44, and the two second parts 378B each branching outward in the width direction from the first part 378A on the condensing part 72 side may be adopted. In this case, the flow path 80 having the groove shape is formed into the shape having the first flow path part 380A located in the first part 378A, and the second flow path part 380B bent by the curved part 380C from the first flow path part 380A and located in either one of the two second parts 378B.

The shape of the flow path 80 when the container 44 is viewed in plan view (viewed in the arrow H direction) is not limited to the above-described shapes.

Figure 51:
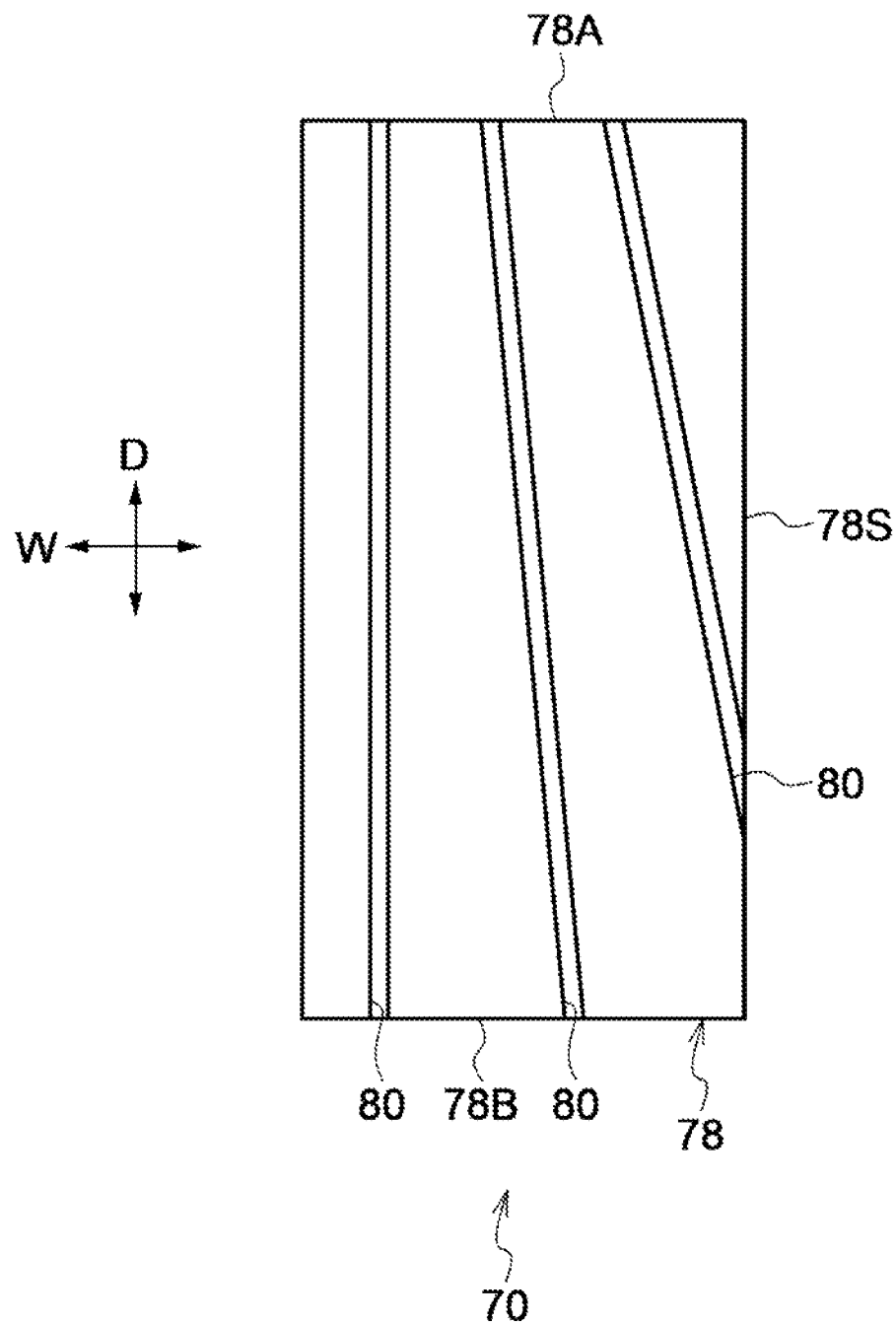
FIG. 51 is a plan view illustrating an example of the shape of the flow path in the cooling device of the disclosed technology.

For example, as in the flow path 80 illustrated in FIG. 51, the flow path 80 inclined with respect to the depth direction may exist.

Figure 52:
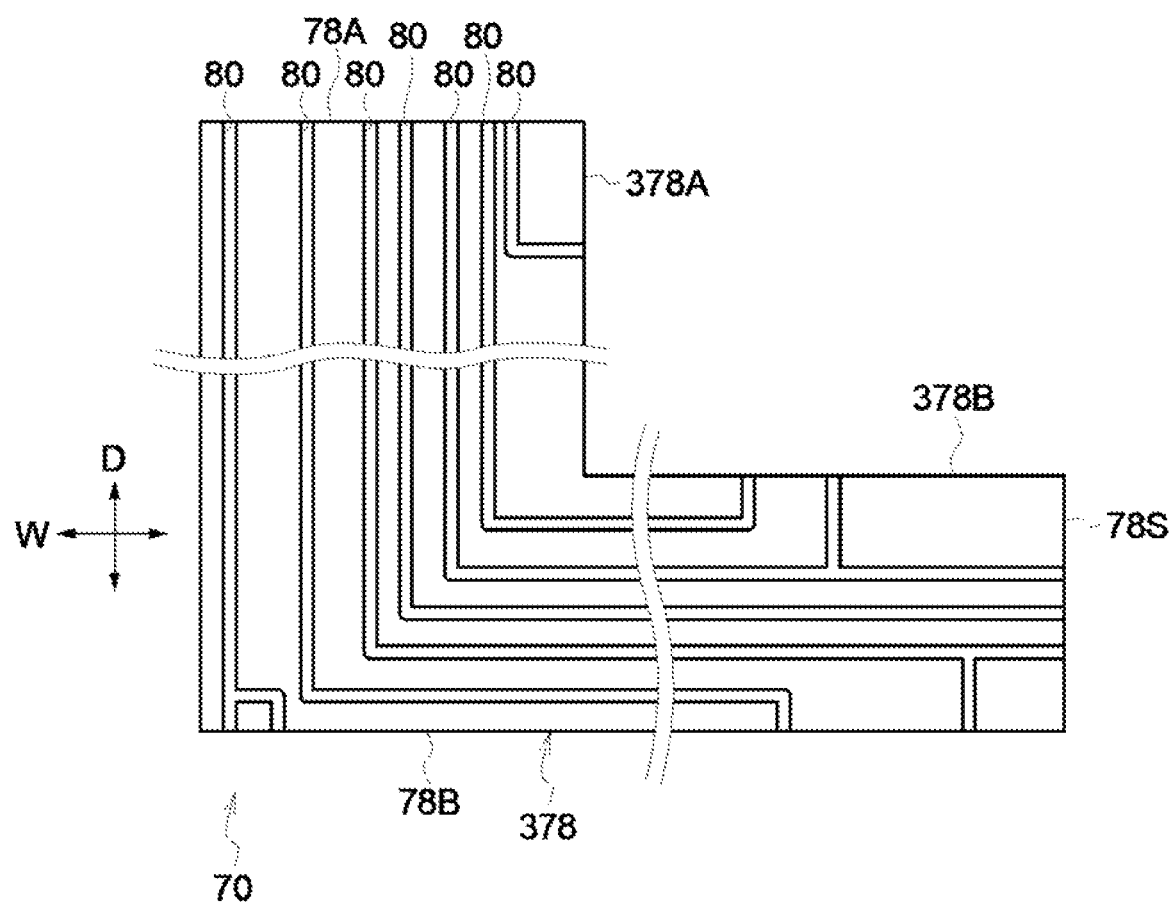
FIG. 52 is a plan view illustrating an example of the shape of the flow path in the cooling device of the disclosed technology.
Figure 53:
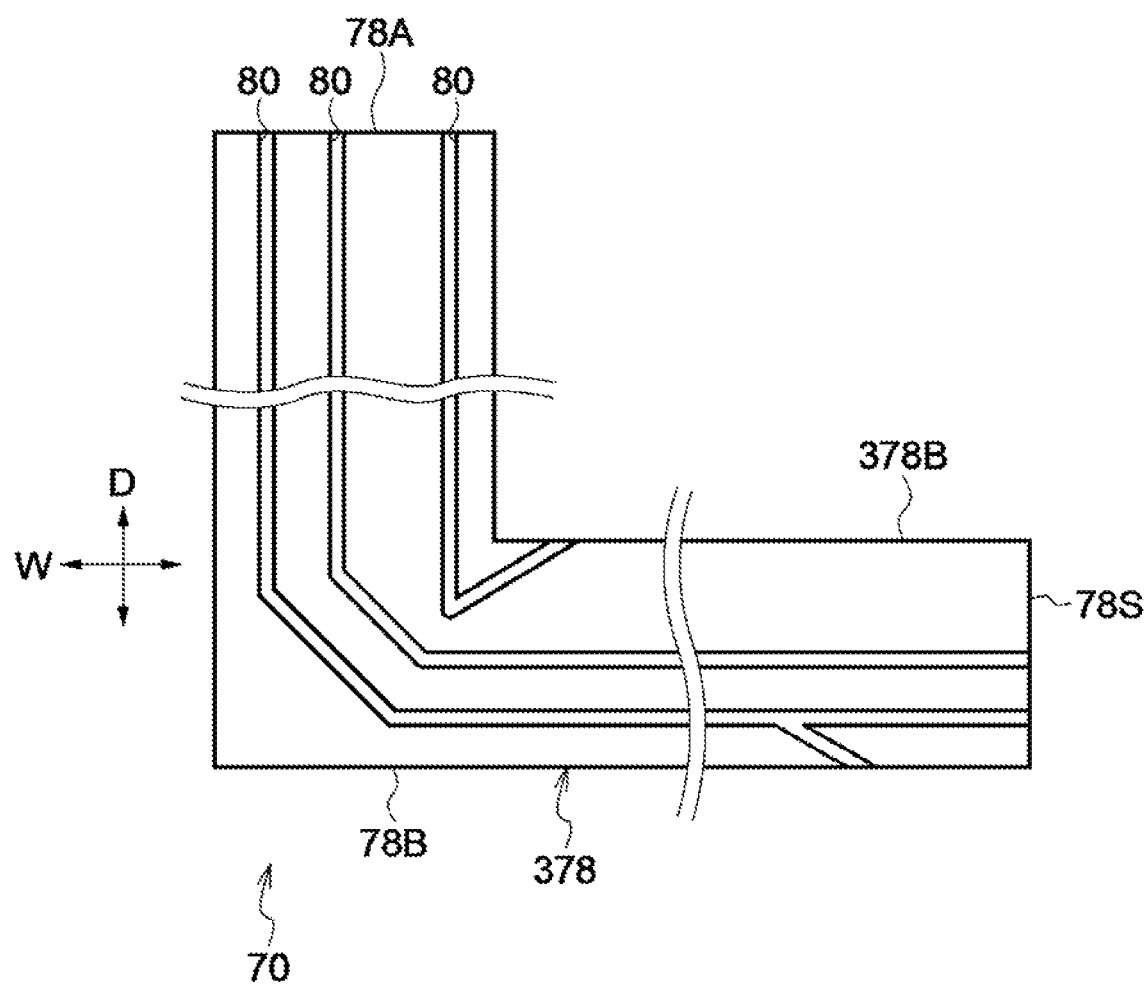
FIG. 53 is a plan view illustrating an example of the shape of the flow path in the cooling device of the disclosed technology.
Figure 54:
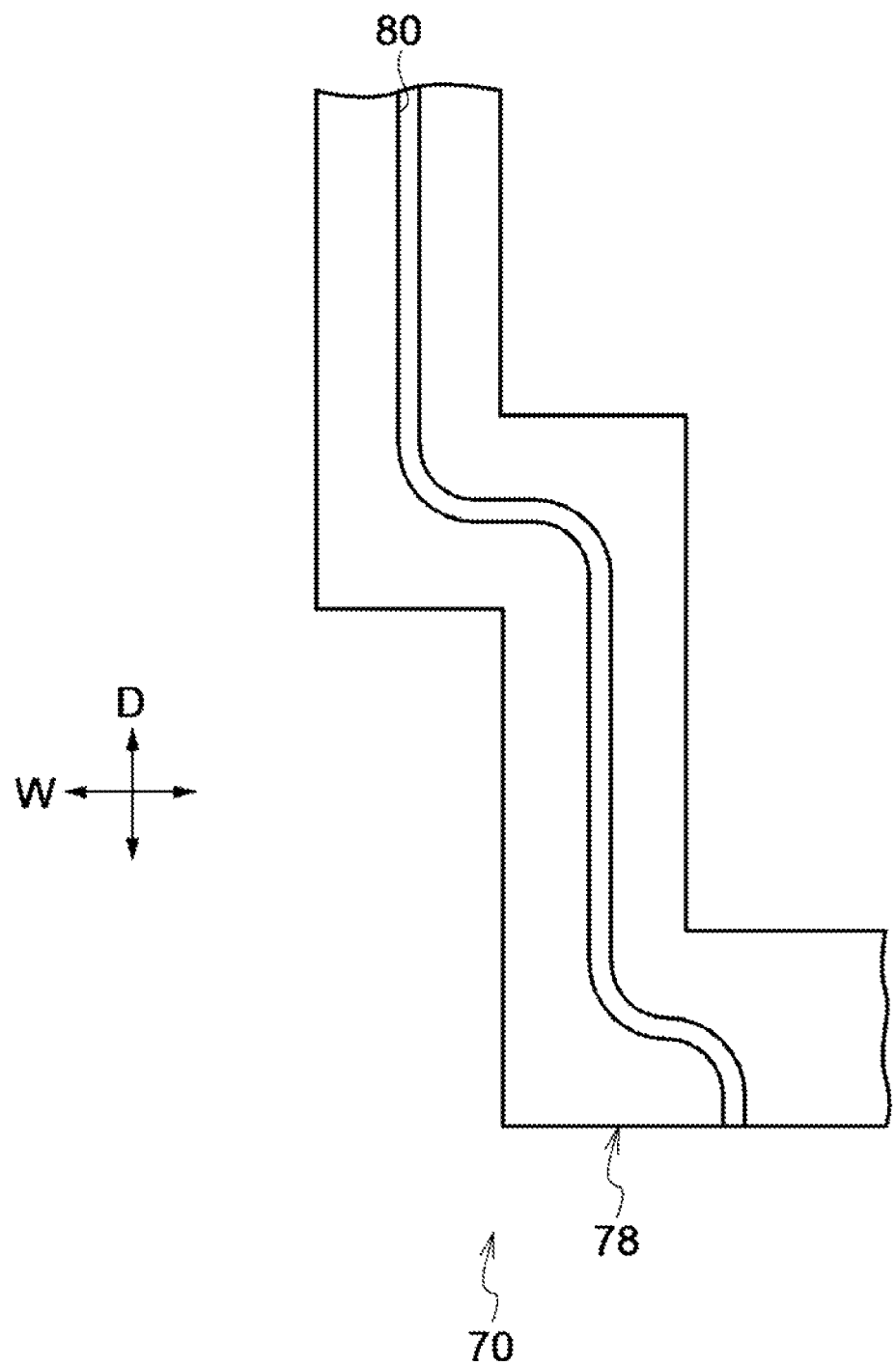
FIG. 54 is a plan view illustrating an example of the shape of the flow path in the cooling device of the disclosed technology.

Furthermore, each of the flow paths 80 illustrated in FIG. 52 is an example of being bent or branching at a right angle in the middle. Each of the flow paths 80 illustrated in FIG. 53 has a shape bent or branching at an acute angle, an obtuse angle, or a right angle in the middle. The flow path 80 illustrated in FIG. 54 is curved in the middle to change its shape. In FIG. 54, respective radii of curvature of a plurality of curved parts may be different but may be constant. Furthermore, central angles of curvatures of the plurality of curved parts may be different from each other. In the example of FIG. 54, the central angle of the curved part is 90 degrees. Then, as illustrated in these examples, the technology according to the present application has a high degree of freedom in the shape of the flow path 80. Furthermore, since the shape of the flow path 80 has a high degree of freedom, the flow path 80 can be arranged at a position avoiding components mounted on the substrate 34, for example. Thereby, various components on the substrate 34 have a high degree of freedom in mounting the elements, and the cooling device can be arranged even in a narrow area to realize a structure capable of cooling the elements.

In each of the above embodiments, as the member for transporting the liquid-phase refrigerant RF from the condensing part 72 to the evaporating part 62, the flow path member 70 in which the flow paths 80 are formed is used instead of transportation pipes. In a structure using the transportation pipes, for example, the cross-sectional area of the flow path may be reduced at a bent part of the pipe, so it is difficult to reduce the radius of curvature of the bent part. However, by forming the flow path in the plate-shaped or block-shaped flow path member 70, the cross-sectional area of the flow path 80 is not reduced in the curved part (for example, the curved parts 380C illustrated in FIGS. 24 and 28 and the like) of the flow path 80, and the radius of curvature can be reduced.

In the above description, an example in which the gap part is provided between the flow path plate 78 or 378 and the evaporating part 62 by the inclined surface 82T of one end surface 78A has been described. However, the structure in which the flow path 80 is not blocked by the evaporating part 62 on the one end surface 78A side is not limited to the example.

Figure 55:
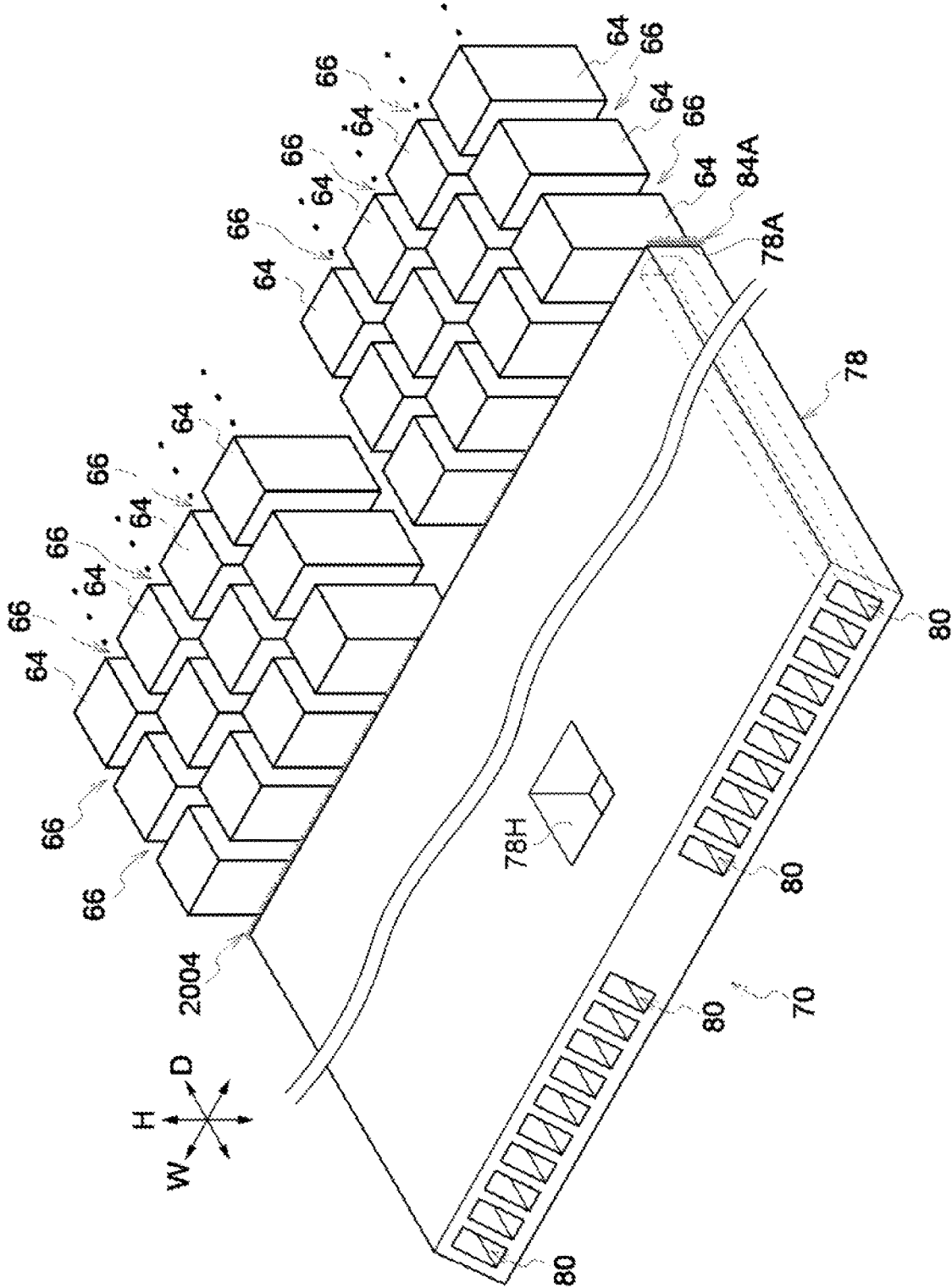
FIG. 55 is an enlarged perspective view of a net member and its vicinity in the disclosed technology.

For example, in the structure illustrated in FIG. 55, as an example of the gap part, a net member 2004 separate from the flow path plate 78 and the evaporating part 62 is provided. The net member 2004 is arranged between the flow path plate 78 and the evaporating part 62, and one surface is in contact with the one end surface 78A of the flow path plate 78 and the other surface is in contact with the evaporating part 62. Then, the inclined part 82A (see FIGS. 11, 12, and the like) is not formed on the one end surface 78A of the flow path plate 78.

The net member 2004 is a member through which the fluid can move in the thickness direction (arrow D direction), and the net member 2004 creates the gap 84A between the one end surface 78A of the flow path plate 78 and the evaporating part 62. Therefore, the flow path 80 is not blocked by the evaporating part 62, and the flow path of the refrigerant RF from the flow path 80 toward the evaporating part 62 is secured. That is, in the example illustrated in FIG. 55, the structure that facilitates the movement of the liquid-phase refrigerant RF from the flow path member 70 to the evaporating part 62 is realized.

In the example illustrated in FIG. 55, the net member 2004 is separate from the flow path member 70 and the evaporating part 62. Therefore, the net member 2004 does not affect the shapes of the flow path member 70 and the evaporating part 62. For example, it is not necessary to process the one end surface 78A of the flow path plate 78, and the structure can be simplified.

Figure 56:
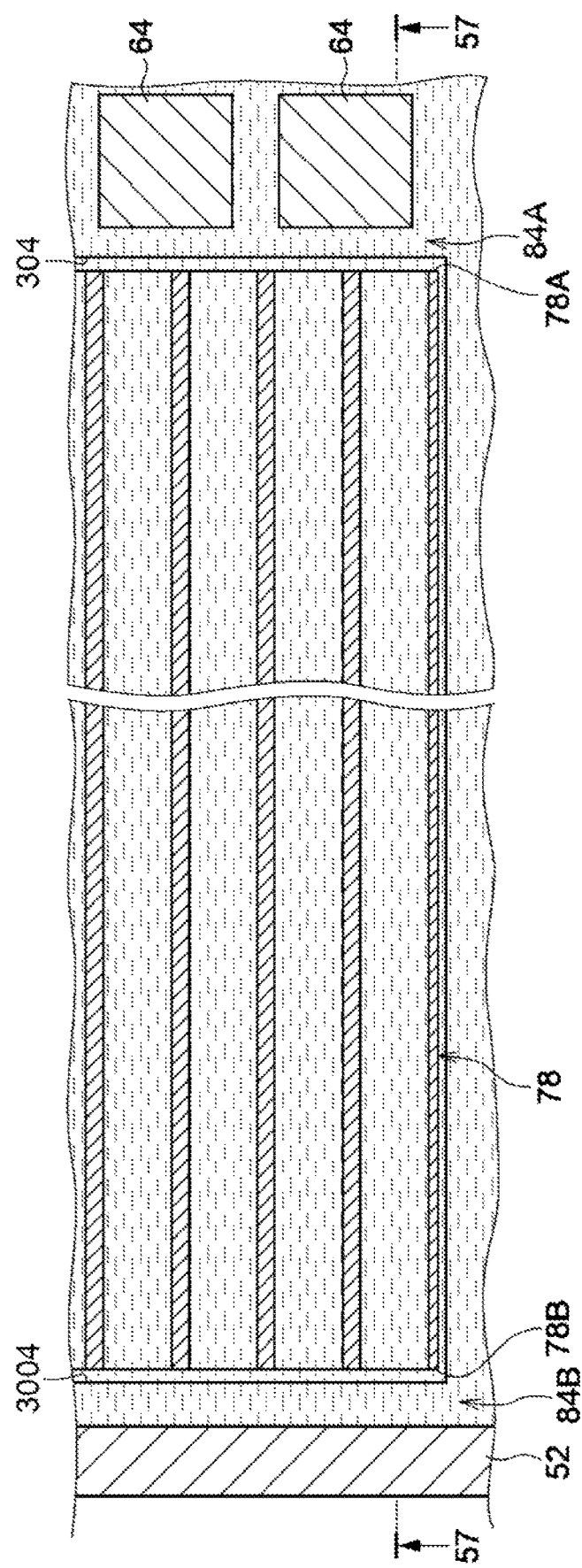
FIG. 56 is a partially enlarged cross-sectional view of an example of the cooling device in the disclosed technology.
Figure 57:
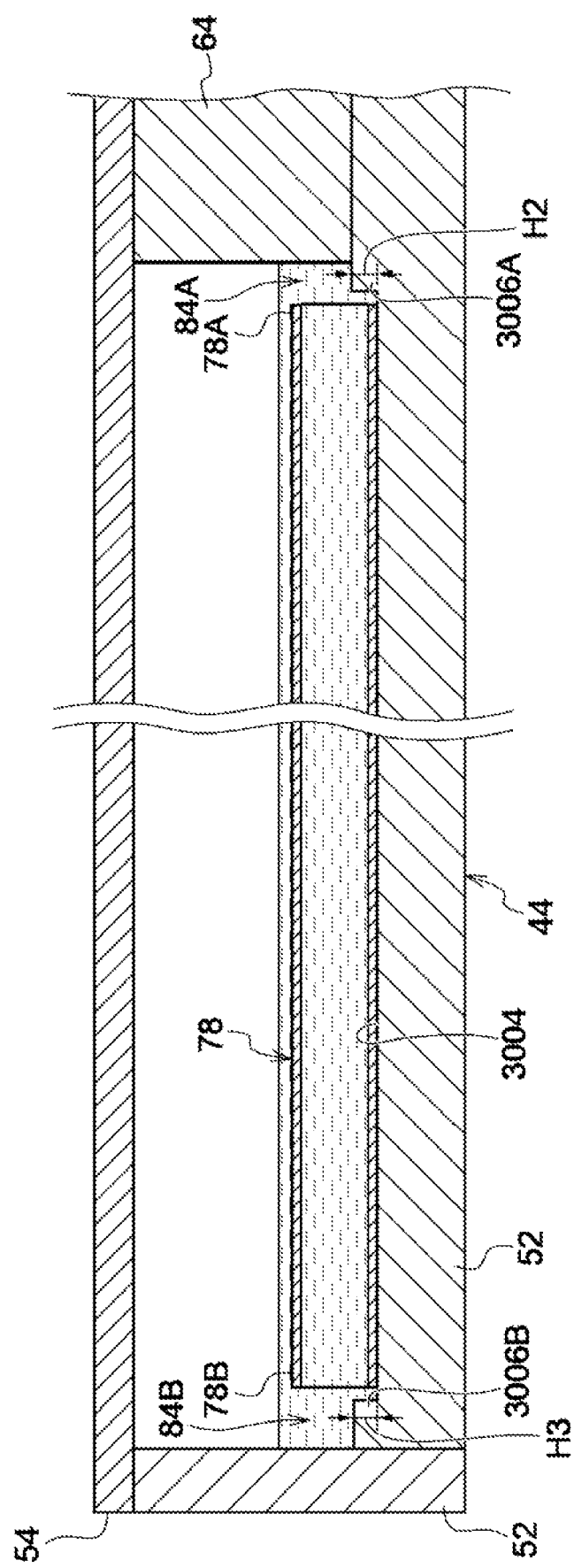
FIG. 57 is a cross-sectional view taken along line 57-57 of FIG. 56 illustrating an example of the cooling device in the disclosed technology.

Furthermore, the structure illustrated in FIGS. 56 and 57 may be adopted as the structure for preventing the flow path 80 from being blocked by the evaporating part 62 on the one end surface 78A side of the flow path plate 78.

In the structures illustrated in FIGS. 56 and 57, the bottom plate 52 is provided with a recess 3004. The recess 3004 has a shape capable of accommodating the lower part of the flow path plate 78. Then, a wall part 3006A is provided as a part of the bottom plate 52 between the recess 3004 and the evaporating part 62. Furthermore, a second wall part 3006B is provided as a part of the bottom plate 52 between the recess 3004 and the side wall 44S of the container 44.

The wall part 3006A faces the one end surface 78A of the flow path plate 78, but is set at a height H2 that does not obstruct the flow of the refrigerant RF in the flow path 80. Then, the wall part 3006A creates the gap 84A between the one end surface 78A of the flow path plate 78 and the condensing part 72.

As described above, the wall part 3006A creates the gap 84A between one end surface 78A of the flow path plate 78 and the evaporating part 62. Therefore, the one end surface 78A of the flow path plate 78 is not blocked by the evaporating part 62, and the flow path of the refrigerant RF from the one end surface 78A to the evaporating part 62 is secured. That is, even in the structures illustrated in FIGS. 56 and 57, the structure that facilitates the movement of the liquid-phase refrigerant RF from the flow path member 70 to the evaporating part 62 is realized.

Furthermore, in the structure illustrated in FIGS. 56 and 57, the second wall part 3006B faces the another end surface 78B of the flow path plate 78, but has a height H3 that does not obstruct the flow of the refrigerant RF in the flow path 80. Then, the second wall part 3006B creates a second gap 84B between the another end surface 78B of the flow path plate 78 and the side wall 44S of the container 44.

Note that, since the height H2 of the wall part 3006A and the height H3 of the second wall part 3006B both correspond to the depth in the recess 3004, the height H2 of the wall part 3006A and the height H3 of the second wall part 3006B are equal.

In the structure illustrated in FIGS. 56 and 57, the wall part 3006A, which is an example of the gap part, is provided in the container 44. Since the gap part is not provided in the flow path member 70, it is not necessary to process the one end surface 78A of the flow path member 70, and the structure can be simplified. Furthermore, since it is not necessary to provide a new member as the gap part, the number of components does not increase.

Then, with a simple structure, the structure having the gap between the flow path member 70 and the evaporating part 62 and the gap between the flow path member 70 and the side wall 44S of the container 44 can be realized.

Furthermore, since the flow path member 70 is housed in the recess 3004 of the bottom plate 52, the space between the flow path member 70 and the top plate 54, that is, a region as a moving part can be secured wider than that of a structure without the recess 3004.

In the above description, the column member 64 has been mentioned as the member for forming the groove part 66 in the evaporating part 62, but the member forming the groove part 66 is not limited to the column member. For example, a structure in which a plurality of wall members extending in the depth direction is arranged side by side at regular intervals in the width direction may be adopted. In the structure having a wall member, a groove part extending in the depth direction is formed between the wall members.

In each of the above-described embodiments, the support column 56 is arranged between the top plate 54 and the bottom plate 52 inside the container 44. Since the interval between the top plate 54 and the bottom plate 52 can be maintained by the support column 56, the volume for circulating the refrigerant RF while making a phase transition between the liquid phase and the gas phase can be secured inside the container 44. In particular, the inside of the container 44 is maintained at a lower pressure than the atmospheric pressure in order to promote the vaporization of the liquid-phase refrigerant RF. In this case, a force in an approaching direction acts on the top plate 54 and the bottom plate 52 due to a pressure difference between the pressure inside the container 44 (vapor pressure of the gas-phase refrigerant RF) and the atmospheric pressure. Even when such a force acts, the interval between the top plate 54 and the bottom plate 52 can be maintained.

Note that a structure in which the support column 56 is provided on the top plate 54 and a lower end of the support column is in contact with the bottom plate 52 may be adopted, or a structure in which the support column 56 is separated from both the top plate 54 and the bottom plate 52, and an upper end is in contact with the top plate 54 and a lower end is in contact with the bottom plate 52 respectively may be adopted.

The flow path member 70 is fixed to the container 44 by the fixture 86. The flow path member 70 is not fixed to the container by so-called brazing or adhesive, and no brazing or adhesive is necessary. Then, since the brazing or the adhesive does not melt out due to a temperature change during brazing or the like, there is no effect on the phase transition of the refrigerant RF inside the container 44.

Furthermore, the plurality of flow path members 70 is in contact with and fixed to the bottom plate 52 by the fixture 86, the flow path cross-sectional area sufficient for the movement of the gas-phase refrigerant RF can be substantially secured between the top plate 54 and the flow path members 70.

The top plate 54 is provided with the protrusions 76. The gas-phase refrigerant RF that flows while coming in contact with the top plate 54 is condensed and liquefied by being dissipated to the outside of the container 44 through the top plate 54. At this time, as illustrated in FIG. 9, the protrusions 76 increase the substantial contact area of the top plate 54 that the refrigerant RF comes in contact with, as compared with a structure without the protrusions 76. As a result, the gas-phase refrigerant RF is easily liquefied as droplet RD, and the liquefaction of the refrigerant RF can be promoted. Then, since the liquefied refrigerant RF is efficiently dropped along the protrusions 76, a liquid film can be kept thin at the part of the top plate 54 where the protrusions 76 are not formed. By keeping the liquid film thin, heat transfer from the gas-phase refrigerant RF to the top plate 54 is efficiently performed, and a structure that maintains high concentration and liquefaction capacity of the refrigerant RF can be realized.

The container 44 is provided with the fastening holes 88. By inserting the fastener into the fastening hole 88, the structure in which the cooling device 42 is fixed to the substrate 34 and further, is fixed to the element 36 to be cooled can be easily realized The cooling device 42 has the fins 90. Since the fins 90 increases the area where the cooling device 42 dissipates heat to the outside, the gas-phase refrigerant RF can be efficiently condensed and liquefied inside the container 44 as compared with a structure without the fins 90.

The container 44 has the injection hole 92. The refrigerant RF can be easily injected into the container 44 through the injection pipe 96 through the injection hole 92. Then, by filling the injection pipe 96 with the plug 94, the structure in which the injection hole 92 is sealed with the plug 94 and the refrigerant RF is sealed inside the container 44 can be realized.

In the technology of the present disclosure, the container 44, the evaporating part 62, the condensing part 72, the moving region 74, and the flow path member are not limited as long as they satisfy thermal conductivity, heat resistance, pressure resistance, and the like required for the cooling device, and can be made of metal. In particular, when they are made of copper, they can exhibit high thermal conductivity. As the flow path member, a resin (silicone resin or the like) can be used other than metal.

By brazing, fusing, or adhering these members, for example, the strength and airtightness of the container 44 can be ensured high.

For the flow path member 70, the flow path 80 having a desired shape can be easily formed at low cost by applying laser processing, etching processing, or the like to a plate-shaped or block-shaped member in which the flow path 80 is not formed. Moreover, for example, in the case where the flow path 80 has the groove shape as illustrated in FIGS. 38 to 47, the flow path member can be easily formed at low cost by cutting or pressing. The corrugated plate 1878 illustrated in FIGS. 48 to 50 can be easily formed by pressing.

While the embodiments of the technology disclosed in the present application have been described thus far, the technology disclosed in the present application is not limited to the above embodiments and, in addition to the above embodiments, of course may be carried out by making various modifications without departing from the spirit of the technology.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling device comprising:
   a container in which a refrigerant is sealed;
   an evaporating part that evaporates the refrigerant in a liquid phase by heat reception inside the container to generate the refrigerant in a gas phase;
   a moving region provided along an upper surface of the container and in which the refrigerant in the liquid phase moves;
   a condensing part provided in the moving region and that condenses the refrigerant in the gas phase by heat dissipation inside the container to generate the refrigerant in the liquid phase; and
   a plate-shaped or block-shaped flow path member provided between a lower surface of the container and the moving region and in which a plurality of flow paths configured to transport the refrigerant in a liquid phase from the condensing part to the evaporating part by surface tension inside the container is formed in parallel,
   the evaporating part evaporates the refrigerant in the liquid phase, which is transported from the plate-shaped or block-shaped flow path, in column members which extend from the lower surface of the container to the upper surface of the container.

2. The cooling device according to claim 1, wherein the flow path is closed-shaped in a cross section in a direction orthogonal to a longitudinal direction of the flow path.

3. The cooling device according to claim 2, wherein a cross-sectional shape in a direction orthogonal to a longitudinal direction of the flow path is circular or elliptical.

4. The cooling device according to claim 1, wherein, in the flow path member, the flow path is partially opened in a direction orthogonal to a longitudinal direction.

5. The cooling device according to claim 1, further comprising a gap part that causes a gap in which the refrigerant in a liquid phase moves from the flow path member to the evaporating part, between the flow path member and the evaporating part.

\* \* \* \* \*